United States Patent [19]

Kinoshita et al.

[11] Patent Number: 5,408,114

[45] Date of Patent: Apr. 18, 1995

[54] SEMICONDUCTOR MEMORY DEVICE HAVING CYLINDRICAL CAPACITOR AND MANUFACTURING METHOD THEREOF

[75] Inventors: Mitsuya Kinoshita; Tatsuo Okamoto; Hideaki Arima; Atsushi Hachisuka, all of Hyogo, Japan

[73] Assignee: Mitsubishi Denki Kabushiki Kaisha, Tokyo, Japan

[21] Appl. No.: 70,521

[22] Filed: Jun. 3, 1993

[30] Foreign Application Priority Data

| Jun. 10, 1992 | [JP] | Japan | 4-150772 |
| Jan. 7, 1993 | [JP] | Japan | 5-001286 |
| May 24, 1993 | [JP] | Japan | 5-145554 |

[51] Int. Cl.[6] .................................. H01L 29/68
[52] U.S. Cl. .................................. 257/296; 257/306
[58] Field of Search ............... 257/306, 296, 71, 307, 257/390

[56] References Cited

U.S. PATENT DOCUMENTS

| 5,047,817 | 9/1991 | Wakamiya et al. | 257/306 |
| 5,072,270 | 12/1991 | Nishimura | 257/306 |
| 5,084,405 | 1/1992 | Fazan et al. | 257/306 |
| 5,102,820 | 4/1992 | Chiba | 257/306 |
| 5,272,367 | 12/1993 | Dennison et al. | 257/306 |
| 5,315,140 | 5/1994 | Sugahara eet al. | 257/306 |
| 5,323,343 | 6/1994 | Ogoh et al. | 257/306 |

FOREIGN PATENT DOCUMENTS 4-755 1/1992 Japan .

OTHER PUBLICATIONS

"Crown-Shaped Stacked-Capacitor Cell for 1.5-V Operation 64-Mb DRAM's", Kaga et al., IEEE vol. 38, No. 2, Feb. 1991, pp. 255-261.
"Novel Stacked Capacitor Cell for 64 Mb DRAM", Wakamiya et al., VLSI Symposium '89, pp. 69-70.
"A New Stacked Capacitor Cell with Thin Box Structure Storage Node", Inoue et al., Extended Abstracts of the 21st Conference on Solid Devices and Materials, Tokyo, 1989, pp. 141-144.

Primary Examiner—Jerome Jackson
Assistant Examiner—Courtney A. Bowers
Attorney, Agent, or Firm—Lowe, Price, LeBlanc & Becker

[57] ABSTRACT

The semiconductor memory device includes a semiconductor substrate 1 having a conductive layer 6 formed on its main surface. Word lines 4c, 4d and a bit line 11 is formed on the semiconductor substrate. Insulating films 8, 12 are provided to cover the word lines 4c, 4d and the bit line 11. A barrier film 14 is provided on the insulating films 8, 12 for protecting the insulating films 8, 12 from etchant. A cylindrical storage node 170 is electrically connected to the conductive layer 6. The cylindrical storage node 170 includes a bottom conductive portion 17a and a sidewall conductive portion 17b. An outer surface of the storage node 170 is covered with a capacitor insulating film 112. The outer surface of the cylindrical storage node 170 is covered with a cell plate 22, with the capacitor insulating film 112 interposed therebetween.

1 Claim, 78 Drawing Sheets

SEMICONDUCTOR MEMORY DEVICE HAVING CYLINDRICAL CAPACITOR AND MANUFACTURING METHOD THEREOF

BACKGROUND OF THE INVENTION

1. Field of the Invention

The present invention relates generally to semiconductor memory devices having cylindrical capacitors, and more particularly to a semiconductor memory device having a cylindrical capacitor which is readily manufactured. The present invention further related to a method of manufacturing the same.

2. Description of the Background Art

Recently, demand for a semiconductor memory device has been rapidly expanding with the remarkable spread of information appliances such as a computer. Moreover, a large memory capacity and high speed operation are functionally requested. Technology has thus been developed in respect to high integration and high speed responsiveness or high reliability of a semiconductor memory device.

Among semiconductor memory devices, a DRAM is known in which memory information can be randomly inputted/outputted. A DRAM is generally comprised of a memory cell array which is a memory region for storing a multiple of information, and a peripheral circuitry required for communication between the memory region and outside.

FIG. 79 is a block diagram showing a general structure of a DRAM. In this figure, a DRAM 50 includes a memory cell array 51 for storing a data signal of information, a row and column address buffer 52 for externally receiving an address signal for selecting a memory cell constituting a storage circuit, a row decoder 53 and a column decoder 54 for decoding the address signal to designate the memory cell, a sense refresh amplifier 55 amplifying and reading a signal stored in the designated memory cell, a data-in buffer 56 and a data-out buffer 57 for inputting and outputting data, and a clock generator 58 generating a clock signal.

The memory cell array 51 occupying a large area on the semiconductor chip comprises a plurality of memory cells arranged in a matrix.

FIG. 80 is an equivalent circuit for four-bit memory cells. The memory cell shown is a so-called one transistor-one capacitor type memory cell comprised of a MOS transistor and a capacitor connected thereto. A memory cell of this type facilitates, because of its simple structure, enhancement of integration of a memory cell array, and thus, is often employed in a DRAM which requires a large capacity.

Memory cells of a DRAM can be classified into several types depending on the structure of a capacitor.

FIG. 81 is a cross sectional view of a conventional memory cell having a typical stacked type capacitor. Referring to FIG. 81, a memory cell includes a transfer gate transistor and a capacitor of a stacked type (hereinafter referred to as a stacked type capacitor). The transfer gate transistor includes a pair of source-drain regions 6, 6 formed in the surface of a silicon substrate 1, and a gate electrode (word line) 4 formed on the surface of the silicon substrate 1 through an insulating layer. The stacked type capacitor includes a lower electrode (storage node) 511 extending from an upper portion of the gate electrode 4 to an upper portion of a field isolation film 2, and having a part connected to one of the source-drain regions 6, 6, a dielectric layer 512 formed on the surface of the lower electrode 511, and an upper electrode (cell plate) 513 formed on the surface of the dielectric layer. A bit line 515 is connected to the other source-drain region 6 of the transfer gate transistor, through a bit line contact portion 516.

FIG. 82 is a plan view of a semiconductor memory device having a cylindrical capacitor, which belongs to another type of a DRAM and is disclosed in Japanese Patent Laid-Open No. 4-755. FIG. 83 is a cross sectional view taken along the line A—A in FIG. 82. Referring to these figures, a plurality of word lines 4a, 4b, 4c, 4d, 4e are formed on the surface of the silicon substrate 1. The bit lines 515 are formed crossing the word lines 4a, 4b, 4c, 4e at right angles. A memory cell is provided in the vicinity of the crossing point of the word line and the bit line.

The memory cell includes a transfer gate transistor 3 and a capacitor 10. The transfer gate transistor 3 includes a pair of the source-drain regions 6, 6 formed in the surface of the silicon substrate 1, and gate electrodes (word lines 4b, 4c) formed on the surface of the silicon substrate 1. An insulating layer 522 is provided over the silicon substrate 1 to cover the word lines 4b, 4c, 4d, 4e. A contact hole 514 for exposing one of the source-drain regions 6, 6 is provided in the insulating layer 522.

The storage node 511 is connected through the contact hole 514 to the source-drain region 6. The storage node 511 includes a first polycrystalline silicon layer 110a provided in contact with one source-drain region 6 through the contact hole 514, and along the surface of the insulating layer 522, a bottom conductive portion 511a provided thereon, and a sidewall conductive portion 511b provided along the periphery of the bottom conductive portion 511a, and extending upward.

A capacitor insulating film 512 covers the surface of the storage node 511. The cell plate 513 covers the outer surface of the storage node 511, with the capacitor insulating film 512 interposed therebetween. An interlayer insulating film 23 is provided over the silicon substrate 1 to cover the cell plate 513. A wiring layer 24 is formed over the interlayer insulating film 23. A passivation film 26 is provided on the silicon substrate 1 to cover the wiring layer 24.

A cylindrical capacitor thus constituted has its whole capacitance increased because the surface of the sidewall conductive portion 511b of the storage node 511 also contributes to the capacitance of the capacitor.

A method of manufacturing the semiconductor memory device shown in FIG. 83 will now be described.

FIGS. 84 to 98 are partial cross sectional views of the semiconductor device in respective steps in sequence of a manufacturing process of the semiconductor memory device shown in FIG. 83.

Referring to FIG. 84, the field oxide film 2 is formed in the main surface of the silicon substrate 1. The field oxide film 2 is formed utilizing a LOCOS method.

Referring to FIG. 85, after formation of a gate insulating layer 5 on the surface of the silicon substrate 1, the gate electrodes (the word lines 4b, 4c, 4d, 4e) of polycrystalline silicon are formed. The insulating layer 522 is formed to cover the word lines 4b–4e. Impurity ions are introduced in the surface of the silicon substrate 1 utilizing an ion implantation method, with the word lines 4b, 4c covered with the insulating layer 522 as mask, to form the source-drain regions 6, 6.

Referring to FIG. 86, a layer of refractory metal such as tungsten, molybdenum, titanium is deposited on the surface of the silicon substrate 1 (not shown), and patterned in a prescribed shape, thereby forming the bit line 515 directly contacted with one source-drain region 6 of the transfer gate transistor. An insulating layer 27 covers the bit line 515.

Referring to FIG. 87, a first polycrystalline silicon layer 110a having impurities introduced thereinto is deposited on or over the silicon substrate 1 utilizing a CVD method.

Referring to FIG. 88, an insulating layer 35 of silicon oxide film is deposited over the surface of the silicon substrate 1.

Referring to FIG. 89, a resist pattern 36 of a prescribed shape is formed on a surface of the insulating layer 35. The width of the resist pattern 36 defines a distance between capacitors adjacent to each other.

Referring to FIG. 90, the insulating layer 35 is selectively etched with the resist pattern 36 as a mask.

Referring to FIGS. 90 and 91, after removal of the resist pattern 36, a second polycrystalline silicon layer 110b having impurities introduced thereinto is deposited over the whole surface of the silicon substrate 1 utilizing the CVD method.

Referring to FIG. 92, a resist 37 is applied over the surface of the silicon substrate 1 to completely cover the uppermost surface of the second polycrystalline silicon layer 110b. Referring to FIGS. 92 and 93, the resist 37 is etched back so that a part of the second polycrystalline silicon layer 110b is exposed.

Referring to FIGS. 93 and 94, the exposed second polycrystalline silicon layer 110b is etched, and thereafter the insulating layer 35 is removed by etching. The storage node 511 is thus formed including the bottom conductive portion 511a and the sidewall conductive portion 511b.

Referring to FIGS. 94 and 95, by means of an isotropic etching, the exposed portion of the first polycrystalline silicon layer 110a is removed in a self-alignment manner, and thereafter the resist 37 is removed.

Referring to FIG. 96, the capacitor insulating film 512 formed of silicon nitride, silicon oxide, tantalum pentoxide, hafnium oxide, or the like is formed on the surface of the storage node 511.

Referring to FIG. 97, the cell plate 513 is formed to cover the outer surface of the storage node, with the capacitor insulating film 512 interposed therebetween. The cell plate 513 is formed with, for example, polycrystalline silicon having impurities introduced thereinto.

Referring to FIG. 59, the interlayer insulating film 23 is formed over the whole surface of the silicon substrate 1 to cover the cell plate 513. The wiring layer 24 a prescribed shape is formed on the interlayer insulating film 23. The passivation film 26 is formed over the whole surface of the silicon substrate 1 to cover the wiring layer 24.

A method of manufacturing a cylindrical capacitor previously proposed is constituted as described above, and has the following problems. FIG. 99A is a plan view of the semiconductor device shown in FIG. 92. FIG. 99A shows a state in which the whole surface of the silicon substrate 1 is covered with a resist before etch back of the resist. A shaded portion is the resist 37. Referring to these figures, no significant difference is noticed between the area of the resist 37 before etch back (see FIG. 99A) and the area of the resist 37 after etch back (see FIG. 99B). Although etch back was effected, the resultant small change of the area made it difficult to detect the end of the etch back. Consequently, a problem that the manufacturing method shown in FIGS. 84 to 98 could not be easily implemented arose.

SUMMARY OF THE INVENTION

One object of the present invention is to provide an semiconductor memory device improved for enhancement of integration and capacitance of a capacitor, thereof.

Another object of the present invention is to provide a semiconductor memory device having a cylindrical capacitor implemented easily.

A further object of the present invention is to provide a method of manufacturing a semiconductor memory device having a cylindrical capacitor implemented easily.

In order to accomplish the above described purposes, a semiconductor memory device having a cylindrical capacitor in accordance with a first aspect of the present invention includes a semiconductor substrate having a conductive layer formed on its main surface. A word line and a bit line are formed on the semiconductor substrate. An insulating film is provided over the semiconductor substrate to cover the word line and the bit line. In the insulating film a contact hole is provided for exposing a part of the conductive layer, and on a predetermined region of the insulating film a barrier film is selectively provided for protecting the insulating film from etchant. A storage node is electrically connected to the conductive layer. The storage node includes a bottom conductive portion provided in contact with the conductive layer through the contact hole, and along the surface of the insulating film with the barrier film interposed therebetween, and a sidewall conductive portion provided along the periphery of the bottom conductive portion, and extending upward. The semiconductor device further includes a capacitor insulating film provided to cover the outer surface of the storage node. A cell plate covers the outer surface of the storage node with the capacitor insulating film interposed therebetween.

A semiconductor memory device having a cylindrical capacitor in accordance with a second aspect of the present invention includes a semiconductor substrate having a conductive layer formed on its main surface. A word line and a bit line are formed on the semiconductor substrate. An interlayer insulating film is provided over the semiconductor substrate to cover the word line and the bit line. In the interlayer insulating film a contact hole is provided for exposing a part of the conductive layer. On the interlayer insulating film a barrier film is provided for protecting the interlayer insulating film from etchant. A storage node is electrically connected to the conductive layer. The storage node includes a bottom conductive portion provided in contact with the conductive layer through the contact hole, and along the surface of the insulating film with the barrier film interposed therebetween, a sidewall conductive portion provided along the periphery of the bottom conductive portion, and extending upward, and a branch conductive portion provided on a sidewall surface of the sidewall conductive portion, and extending horizontally. A capacitor insulating film is provided to cover the outer surface of the storage node. A cell plate is provided to cover the outer surface of the storage node with capacitor insulating film interposed therebetween.

A semiconductor memory device in accordance with a third aspect of the present invention includes a semiconductor substrate having a conductive layer formed on its main surface. A word line and a bit line are formed on the semiconductor substrate. An interlayer insulating film covers the word line and the bit line. In the interlayer insulating film a contact hole is provided for exposing a part of the conductive layer. On a predetermined region of the insulating film a barrier film is selectively provided for protecting the insulating film from etchant. A storage node is electrically connected to the conductive layer. The storage node includes a bottom conductive portion provided in contact with the conductive layer through the contact hole, along the surface of the insulating film with its lower surface spaced from the surface of the barrier film by a predetermined distance, a sidewall conductive portion provided along the periphery of the bottom conductive portion, and extending upward, and a branch conductive portion provided on a sidewall surface of the sidewall conductive portion, and extending horizontally. The semiconductor device further includes a capacitor insulating film provided to cover the outer surface of the storage node including the lower surface of the storage node. A cell plate is provided to cover the outer surface of the storage node with the capacitor insulating film interposed therebetween.

In a method of manufacturing a semiconductor memory device having a cylindrical capacitor in accordance with a fourth aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. A predetermined region of the first and second insulating films is covered with a barrier film for protecting these insulating films from later processings. A first conductor film is formed over the semiconductor substrate so as to be connected with the conductive layer, and to cover the first and second insulating films. An interlayer insulating film is formed on the first conductor film. The interlayer insulating film is patterned so as to be left only on a bottom conductive portion of a cylindrical storage node to be formed. With the patterned interlayer insulating film as a mask, the first conductor film is selectively etched to form the bottom conductive portion of the cylindrical storage node. The whole of the outer surface of the interlayer insulating film including an inner wall surface of an aperture portion in the patterned interlayer insulating film is covered with a second conductor film so as to be connected with an end of the bottom conductive portion. The second conductor film is etched back so that the surface of the interlayer insulating film is exposed. The interlayer insulating film is etched away to form a sidewall conductive portion of the cylindrical storage node. The outer surface of the cylindrical storage node is covered with a capacitor insulating film. A cell plate is formed over the semiconductor substrate to cover the outer surface of the storage node, with the capacitor insulating film interposed therebetween.

In a method of manufacturing a semiconductor memory device having a cylindrical capacitor in accordance with a fifth aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. A predetermined region of the first and second insulating films is covered with a barrier film for protecting these insulating films from later processings. A first conductor film is formed over the semiconductor substrate to be connected with the conductive layer and to cover the first and second insulating films. An interlayer insulating film is formed on the first conductor film. The interlayer insulating film is patterned so as to be left only on a bottom conductive portion of a cylindrical storage node to be formed. With the patterned interlayer insulating film as a mask, the first conductor film is selectively etched to form the bottom conductive portion. The whole of the outer surface of the interlayer insulating film including an inner wall surface of an aperture portion in the patterned interlayer insulating film is covered with a second conductor film so as to be connected with an end of the bottom conductive portion. The second conductor film is etched back so that the surface of the interlayer insulating film is exposed. A resist is buried in the aperture portion formed in the interlayer insulating film. The interlayer insulating film is etched away, and thereafter the resist is removed, resulting in formation of the sidewall conductive portion of the cylindrical storage node. The outer surface of the cylindrical storage node is covered with a capacitor insulating film. A cell plate is formed over the semiconductor substrate to cover the outer surface of the storage node, with the capacitor insulating film interposed therebetween.

In a method of manufacturing a semiconductor memory device having a cylindrical capacitor in accordance with a sixth aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. A first conductor film is formed over the semiconductor substrate to be connected with the conductive layer and to cover the first and second insulating films. An interlayer insulating film is formed on the first conductor film. The interlayer insulating film is patterned so as to left only on a bottom conductive portion of a cylindrical storage node to be formed. With the patterned interlayer insulating film as a mask, the first conductor film is selectively etched to form the bottom conductive portion of the cylindrical storage node. The whole of the outer surface of the interlayer insulating film including an inner wall surface of an aperture portion in the patterned interlayer insulating film is covered with a second conductor film. The second conductor film is etched back so that the surface of the interlayer insulating film is exposed. A resist is buried in the aperture portion formed in the interlayer insulating film. The interlayer insulating film is etched away, and thereafter the resist is removed, resulting in formation of the sidewall conductive portion of the cylindrical storage node. The outer surface of the cylindrical storage node is covered with a capacitor insulating film. A cell plate is formed over the semiconductor substrate to cover the outer surface of the storage node, with the capacitor insulating film interposed therebetween.

In a method of manufacturing a semiconductor memory device having a cylindrical capacitor in accordance with a seventh aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. An SiO₂ film is formed over the semiconductor substrate to contact with the conductive layer. A predetermined region of the first and second insulating films is covered with a silicon nitride film for protecting these insulating films from later processings. The SiO₂ film is selectively removed, so that the surface of the conductor layer is exposed. A first conductor film is formed over the semiconductor substrate to be connected with the conductive layer and to cover the first and second insulating films. An interlayer insulating film is formed on the first conductor film. The interlayer insulating film is patterned so as to be left only on a bottom conductive portion of a cylindrical storage node to be formed. With the patterned interlayer insulating film as a mask, the first conductor film is selectively etched to form the bottom conductive portion of the cylindrical storage node. The whole of the outer surface of the interlayer insulating film including an inner wall surface of an aperture portion in the patterned interlayer insulating film is covered with a second conductor film so as to be connected with an end of the bottom conductive portion. The second conductor film is etched back so that the surface of the interlayer insulating film is exposed. The interlayer insulating film is etched away, resulting in formation of the sidewall conductive portion of the cylindrical storage node. The outer surface of the cylindrical storage node is covered with a capacitor insulating film. A cell plate is formed over the semiconductor substrate to cover the outer surface of the storage node, with the capacitor insulating film interposed therebetween.

In a method of manufacturing a semiconductor memory device having a cylindrical capacitor in accordance with an eighth aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. The first and second insulating films are covered with a barrier film for protecting these insulating films from later processing. A first conductor film is formed over the semiconductor substrate so as to be connected to the conductive layer, and to cover the first and second insulating films. An interlayer insulating film is formed on the first conductor film, where a lower layer insulating film to constitute a lower layer portion of the interlayer insulating film, a middle layer insulating film whose etching rate to hydrofluoric acid is higher than that of the lower layer insulating film, and an upper layer insulating film whose etching rate is lower than that of the middle insulating film are sequentially built up in a layer. The interlayer insulating film is patterned so as to be left only on a bottom conductive portion of a cylindrical storage node to be formed. The patterned interlayer insulating film is processed with hydrofluoric acid to reduce an end of the middle layer insulating film with the interlayer insulating film as a mask, the first conductor film is selectively etched to form the bottom conductive portion of the cylindrical storage node. The interlayer insulating film is etched by hydrofluoric acid so that the upper surface of an end of the bottom conductive portion is exposed. The whole of the outer surface of the interlayer insulating film including an inner wall surface of an aperture portion in the patterned interlayer insulating film is covered with a second conductor film so as to be connected with the upper surface of the end of the bottom conductive portion. The second conductor film is etched back so that the surface of the interlayer insulating film is exposed. The interlayer insulating film is etched away to form a sidewall portion of the cylindrical storage node having a branch conductive portion extending horizontally from its sidewall surface. The outer surface of the cylindrical storage node is covered with a capacitor insulting film. A cell plate is formed over the semiconductor substrate to cover the outer surface of the cylindrical storage node, with the capacitor insulating film interposed therebetween.

In a method of manufacturing a semiconductor memory device in accordance with a ninth aspect of the present invention, a word line is initially formed on a semiconductor substrate. The word line is covered with a first insulating film. A conductive layer to which the capacitor is to be electrically connected is formed on the main surface of the semiconductor substrate. A bit line crossing the word line is formed on the semiconductor substrate. The bit line is covered with a second insulating film. The first and second insulating films are covered with a barrier film for protecting these insulating films from later processings. An insulating film of soluble material to hydrofluoric acid is deposited on the barrier film. A first conductor film is formed over the semiconductor substrate so as to be connected with the conductive layer, and to cover the first and second insulating films. An interlayer insulating film is formed on the first conductor film, where a lower layer insulating film to constitute a lower layer portion of the interlayer insulating film, a middle layer insulating film whose etching rate to hydrofluoric acid is higher than that of the lower layer insulating film, and an upper layer insulating film whose etching rate to hydrofluoric acid is lower than that of the middle layer insulating film are sequentially built up in a layer. The interlayer insulting film is patterned so as to be left only on a bottom conductive portion of a cylindrical storage node to be formed. The patterned interlayer insulating film is processed with hydrofluoric acid, so as to reduce an end of the middle layer insulating film. With the interlayer insulating film as a mask, the first conductor film is selectively etched to form the bottom conductive portion of the cylindrical storage node. The interlayer insulating film is etched with hydrofluoric acid so that the upper surface of an end of the bottom conductive portion is exposed. The whole of the outer surface of the interlayer insulating film including an inner wall surface of an aperture portion in the patterned interlayer insulating film is covered with a second conductor film so as to be connected with the end of the bottom conductive portion. The second conductor film is etched back so that the interlayer insulating film and the insulating film soluble to hydrofluoric acid are etched away to form a sidewall portion of the cylindrical storage node having a branch conductive portion extending horizontally from its sidewall surface, while exposing a lower surface of the bottom conductive portion. The outer surface of the storage node including the lower surface of the bottom conductive portion is covered with a capacitor insulating film. A cell plate is formed over the semiconductor substrate to cover the outer surface of the cylindrical storage node, with the capacitor insulating film interposed therebetween.

A semiconductor memory device having a cylindrical capacitor, according to the first aspect of the present invention, can be manufactured in a method in which the end of etch back can be detected easily, since a barrier film is formed on a predetermined region of an interlayer insulating film for protecting the interlayer insulating film from etchant. Thus, a semiconductor memory device having a cylindrical capacitor can be easily implemented.

In a semiconductor memory device according to the second aspect of the present invention, a capacitance of a capacitor is increased in proportion to an area of the outer surface of a branch conductive portion extending horizontally.

In a semiconductor memory device according to the third aspect of the present invention, a capacitance of a capacitor is increased, since a lower surface of a bottom conductive portion also contribute to the capacitance of the capacitor.

In a method of manufacturing a semiconductor device according to the fourth aspect of the present invention, a second conductor film is etched back so that the surface of the interlayer insulating film is exposed. This step is essential for forming a sidewall conductive portion of a storage node. The end of the etch back can be easily detected, since the area ratio changes greatly. As a result, a semiconductor device having a cylindrical capacitor can be easily manufactured.

In a method of manufacturing a semiconductor memory device having a cylindrical capacitor according to the fifth aspect of the present invention, since a resist is buried in an aperture portion formed in the interlayer insulating film, even if the barrier film is removed, the resist serves as an etching stopper in place of the barrier film.

In a method of manufacturing a semiconductor memory device having a cylindrical capacitor according to the sixth aspect of the present invention, the resist buried in the aperture portion formed in the interlayer insulating film serves as a stopper against later etching.

In a method of manufacturing a semiconductor memory device having a cylindrical capacitor according to the seventh aspect of the present invention, a $SiO_2$ film is formed over a semiconductor substrate, and thereafter a silicon nitride film is formed to cover the $SiO_2$ film. The etching selection ratio of $SiN/SiO_2$ is large. Accordingly, the $SiO_2$ film is not etched, even if the etching does not stop after removal of the silicon nitride film. As a result, $SiO_2$ protects the surface of the semiconductor substrate, preventing the same from being etched.

In a method of manufacturing a semiconductor memory device having a cylindrical capacitor according to the eighth aspect of the present invention, a branch conductive portion extending horizontally can be formed.

In a method of manufacturing a semiconductor memory device having a cylindrical capacitor according to the ninth aspect of the present invention, a semiconductor memory device having a lower surface of a bottom conductive portion contributing to a capacitance of a capacitor can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Embodiment 1

FIGS. 1 to 25 are partial cross sectional views of a semiconductor device in respective steps of a method of manufacturing a semiconductor memory device having cylindrical capacitor, according to a first embodiment of the present invention.

Figure 1:
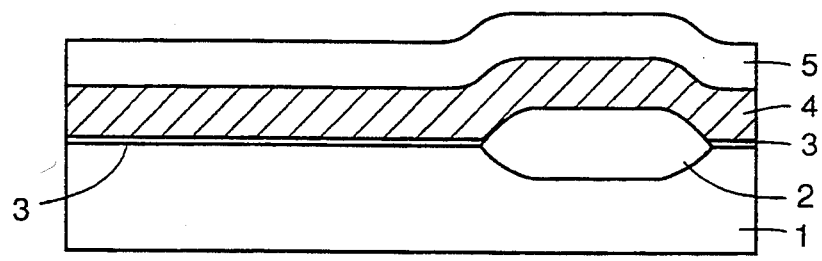
FIGS. 1 to 9 are partial cross/sectional views of a semiconductor memory device in the first to ninth steps of a manufacturing method according to a first embodiment of the present invention.

Referring to FIG. 1, the field oxide film 2 is formed in the main surface of the silicon substrate 1, and thereafter the gate oxide film 3 is formed on the surface of the silicon substrate 1. The word line film 4 and the interlayer insulating film 5 are sequentially formed on the gate oxide film 3.

Figure 2:
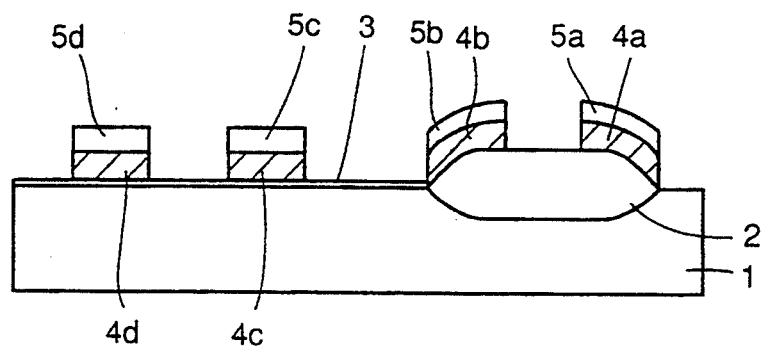

Referring to FIG. 2, the word line film 4 and the interlayer insulating film 5 are selectively etched using photolithography, to form the plurality of word lines 4a, 4b, 4c, 4d. Consequently, interlayer insulating films 5a, 5b, 5c, 5d are left on the plurality of word lines 4a, 4b, 4c, 4d.

Figure 3:
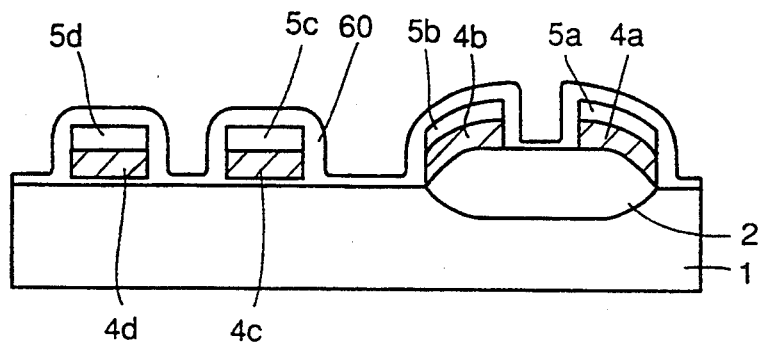

Referring to FIG. 3, an insulating film 60 is formed over the silicon substrate 1 to cover the word lines 4a, 4b, 4c, 4d.

Figure 4:
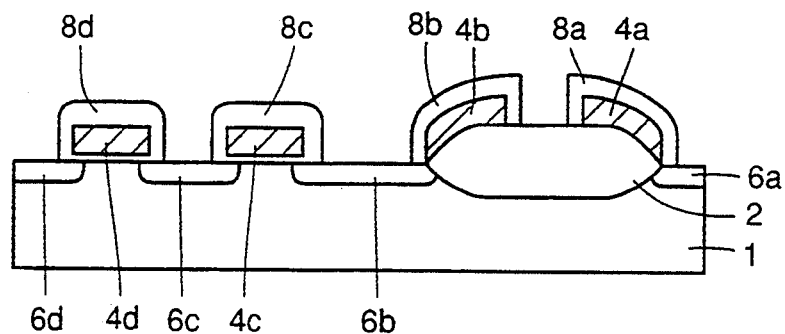

Referring to FIGS. 3 and 4, the insulating film 60 is etched using anisotropic etching, to form sidewall spacers on the sidewalls of the word lines 4a, 4b, 4c, 4d, so that the word lines 4a, 4b, 4c, 4d are covered with first insulating films 8a, 8b, 8c, 8d. With the first insulating films 8a, 8b, 8c, 8d as masks, impurity ions are implanted into the main surface of the silicon substrate 1 to form source-drain regions 6a, 6b, 6c, 6d in the main surface of the silicon substrate 1.

Figure 5:
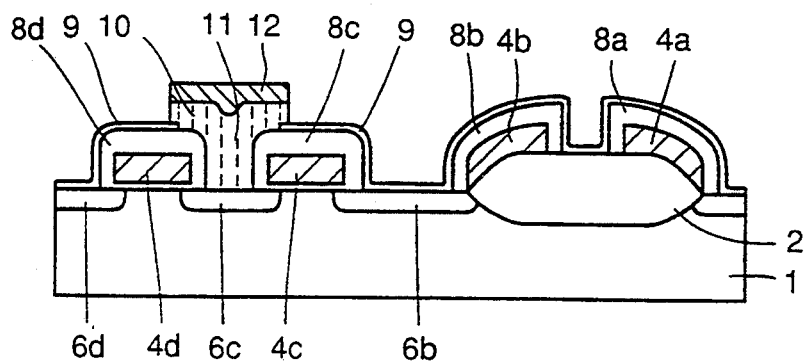

Referring to FIG. 5, an insulating film 9 is formed to cover the word lines 4a, 4b, 4c, 4d covered with the first insulating films 8a, 8b, 8c, 8d. The insulating film 9 is selectively etched to form a bit line contact hole 10. A bit line film and an insulating film (TEOS oxide film) are sequentially formed on the silicon substrate 1, in contact with the source-drain region 6c through the bit line contact hole 10. The bit line film and the insulating film are selectively patterned to form a bit line 11, and consequently an insulating film 12 is left on the bit line 11.

Figure 6:
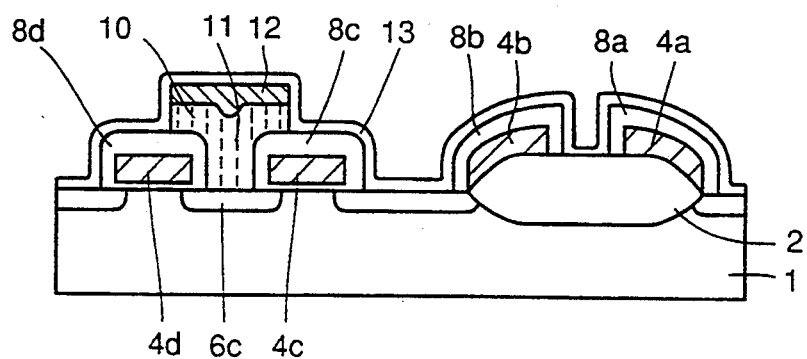

Referring to FIG. 6, an insulating film 13 is formed over the silicon substrate 1 to cover the bit line 11 having the insulating film 12.

Figure 7:
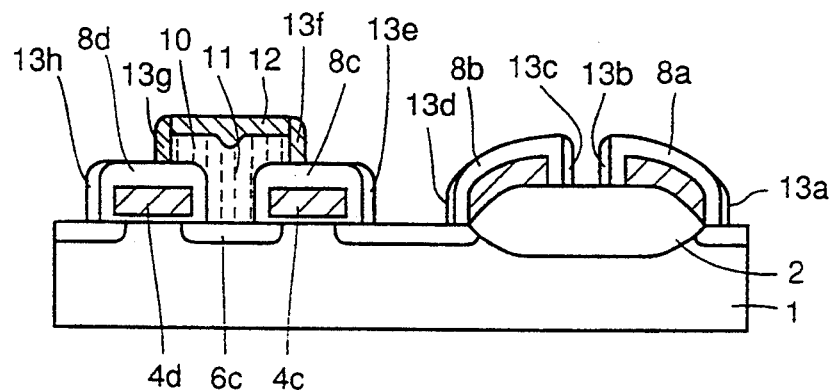

Referring to FIG. 7, sidewall spacers 13f, 13g are formed on the sidewalls of the bit line by an isotropic etching of the insulating film 13, and at this time, insulating films 13a, 13b, 13c, 13d, 13e, 13h are left on the sidewalls of the first insulating films 8a, 8b, 8c, 8d. In the following steps, in order to simplify drawings, the insulating films 13a and 13b, 13c and 13d, 13e, 13h are shown integrated with the first insulating films 8a, 8b, 8c, 8d, respectively.

Similarly, for simplification of drawings, the sidewall spacers 13f, 13g are also shown integrated with the insulating film 12.

Figure 8:
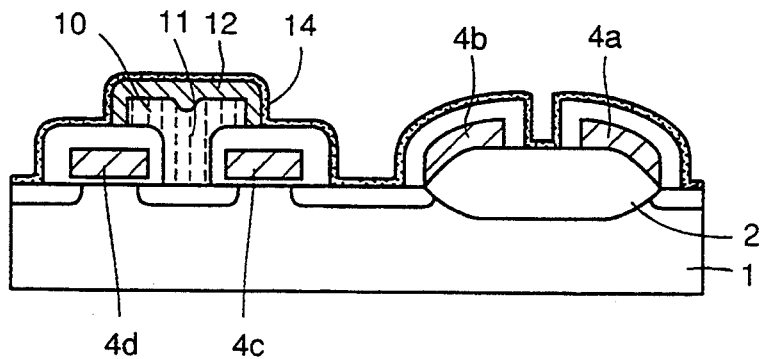

Referring to FIG. 8, a silicon nitride film 14 is deposited over the silicon substrate 1.

Figure 9:
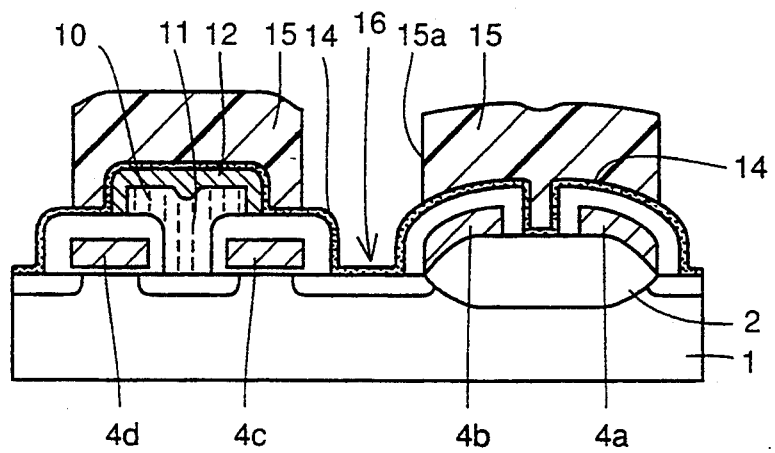
Figure 10:
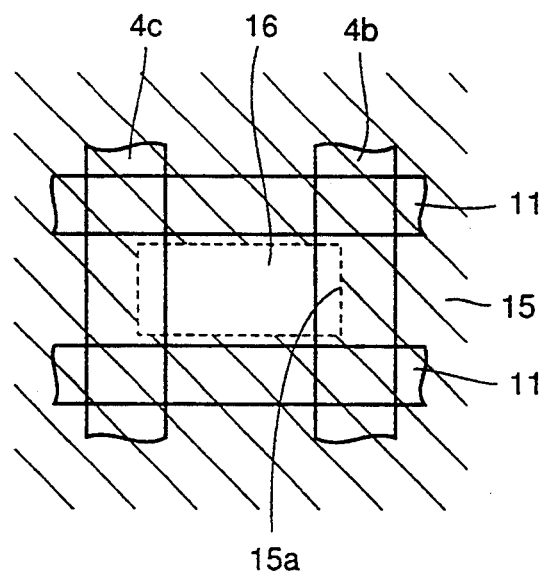
FIG. 10 is a plan view of the semiconductor memory device in FIG. 9.

Referring to FIGS. 9 and 10 (FIG. 10 is a plan view of the semiconductor memory device in FIG. 9), a resist pattern 15 is formed so as to have an aperture portion 15a on a part of a storage node contact hole 16.

Figure 11A:
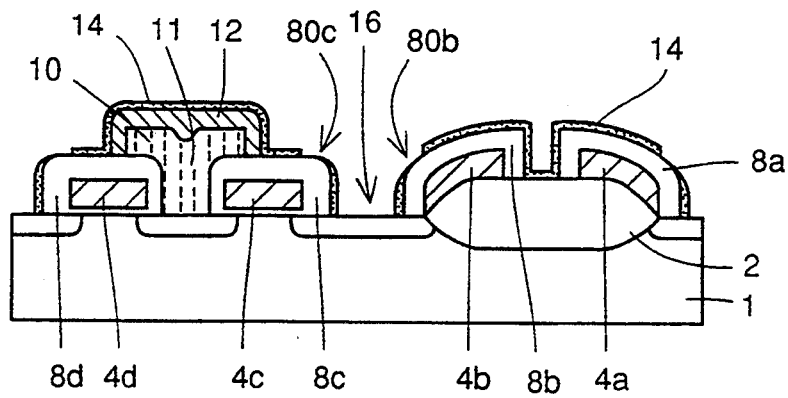
FIG. 11A is a partial cross sectional view of the semiconductor memory device in the tenth step of the manufacturing method according to the first embodiment of the present invention.
Figure 11B:
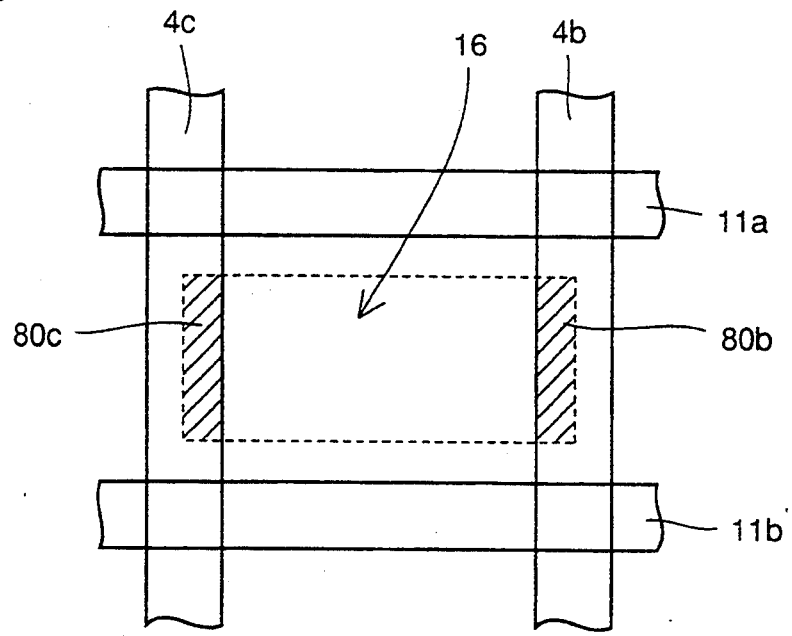
FIG. 11B is a plan view of the semiconductor memory device in FIG. 11A.

Referring to FIG. 9 and FIG. 11A, with the resist pattern 15 as a mask, the silicon nitride film 14 is selectively etched so as to be left on the bit line 11 and the word lines 4a, 4b, 4c, 4d, while forming the storage node contact hole 16. At this time, a part of the surface of the first insulating films 8a, 8b, 8c, 8d is exposed. FIG. 11B is a plan view of the semiconductor memory device in FIG. 11A. In FIG. 11B, a portion indicated by the reference character 80b is a part of the surface of the first insulating film 8b exposed by removal of the silicon nitride film 14. Similarly, a portion indicated by the reference character 80c is a part of the surface of the first insulating film 8c exposed by removal of the silicon nitride film 14.

Figure 12:
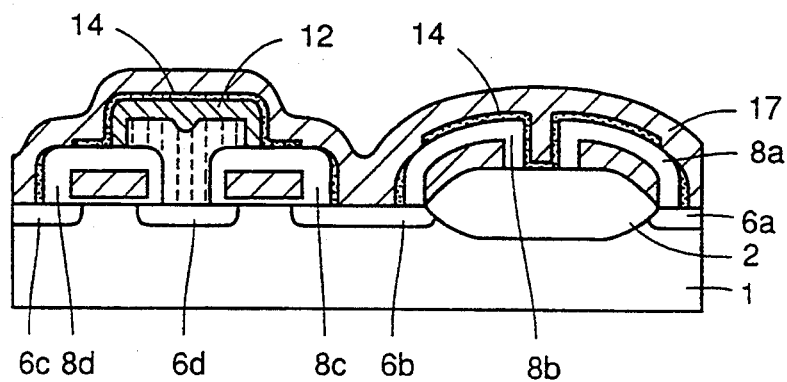
FIGS. 12 to 14 are partial cross sectional views of the semiconductor memory device in the eleventh to thirteenth steps of the manufacturing method according to the first embodiment of the present invention.

Referring to FIG. 12, a first conductor film 17 is formed over the silicon substrate 1 to be connected with the source-drain layer 6b, and to cover the first insulating films 8a, 8b, 8c, 8d and the second insulating film 12 selectively protected by the silicon nitride film 14.

Figure 13:
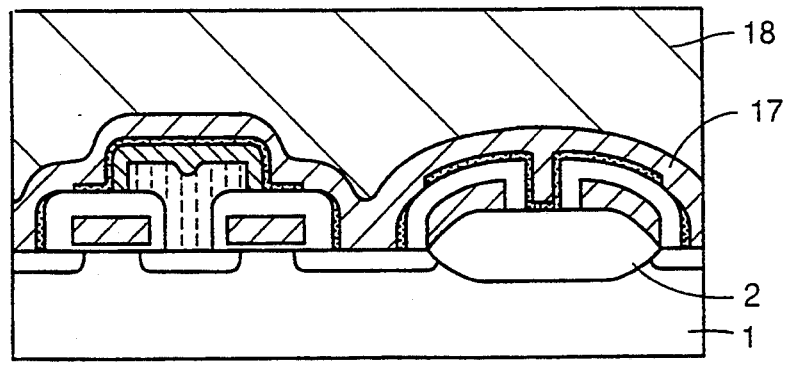

Referring to FIG. 13, an interlayer insulating film 18 is formed on the first conductor film 17. The interlayer insulating film 18 is formed of tetraethoxysilane oxide.

Figure 14:
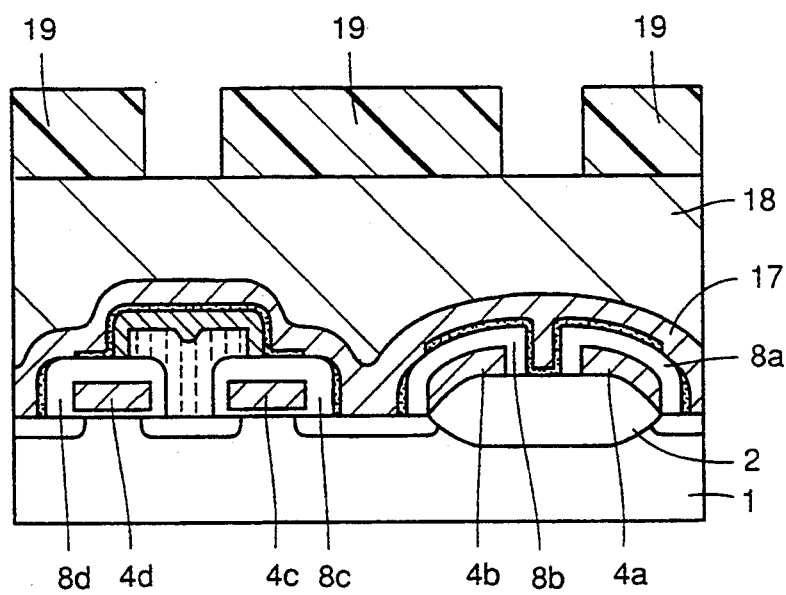
Figure 15:
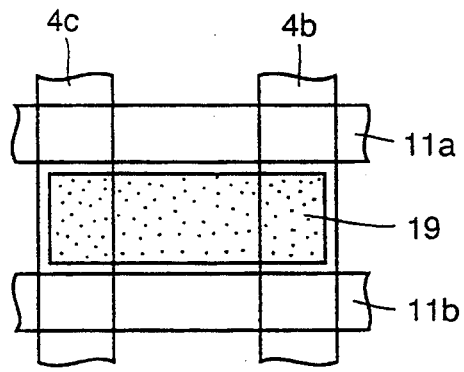
FIG. 15 is a plan view of the semiconductor memory device in FIG. 14.
Figure 16:
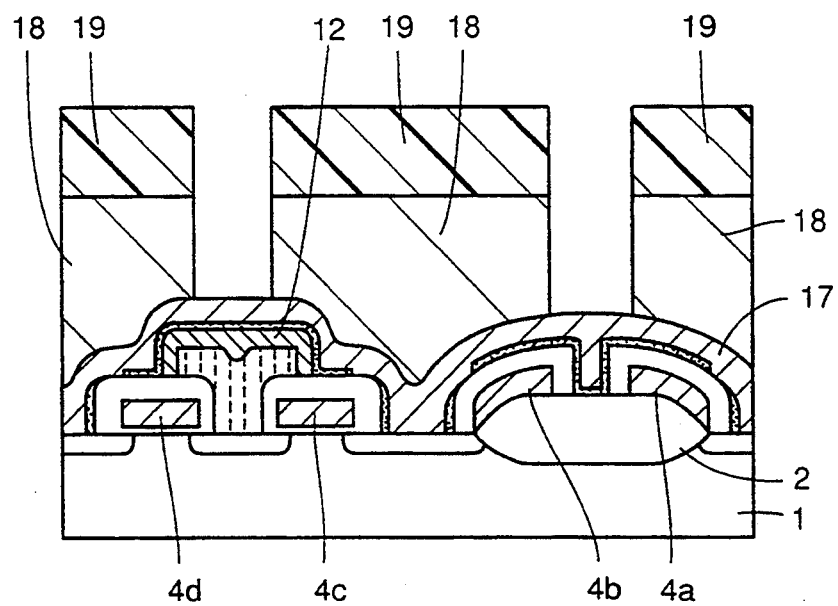
FIGS. 16 to 19 are partial cross sectional view of the semiconductor memory device in the fourteenth to seventeenth steps of the manufacturing method according to the first embodiment of the present invention.

Referring to FIG. 14, FIG. 15 (a plan view of the semiconductor memory device in FIG. 14), and FIG. 16, the interlayer insulating film 18 is patterned by photolithography using a resist pattern 19 so that the interlayer insulating film 18 is left only on a bottom conductive portion of the cylindrical storage node to be formed.

Figure 17:
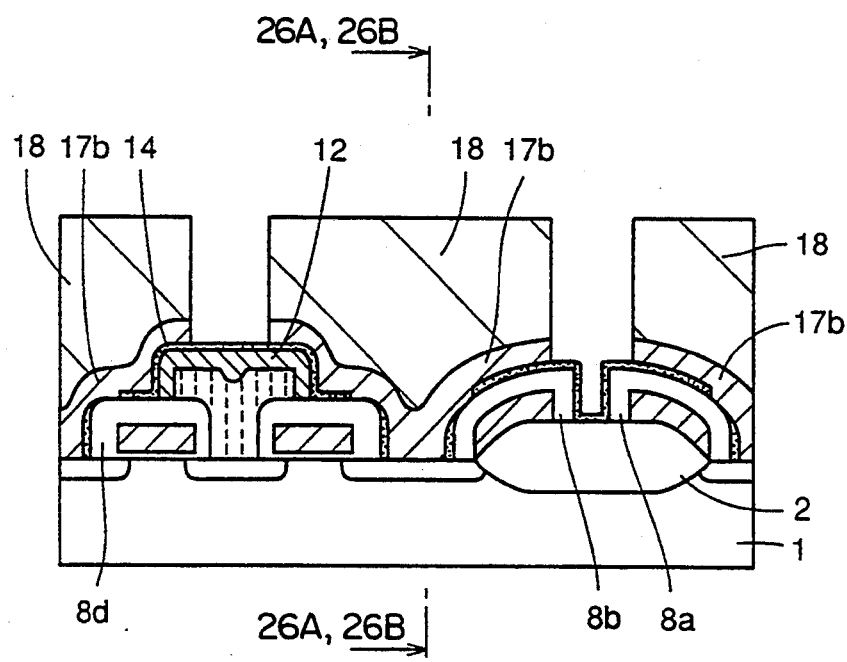

Referring to FIG. 17, with the patterned interlayer insulating film 18 as a mask, the first conductor film 17 is selectively etched to form the bottom conductive portion 17b. Since the surface of the first insulating films 8a, 8b, 8c, 8d and the second insulating film 12 is protected by the silicon nitride film 14, the first insulating films 8a, 8b, 8c, 8d and the second insulating film 12 are not etched.

Figure 18:
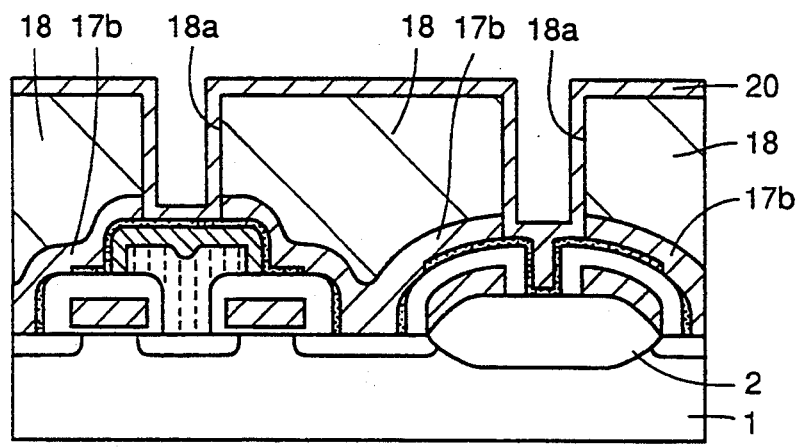

Referring to FIG. 18, the whole of the outer surface of the patterned interlayer insulating film 18 including an inner wall side of an aperture portion 18a therein is covered with a second conductor film 20 to be connected with an end of the bottom conductive portion 17b. The second conductor film 20 is formed of polysilicon, amorphous silicon, or the like.

Figure 19:
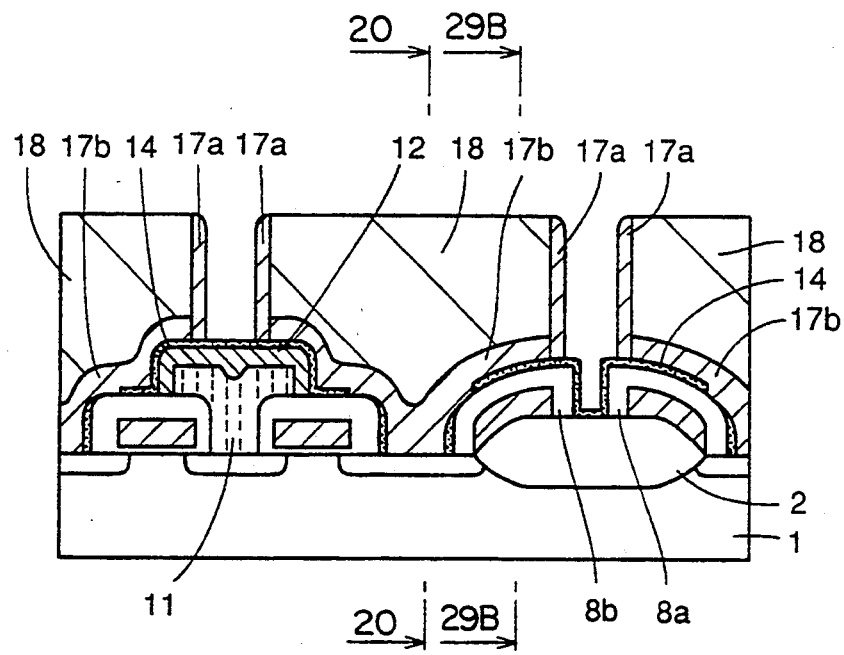

Referring to FIGS. 18 and 19, the second conductor film 20 is etched back so that the surface of the interlayer insulating film 18 is exposed, resulting in formation of a sidewall conductive portion 17a of a cylindrical storage node. At this time, the end of the etch back can be easily detected, and hereinafter the reason will be described.

Figure 100A:
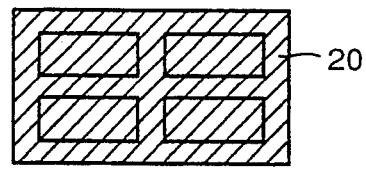
FIGS. 100A and 100B are plan views showing the reason why the manufacturing method according to the first embodiment of the present invention can be easily implemented.
Figure 100A:
Figure 100B:
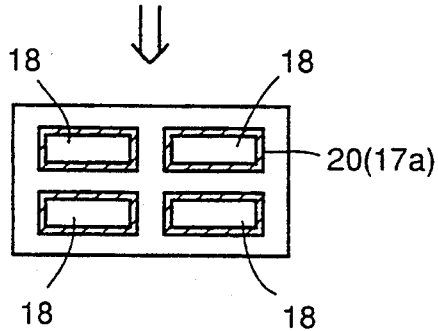

FIG. 100A is a plan view of the semiconductor memory device in FIG. 18, and FIG. 100B is a plan view of that in FIG. 19. A shaded portion 20 is the second conductor film, formed of polysilicon, for example. Referring to these figures, the area of the second conductor film 20 before etch back (see FIG. 100A) and the area of the second conductor film 20 after etch back (see FIG. 100B) are significantly different. Therefore, because of the considerable change of the area, the end of the etch back can be easily detected.

Figure 20:
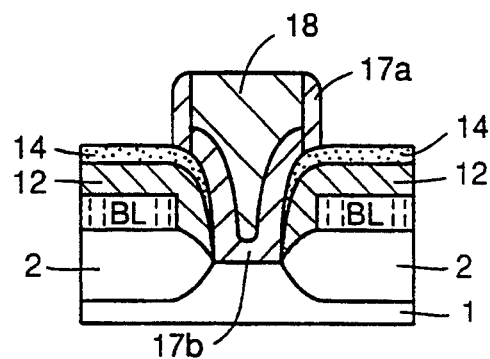
FIG. 20 is a cross sectional view taken along the line B—B in FIG. 19.

FIG. 20 is a cross sectional view taken along the line B—B in FIG. 19.

Figure 21:
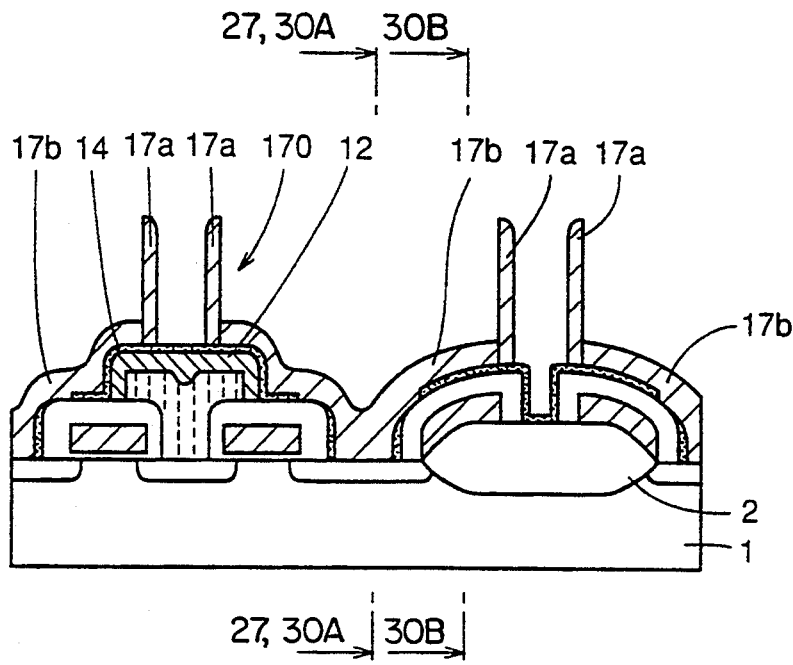
FIGS. 21 to 25 are partial cross sectional views of the semiconductor memory device in the eighteenth to twenty-second steps of the manufacturing method according to the first embodiment of the present invention.

Referring to FIGS. 19 to 21, the interlayer insulating film 18 is removed by isotropic wet etching. At this time, referring to FIG. 20, the silicon nitride film 14 prevents the second insulating film 12 from being etched.

Through the above steps, a sidewall conductive portion 17a of the cylindrical storage node is formed.

Figure 22:
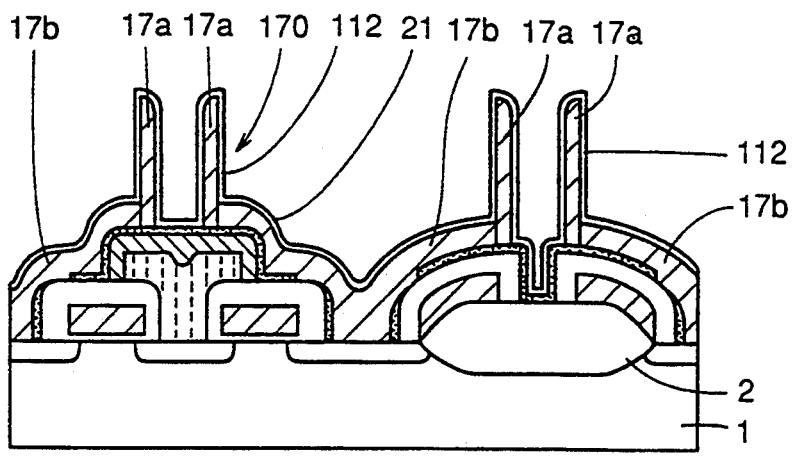
Figure 23:
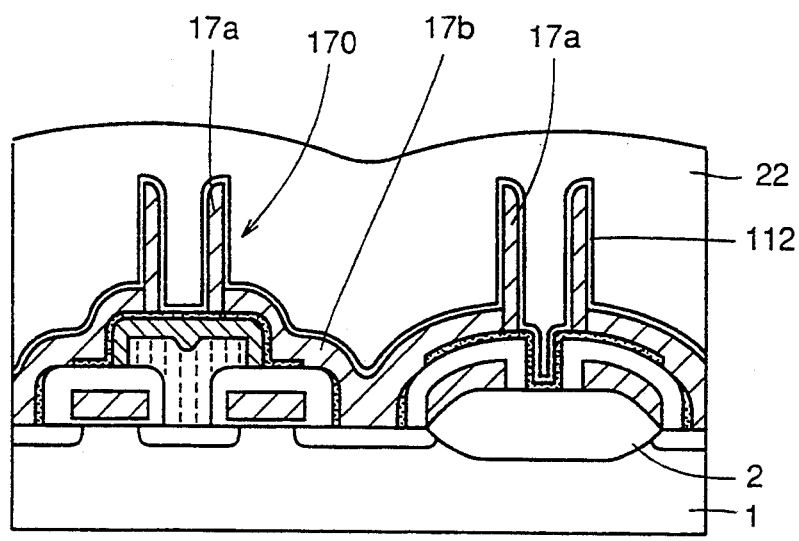
Figure 24:
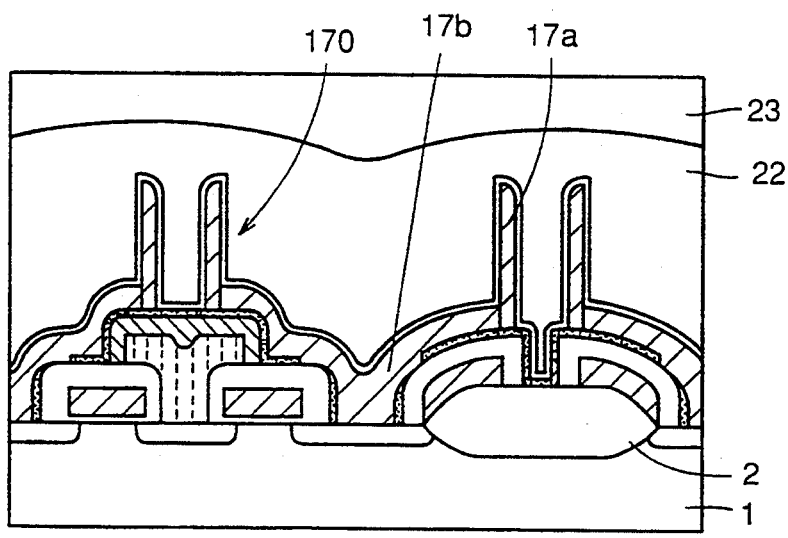

Referring to FIG. 22, the outer surface of the cylindrical storage node 170 is covered with a capacitor insulating film 112. Referring to FIG. 23, a cell plate 22 is formed over the silicon substrate 1 to cover the outer surface of the cylindrical storage node 170, with the capacitor insulating film 112 interposed therebetween. Referring to FIG. 24, an interlayer insulating film 23 is formed on the cell plate 22.

Figure 25:
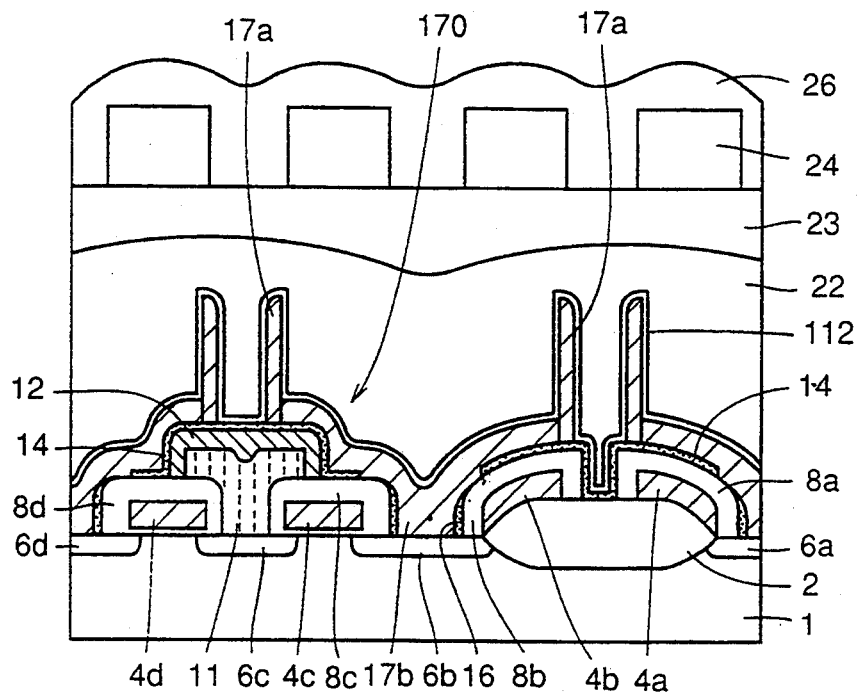

Referring to FIG. 25, a wiring layer 24 is formed on the interlayer insulating film 23. A passivation film 26 is formed over the silicon substrate 1 to cover the wiring layer 24.

Through the above steps, a semiconductor memory device having a cylindrical capacitor, ensuring enough capacitance of the capacitor can be formed with a small occupied area.

The structure of the semiconductor memory device having a cylindrical capacitor obtained will be described with reference to FIG. 25. The semiconductor device includes the semiconductor substrate 1 having the conductive layer 6a, 6b, 6c and 6d formed on its main surface. The word lines 4a, 4b, 4c and 4d and the bit line 11 are formed on the semiconductor substrate 1. The insulating films 12, 8a, 8b, 8c and 8d are provided over the semiconductor substrate 1 to cover the word lines 4a, 4b, 4c and 4d and the bit line 11. The barrier film 14 is selectively provided on a predetermined region of the insulating films 12, 8a, 8b, 8c and 8d for protecting the same from etchant. The cylindrical storage node 170 is electrically connected to the conductive layer 6b. The cylindrical storage node includes the bottom conductive portion 17b provided in contact with the conductive layer 6b through the contact hole 16, and along the surface of the insulating films 8b, 8c and 12 with the barrier film 14 interposed therebetween, and the sidewall conductive portion 17a provided along the periphery of the bottom conductive portion 17b, and extending upward. The semiconductor device further includes the capacitor insulating film 112 provided to cover the outer surface of the cylindrical storage node 170. The cell plate 22 is provided to cover the outer surface of the cylindrical storage node 170 with the capacitor insulating film 112 interposed therebetween.

Figure 89:
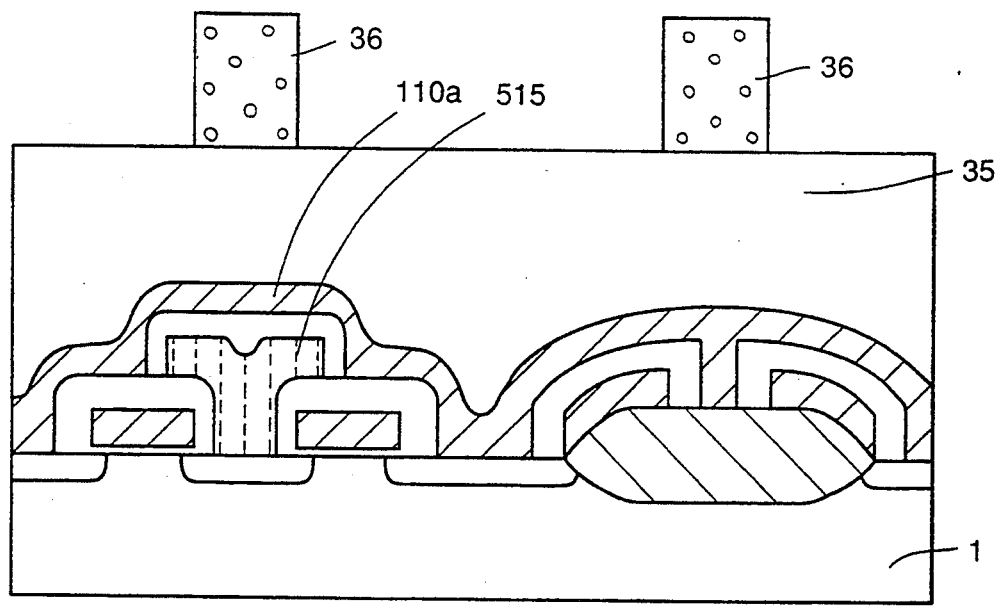
Figure 90:
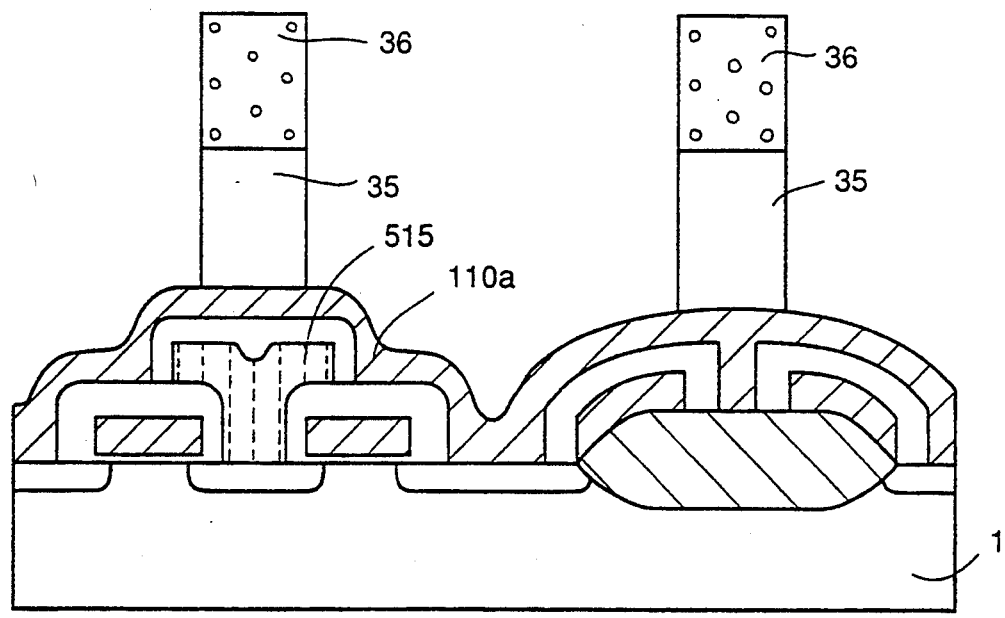
Figure 91:
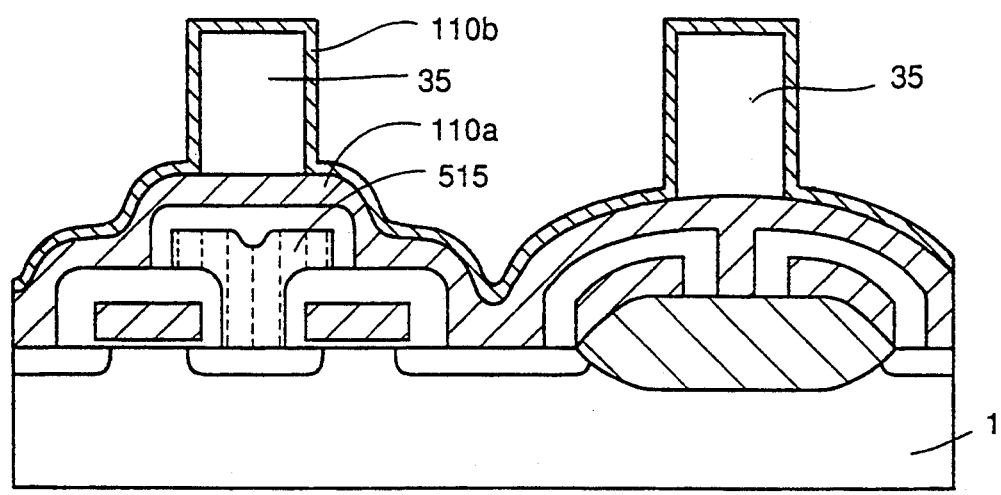
Figure 92:
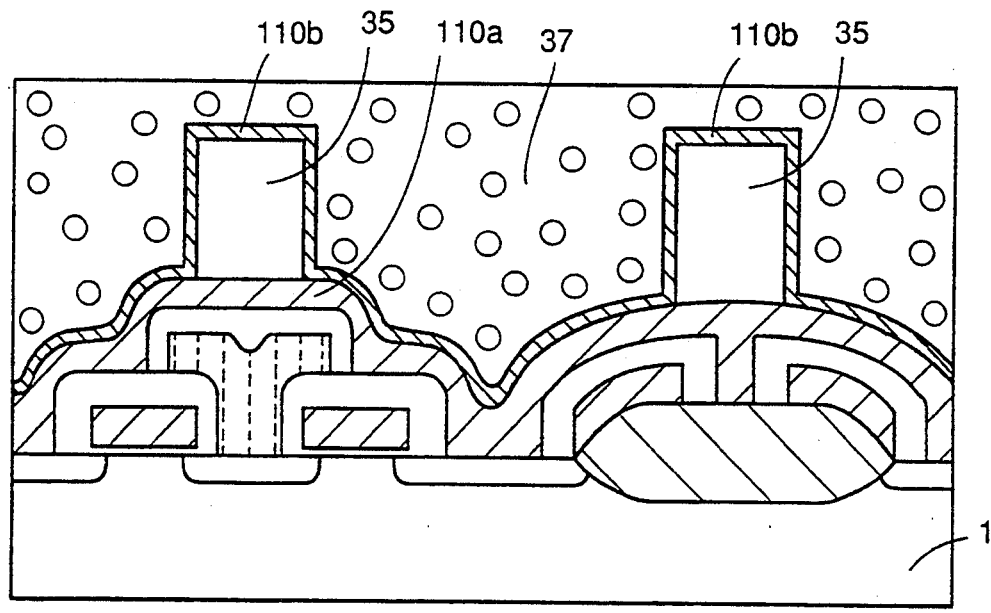
Figure 93:
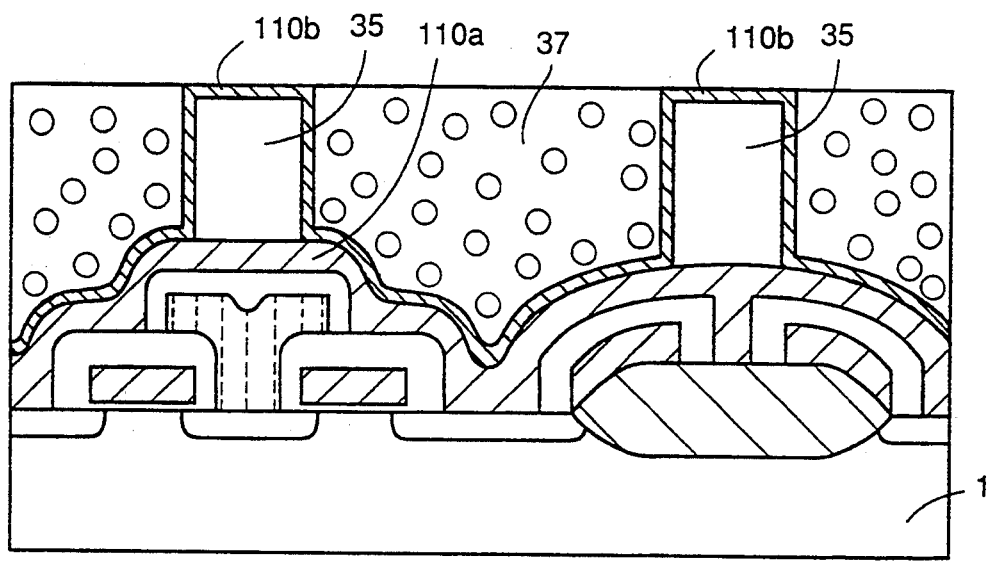
Figure 94:
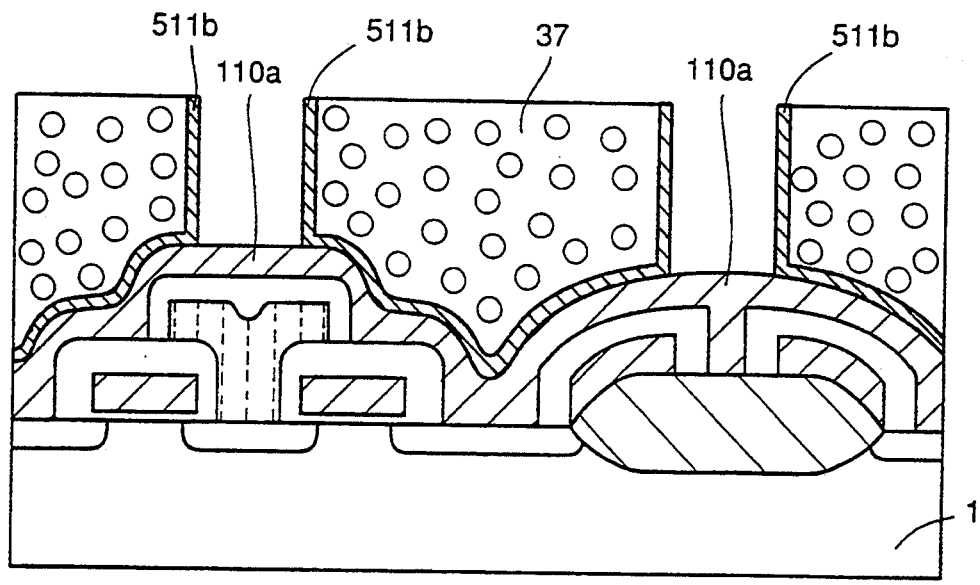
Figure 95:
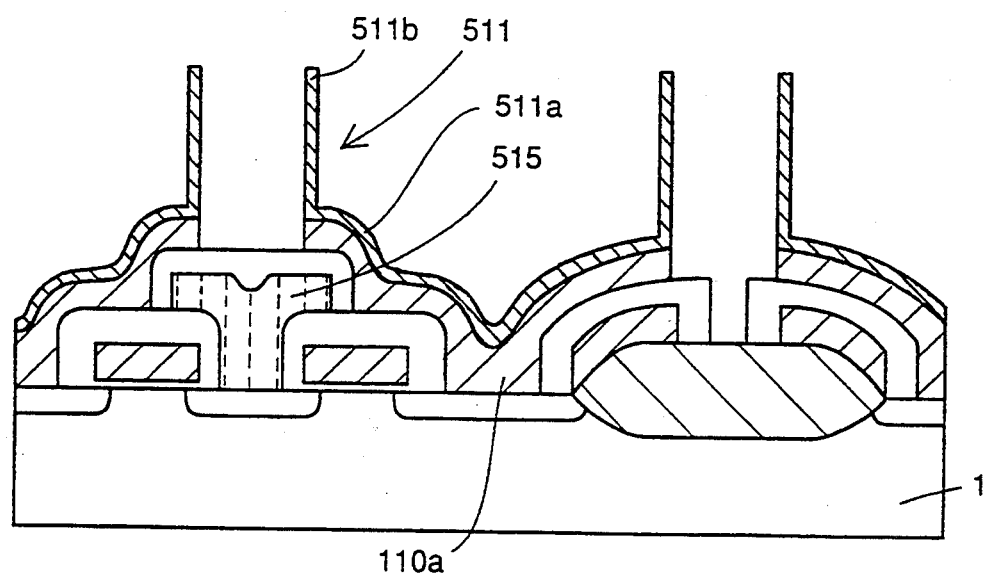
Figure 96:
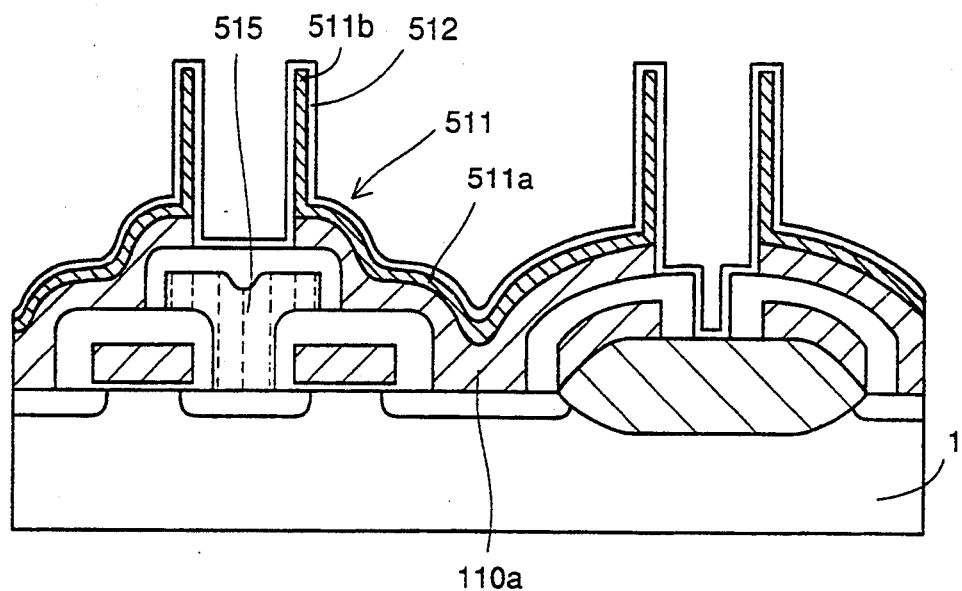
Figure 97:
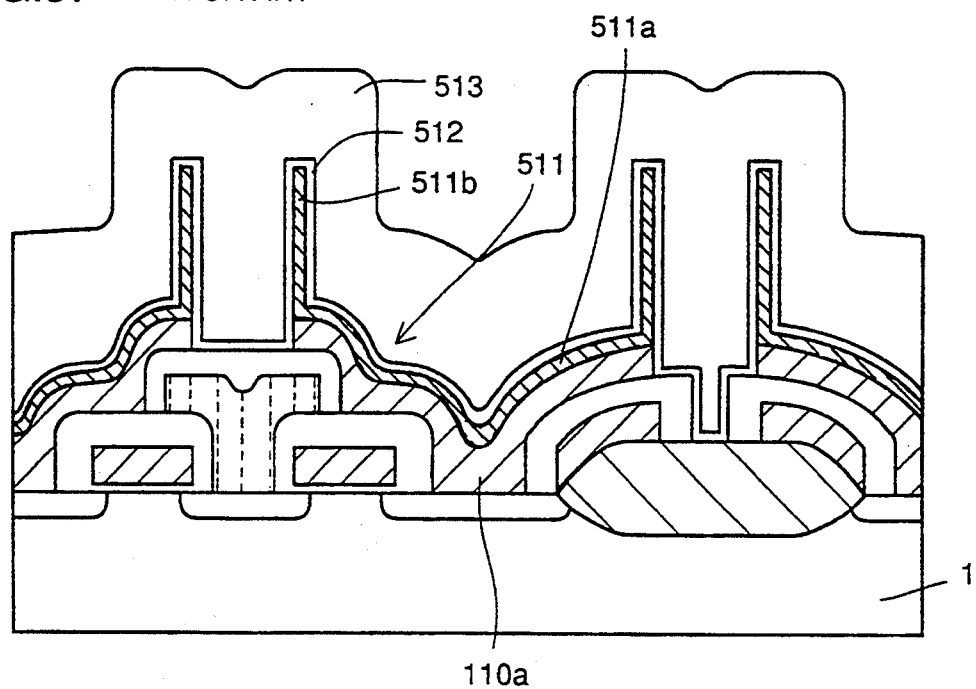
Figure 98:
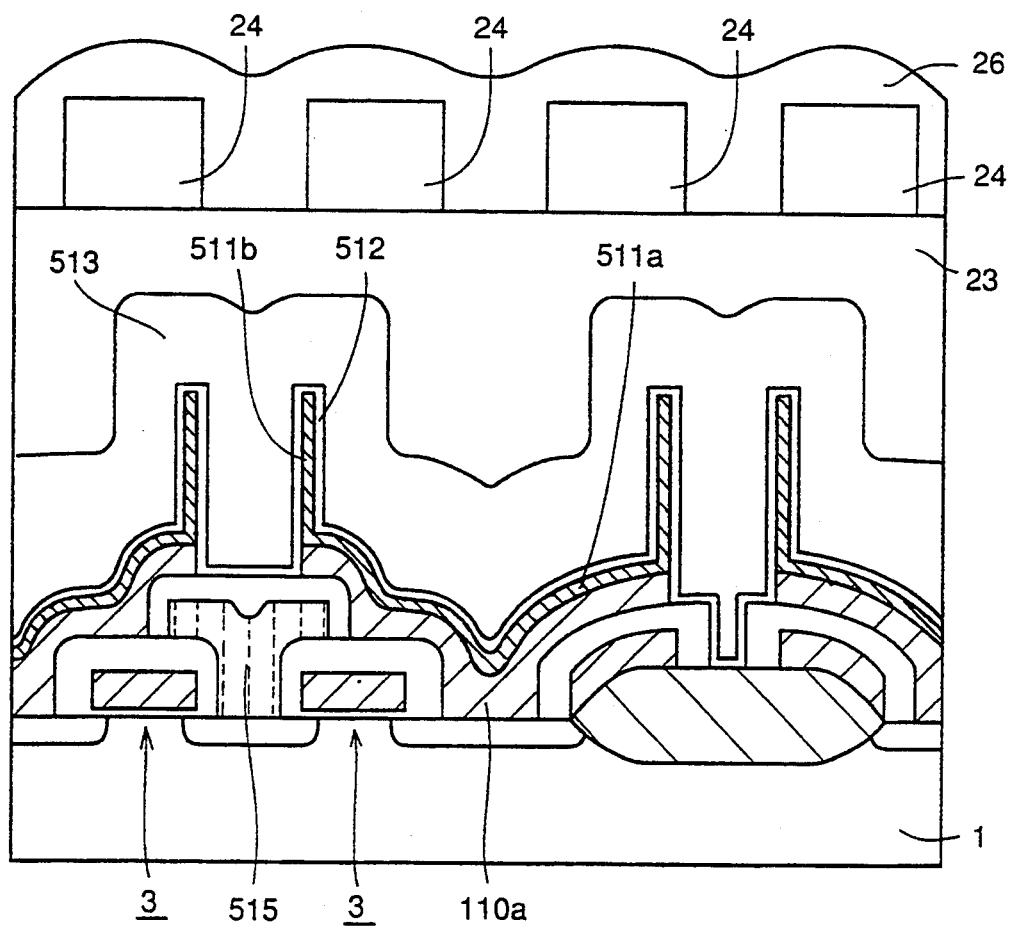
Figure 99A:
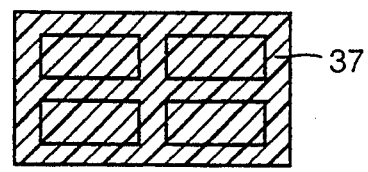
FIGS. 99A and 99B are plan views showing the reason why the semiconductor memory device shown in FIG. 83 can not be easily manufactured.
Figure 99A:
Figure 99B:
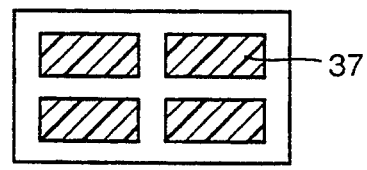

Referring to FIGS. 14 and 89 for the purpose of comparison, these figures show cross sectional views in the relation between negative and positive. The silicon nitride film covering the insulating films in the present invention is not used in the conventional steps shown in FIGS. 84 to 98. Therefore, unlike the semiconductor memory device in FIGS. 19 and 21, if a resist pattern such as the resist pattern 19 of FIG. 14 is formed in the steps shown in FIGS. 84 to 98, the absence of the silicon nitride film 14 causes the first insulating film 8 and the second insulating film 12 to be removed together with the interlayer insulating film 18, preventing formation of a cylindrical capacitor. Thus, in the steps shown in FIGS. 84 to 98 without the silicon nitride film 14, a resist pattern as shown in FIG. 14 can not be used.

On the other hand, in the present embodiment, a method of manufacturing a semiconductor device having a cylindrical capacitor can be easily implemented, by adding a step of covering the surface of the first insulating film 8 and the second insulating film 12 with the silicon nitride film 14.

Embodiment 2

Embodiment 2 is directed to a further improvement of Embodiment 1.

Figure 26A:
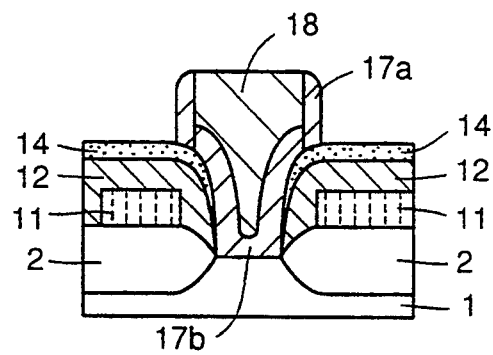
FIGS. 26A and 26B are cross sectional views taken along the line B—B of FIG. 17, in which a silicon nitride film is removed because of overetching.
Figure 26B:
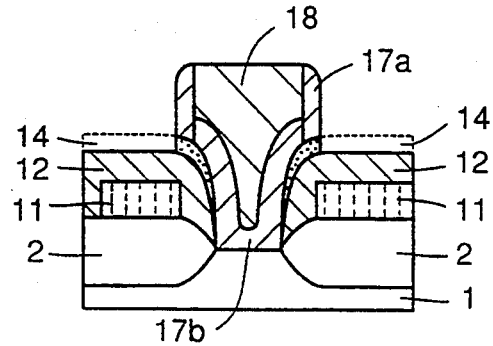
Figure 27:
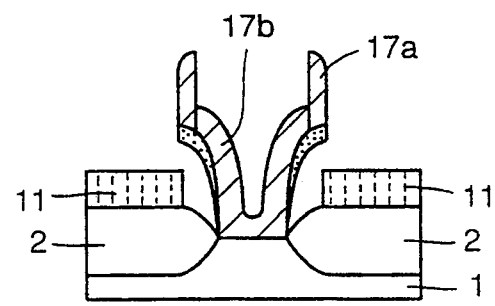
FIG. 27 is a cross sectional view taken along the line B—B of FIG. 21, showing a problem which arises when a silicon nitride film is removed.

FIGS. 26A and 26B shows cross sectional views taken along the line B—B of FIG. 19. FIG. 26A shows a normal state, and FIG. 26B shows a state where the silicon nitride film 14 is partially removed by overetching. FIG. 27 is a cross sectional view taken along the line B—B of the device obtained in the step of FIG. 21, further processed after the silicon nitride film 14 is overetched.

As shown in FIG. 26A, no problem arises when the silicon nitride film 14 is left. If the silicon nitride film 14 is partially removed because of overetching as shown in FIG. 26B, however, the second insulating film 12 for protecting the bit line 11 is removed together with the interlayer insulating film (TEOS oxide film) 18 as shown in FIGS. 19 to 27. This is one reason for improvement.

Figure 28A:
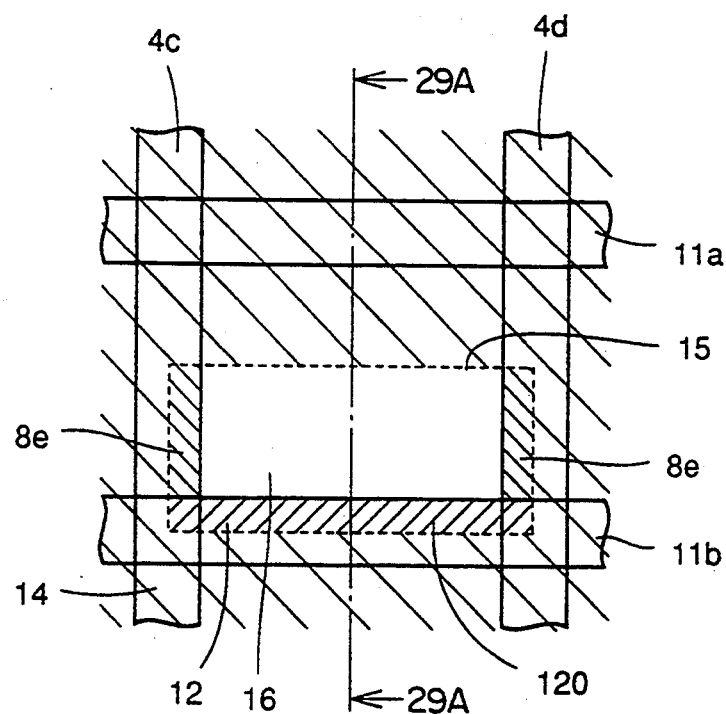
FIG. 28A is a plan view corresponding to that of FIG. 10, in which a resist pattern is formed shifted because of offset mask alignment.
Figure 29A:
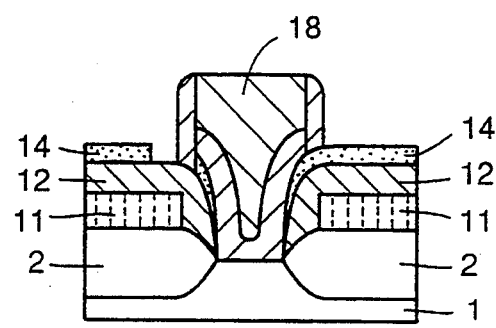
FIG. 29A is a cross sectional view taken along the line B—B in FIG. 28A, in which a silicon nitride film is partially removed.
Figure 30A:
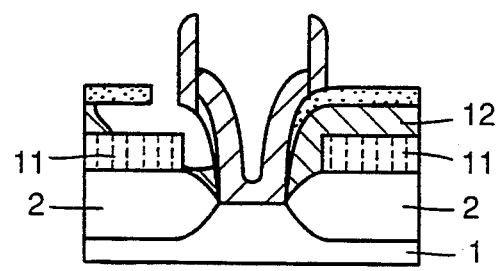
FIG. 30A is a cross sectional view taken along the line B—B of FIG. 21, showing a problem which arises when a silicon nitride film is partially removed.

FIG. 28A is a plan view corresponding to that shown in FIG. 10, showing shifted formation of the resist pattern 15 because of offset mask alignment. FIG. 29A and FIG. 30A are cross sectional views taken along the line B—B in FIG. 28A. FIG. 29A shows a step corresponding to that shown in FIG. 19, and FIG. 30A shows a step corresponding to that shown in FIG. 21. Referring to these figures, the shifted formation of the resist pattern 15 (FIG. 28A) causes partial removal of the silicon nitride film 14, and, in turn, partial exposure of the surface of the second insulating film 12 (FIG. 29A). Consequently, the second insulating film 12 for protecting the bit line 11 is removed simultaneously with removal of the interlayer insulating film 18.

Figure 28B:
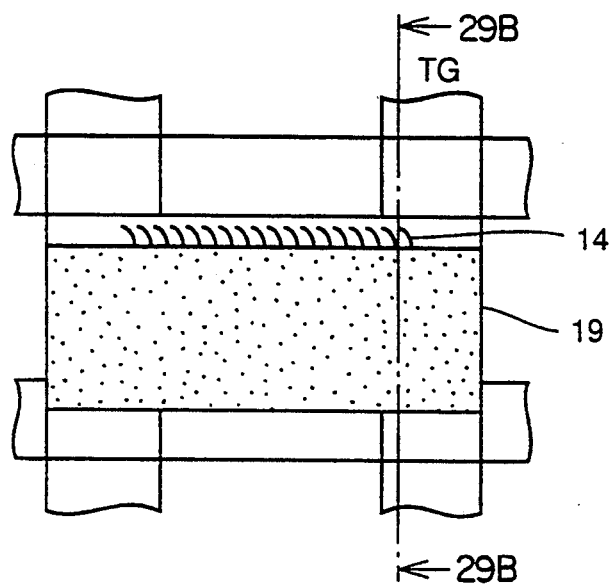
FIG. 28B is a plan view corresponding to that of FIG. 15, in which a resist pattern is formed shifted because of offset mask alignment.
Figure 29B:
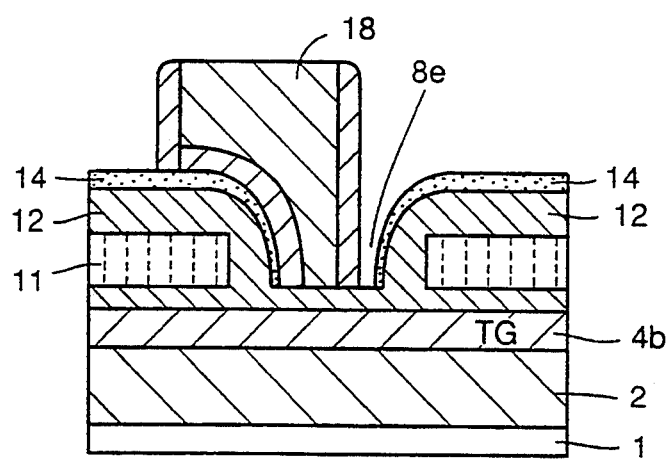
FIG. 29B is a cross sectional view taken along the line C—C in FIG. 19 and FIG. 28B, in which a silicon nitride film is partially removed.
Figure 30B:
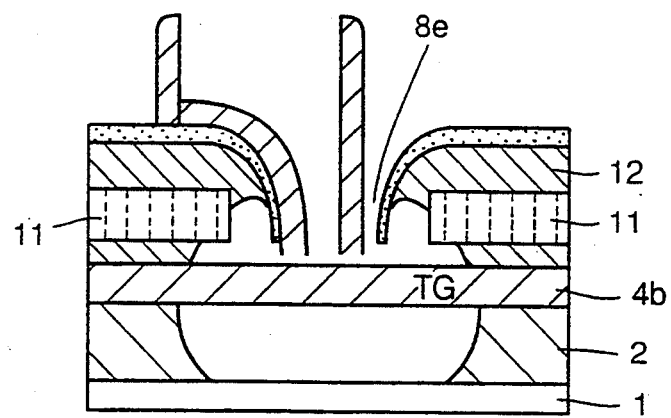
FIG. 30B is a cross sectional view taken along the line C—C of FIG. 21, showing a problem which arises when a silicon nitride film is partially removed.

Additionally, the following improvement is required. FIG. 28B is a plan view corresponding to that in FIG. 15, showing shifted formation of the resist pattern 19 because of offset mask alignment. FIGS. 29B and 30B are cross sectional views taken along the line C—C of FIG. 28B. FIG. 29B shows a step corresponding to that shown in FIG. 19. FIG. 30B shows a step corresponding to that shown in FIG. 21.

Referring to these figures, shifted formation of the resist pattern 19 (FIG. 28B) causes partial removal of the silicon nitride film 14 (FIG. 29B), and, in turn, removal of the second insulating film 12 and the field oxide film 2 simultaneously with removal of the interlayer insulating film 18 as in the figure (FIG. 30B). This is another reason for improvement.

Figure 32:
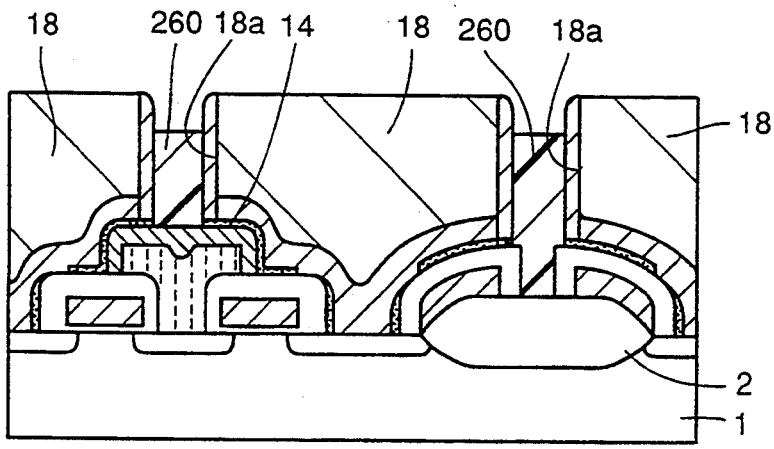
Figure 33:
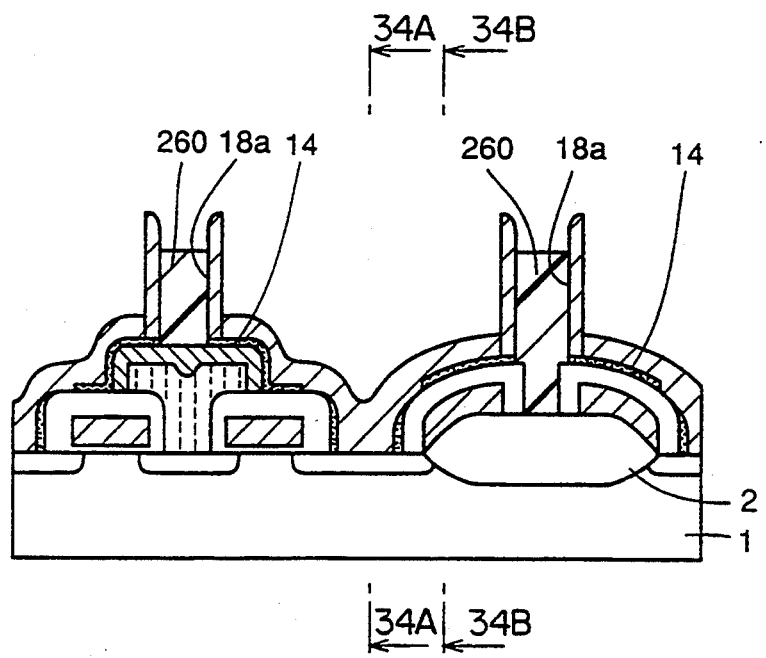

Embodiment 2 is made to further improve Embodiment 1. In Embodiment 2, the steps shown in FIGS. 31, 32 and 33 are added to the steps shown in Embodiment 1.

A method in accordance with Embodiment 2 will now be described.

The steps shown in FIGS. 1 to 19 are first carried out. In FIG. 19, it is assumed that the silicon nitride film 14 was removed because of overetching.

Figure 31:
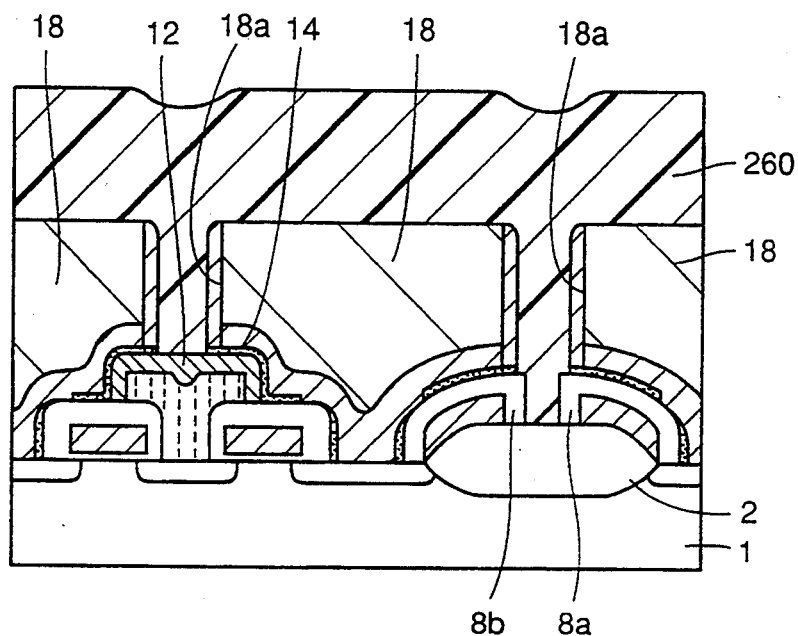
FIGS. 31 to 33 are partial cross sectional views of a semiconductor memory device in the additional first to third steps to the steps shown in FIGS. 1 to 19, showing a manufacturing method according to a second embodiment of the present invention.

Referring to FIG. 31, a resist 260 is formed over the silicon substrate 1, to be buried in the aperture portion 18a formed in the interlayer insulating film 18.

Referring to FIG. 32, the resist 260 is etched back, to be buried only in the aperture portion 18a.

Referring to FIGS. 32 and 33, the interlayer insulating film 18 is removed by wet etching. Since the resist 260 is buried in the aperture portion 18a, even if the silicon nitride film 14 does not lie on the first insulating film 8a, 8b and the second insulating film 12, the resist 260 serves as etching stopper, eliminating the problem shown in FIG. 27.

Figure 34A:
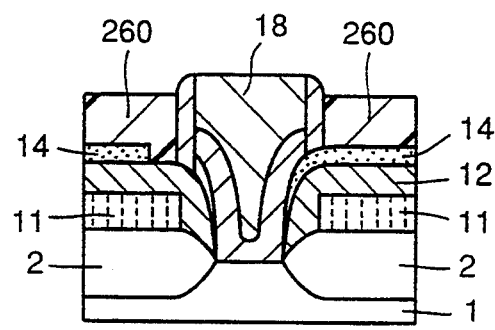
FIG. 34A is a cross sectional view taken along the line B—B of FIG. 33.

Referring to FIG. 34A corresponding to FIG. 29A, since the resist 260 is buried in the portion where the silicon nitride film 14 partially removed, the second insulating film 12 can not be removed, unlike that shown in FIG. 30. In addition, referring to FIG. 34B corresponding to FIG. 29B, even if the silicon nitride film 14 is overetched, the resist 260 is buried therein, eliminating the problem shown in FIG. 30B.

Figure 34B:
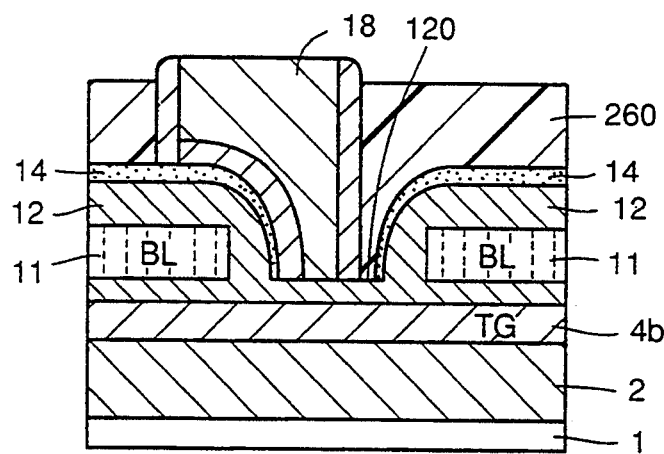
FIG. 34B is a cross sectional view taken along the line C—C of FIG. 33.

Referring to FIGS. 34A and 34B, even when a portion of the silicon nitride film 14 is omitted, the resist 260 protects the first insulating film 8 and the second insulating film 12, and the second insulating film 12 cannot be removed, unlike that shown in FIGS. 30A and 30B.

Figure 35:
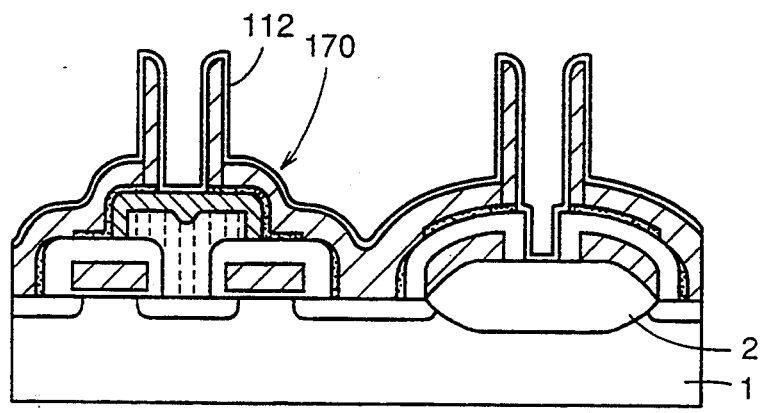
FIGS. 35 to 39 are partial cross sectional views of the semiconductor memory device in the additional fourth to eighth steps to the steps shown in FIGS. 1 to 19, showing the manufacturing method according to the second embodiment of the present invention.

Referring to FIGS. 33 and 35, the resist 260 is removed.

Figure 36:
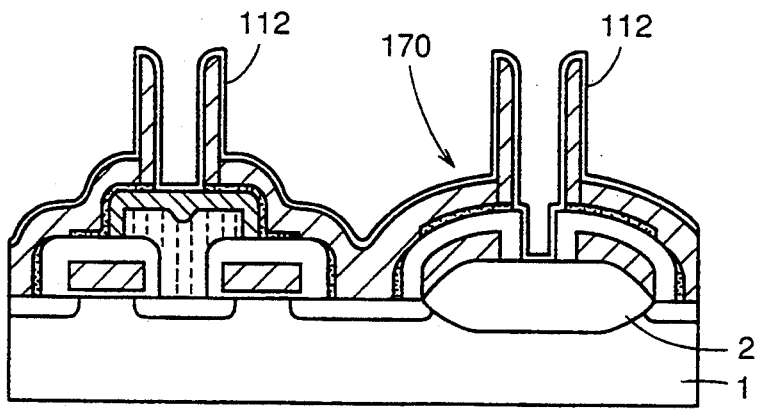
Figure 37:
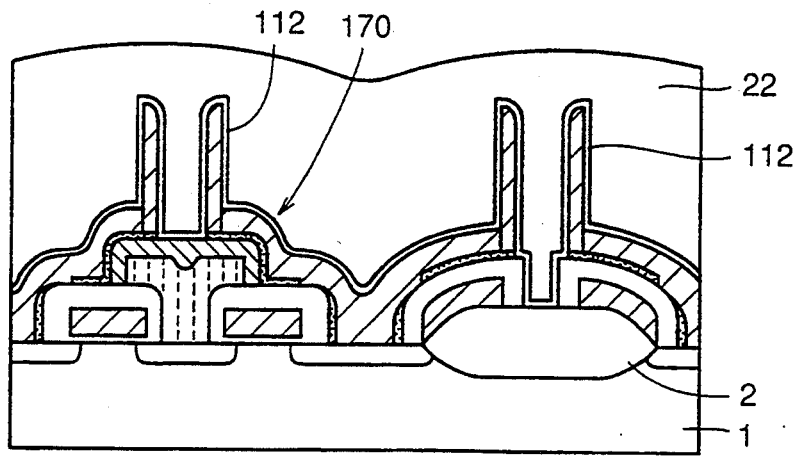
Figure 38:
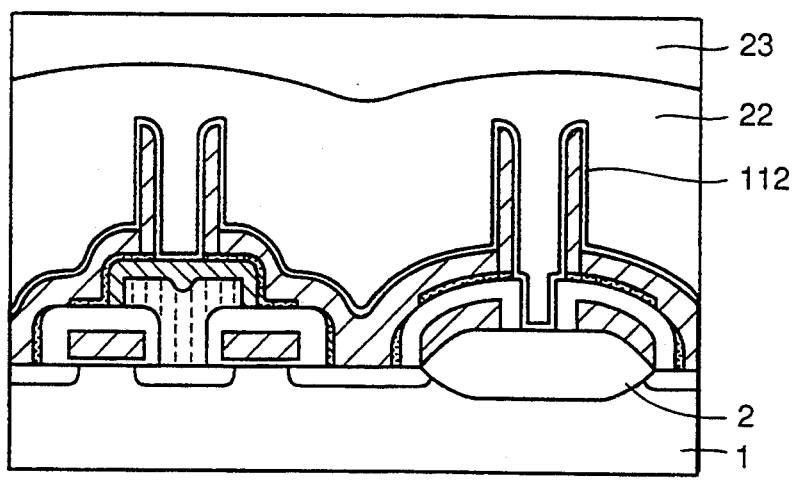

Referring to FIG. 36, the outer surface of a cylindrical storage node 170 is covered with a capacitor insulating film 112. Referring to FIG. 37, the cell plate 22 is formed on the silicon substrate 1 to cover the outer surface of the cylindrical storage node 170, with the capacitor insulating film 112 interposed therebetween. Referring to FIG. 38, the interlayer insulating film 23 is formed on the cell plate 22.

Figure 39:
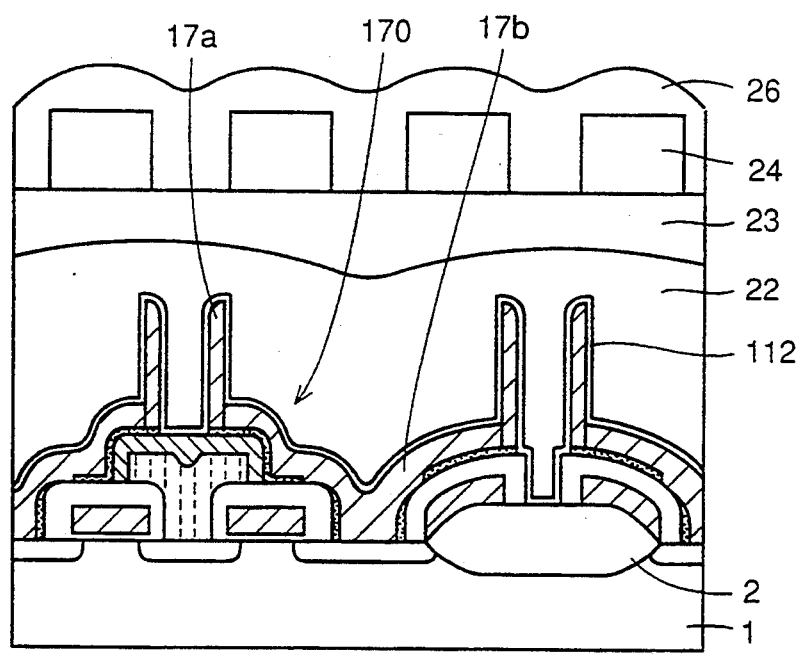

Referring to FIG. 39, the wiring layer 24 is formed on the interlayer insulating film 23, and thereafter the passivation film 26 is formed over the silicon substrate 1 to cover the wiring layer 24.

Embodiment 3

Embodiment 3 is made to further improve Embodiment 1.

In Embodiment 1, with reference to FIGS. 9 and 11, since the etching selection ratio of the silicon substrate 1 to the silicon nitride film 14 is small, the silicon substrate 1 is etched together with the silicon nitride film 14, when the silicon nitride film 14 is etched away for forming the contact hole 16.

Embodiment 3 is directed to improve this point.

First, the steps shown in FIGS. 1 to 7 are carried out.

Figure 40:
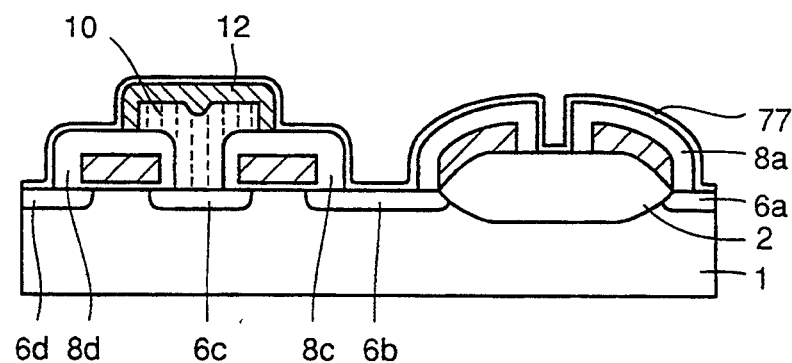
FIGS. 40 to 45 are partial cross sectional views of a semiconductor memory device in the additional first to sixth steps to the steps shown in FIGS. 1 to 7, showing a manufacturing method according to a third embodiment of the present invention.
Figure 41:
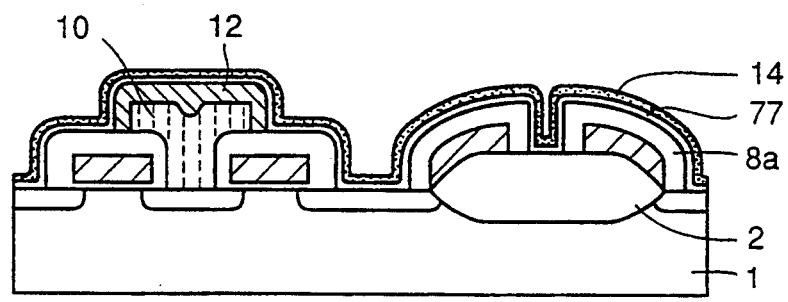

Thereafter, referring to FIG. 40, an $SiO_2$ film 77 is formed over the semiconductor substrate 1, in contact with the conductive layer 6b. Referring to FIG. 41, the silicon nitride film 14 is then formed on the $SiO_2$ film 77.

Figure 42:
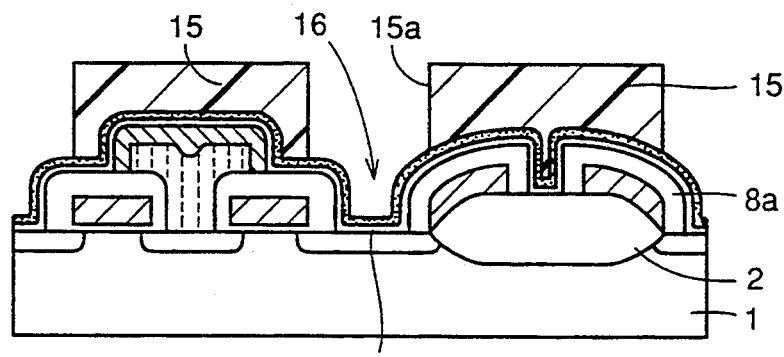

Referring to FIG. 42, the resist pattern 15 having the aperture portion 15a on a portion for the storage node contact hole 16 to be formed is formed over the semiconductor substrate 1.

Figure 43:
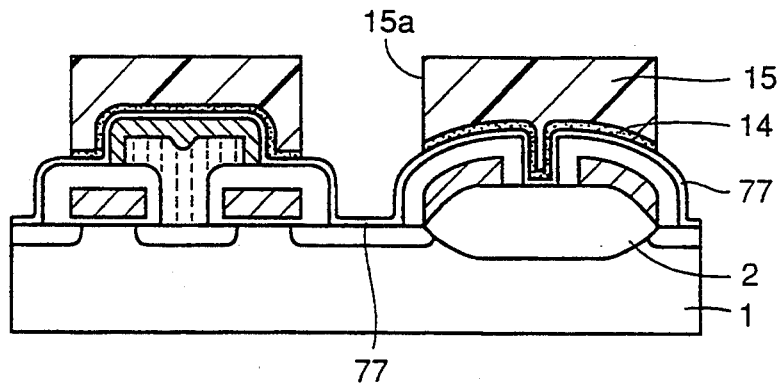

Referring to FIGS. 42 and 43, the silicon nitride film 14 is selectively etched with the resist pattern 15 as a mask. Since the etching selection ratio of the $SiO_2$ film 77 to the silicon nitride film 14 is large, the $SiO_2$ film 77 is hardly etched. The $SiO_2$ film 77 prevents the surface of the semiconductor substrate from being etched.

Figure 44:
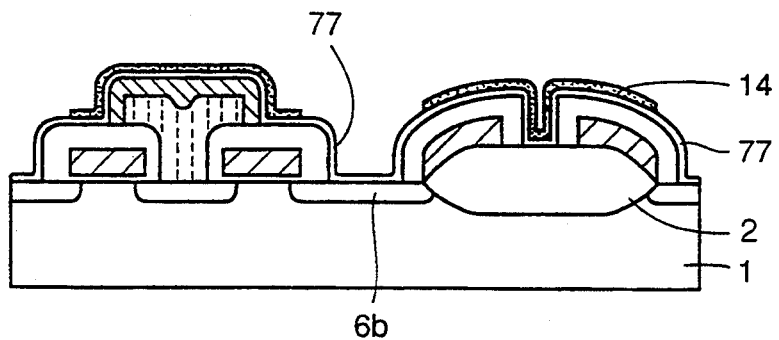
Figure 45:
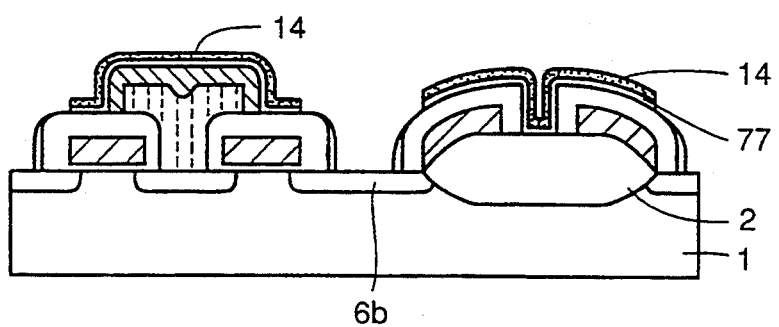
Figure 46:
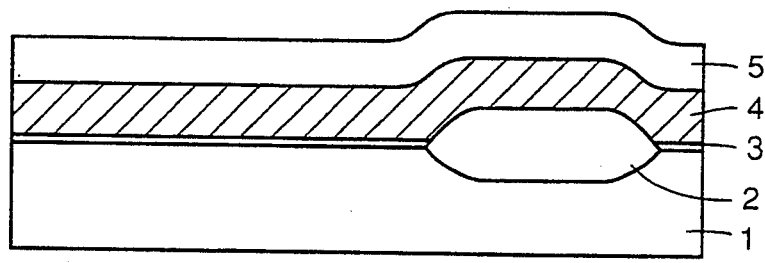
FIGS. 46 to 67 are partial cross sectional views of a semiconductor memory device in the first to twenty second steps of a manufacturing method according to a fourth embodiment of the present invention.
Figure 47:
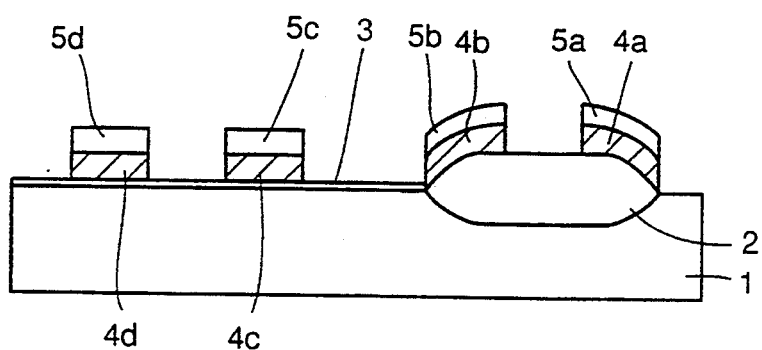
Figure 48:
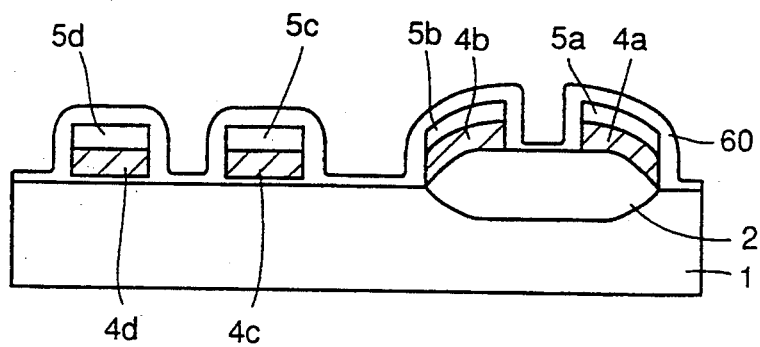
Figure 49:
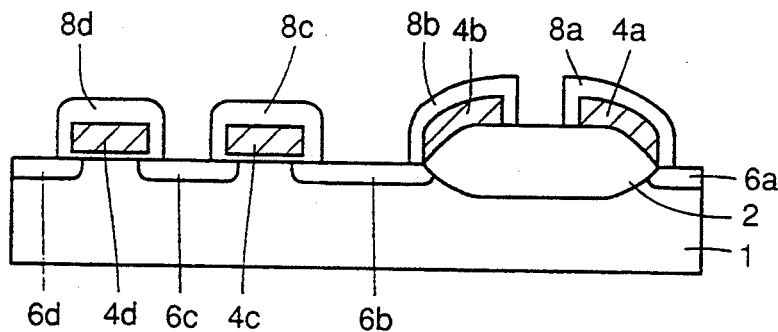
Figure 50:
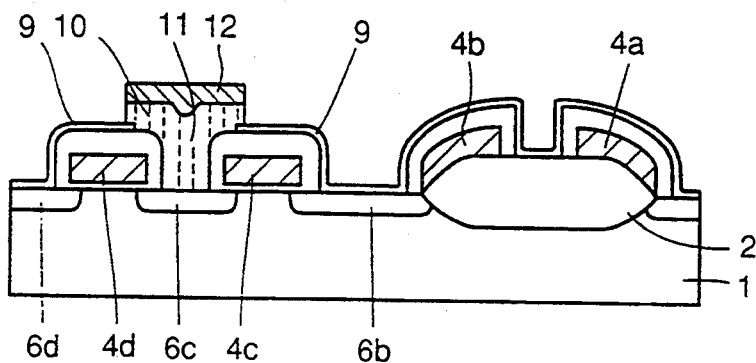
Figure 51:
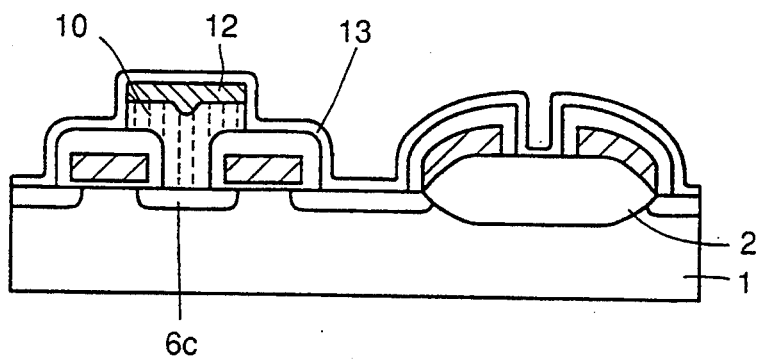
Figure 52:
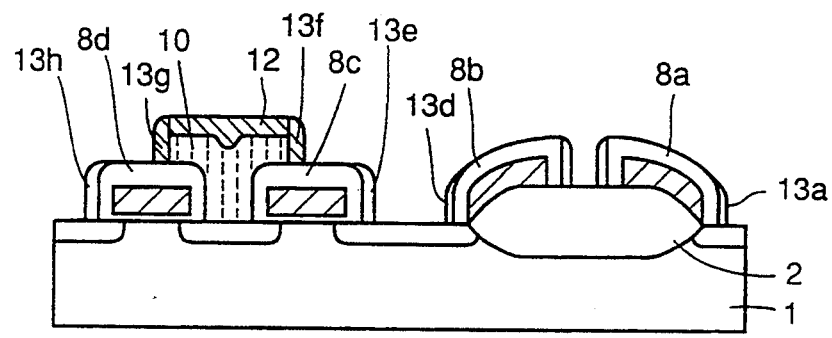

Referring to FIGS. 44 and 45, the $SiO_2$ film 77 is etched away, so that the surface of the conductive layer 6b is exposed. Thereafter, the steps of FIGS. 12 to 25 are carried out, and a semiconductor memory device having a cylindrical capacitor is obtained.

Embodiment 4

Embodiment 4 is a manufacturing method of a semiconductor memory device having a cylindrical capacitor according to still another embodiment of the present invention.

The steps shown in FIGS. 46 to 52 are initially carried out. Since these steps are the same ones as in FIGS. 1 to 7, like reference numerals are attached to like portions, and the description thereof is not repeated.

Figure 53:
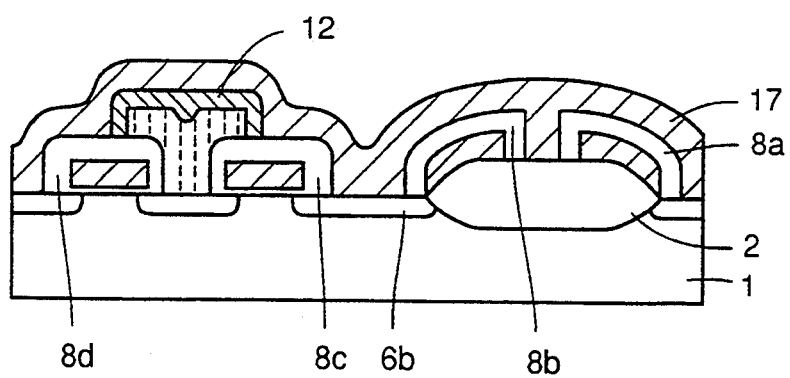

Referring to FIGS. 53, the first conductor film 17 is formed over the silicon substrate 1, to contact with the source/drain layer 6b and to cover the first insulating film 8a, 8b, 8c, 8d and the second insulating film 12. This embodiment is different from Embodiment 1, in that a silicon nitride film is not used.

Figure 54:
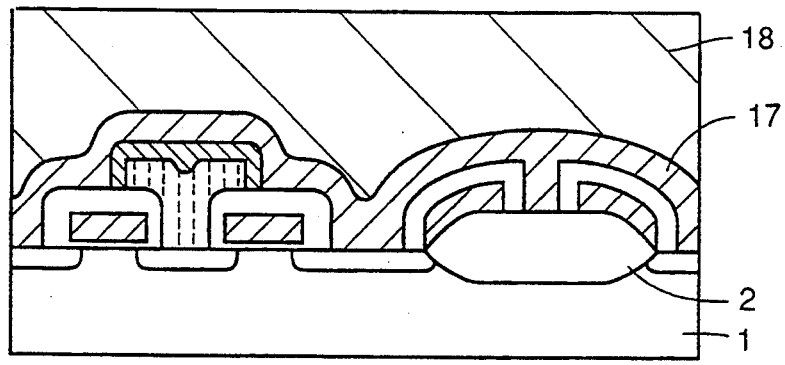

Referring to FIG. 54, the interlayer insulating film 18 is formed on the first conductor film 17. interlayer insulating film 18 is formed of film 17. The tetraethoxysilane oxide film.

Figure 55:
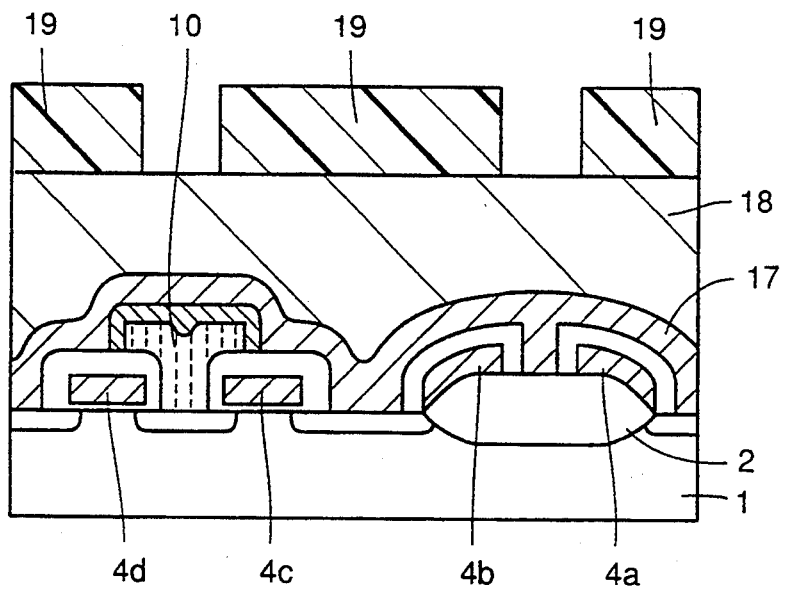
Figure 56:
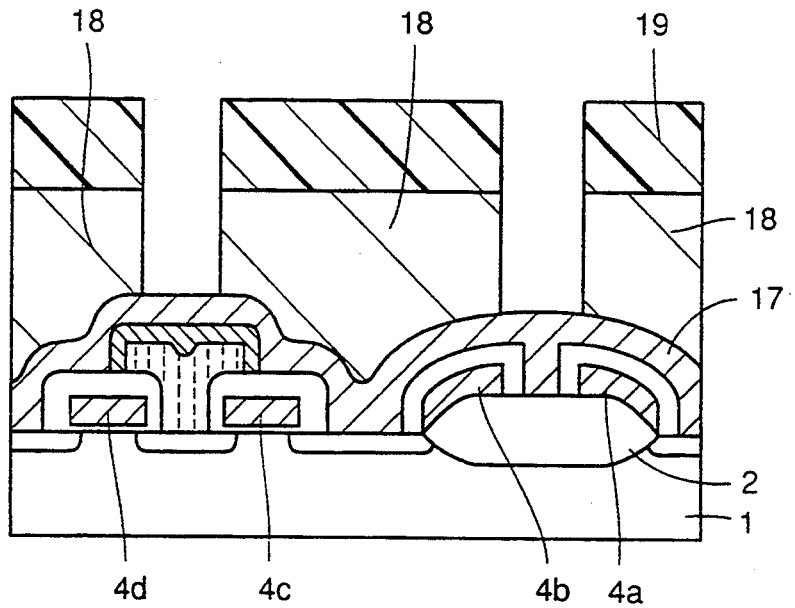

Referring to FIGS. 55 and 56, the interlayer insulating film 18 is patterned by means of photolithography using the resist pattern 19, so as to lie only on a bottom conductive portion of a cylindrical storage node to be formed.

Figure 57:
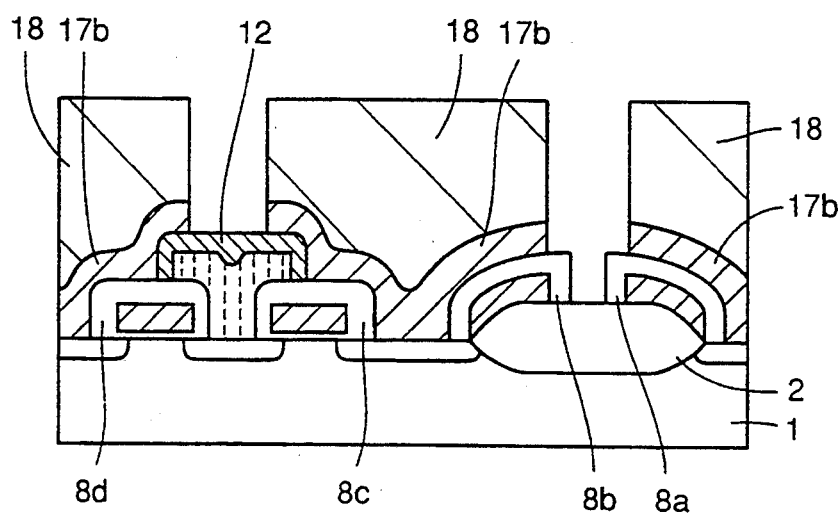

Referring to FIGS. 56 and 57, with the patterned interlayer insulating film 18 as a mask, the first conductor film 17 is selectively etched, so that the bottom conductive portion 17b of the cylindrical storage node is formed.

Figure 58:
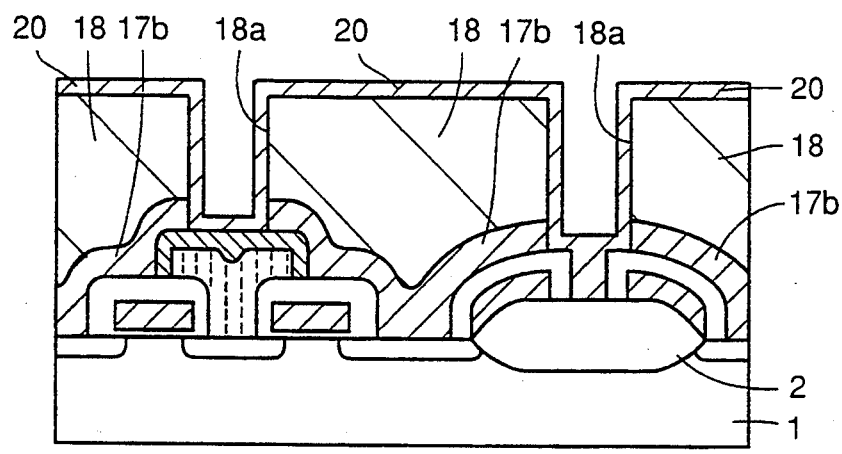

Referring to FIG. 58, the second conductor film 20 covers the whole outer surface of the interlayer insulating film 18 including the inner wall surface of the aperture portion 18a in the patterned interlayer insulating film 18, to contact with an end of the bottom conductive portion 17b. The second conductor film 20 is formed of polysilicon, amorphous silicon or the like.

Figure 59:
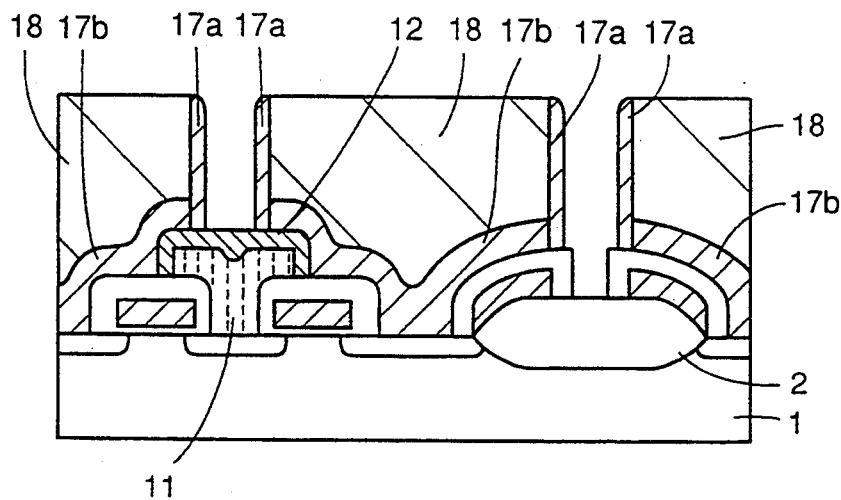

Referring to FIGS. 58 and 59, the second conductor film 20 is etched back to expose the surface of the interlayer insulating film 18.

Figure 60:
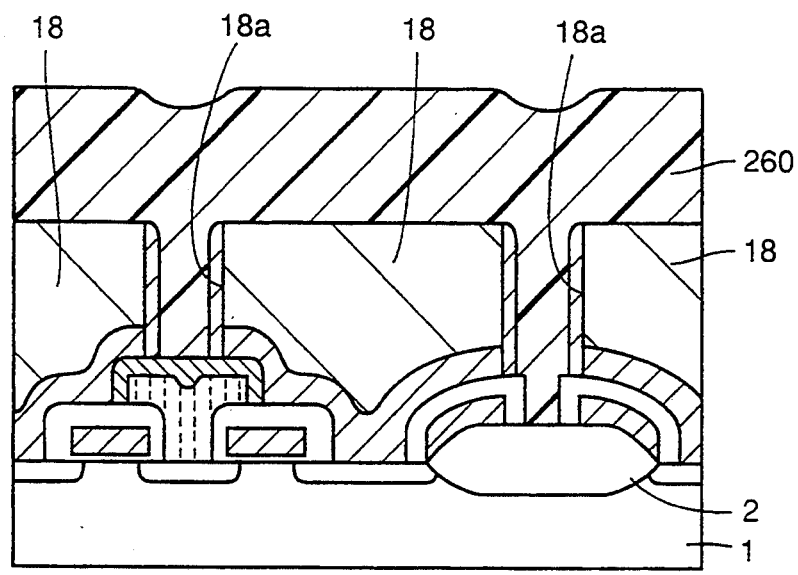

Referring to FIG. 60, the resist 260 is formed over the silicon substrate 1, so as to bury the same into the aperture portion 18a formed in the interlayer insulating film 18.

Figure 61:
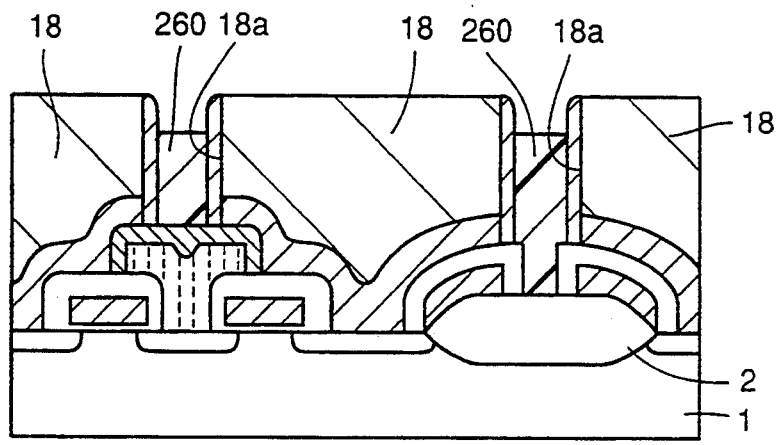

Referring to FIG. 61, the resist 260 is etched back to be buried only in the aperture portion 18a.

Figure 62:
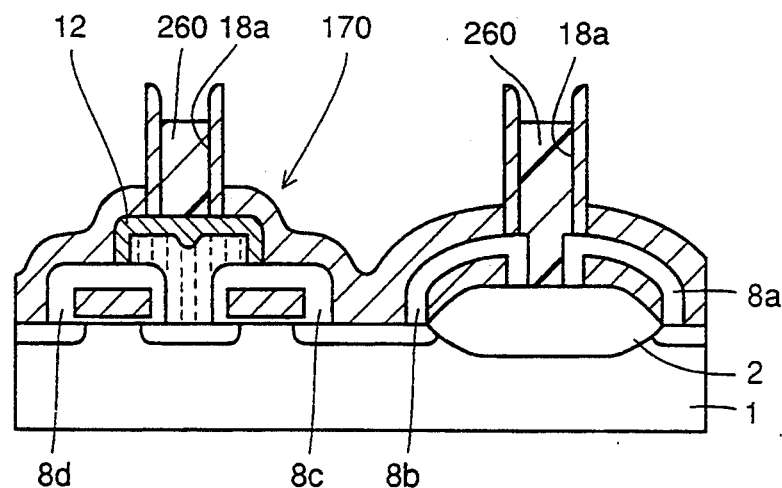

Referring to FIG. 61 and 62, the interlayer insulating film 18 is removed by wet etching. Since the resist 260 is buried in the aperture portion 18a, the etching liquid does not contact with the first insulating film 8a, 8b and the second insulating film 12. Thus, the first insulating film 8a, 8b and the second insulating film 12 are not etched.

Figure 63:
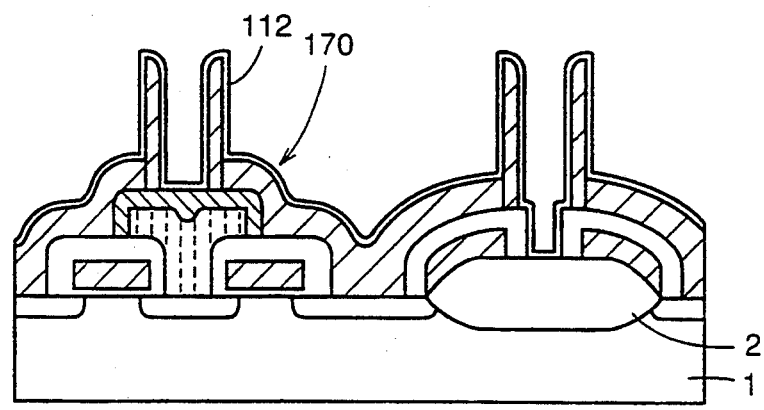

Referring to FIGS. 62 and 63, the resist 260 is removed, resulting in formation of the cylindrical storage node 170.

Figure 64:
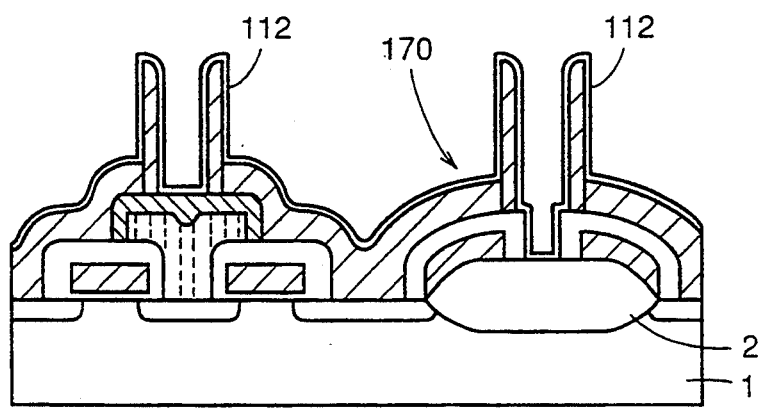
Figure 65:
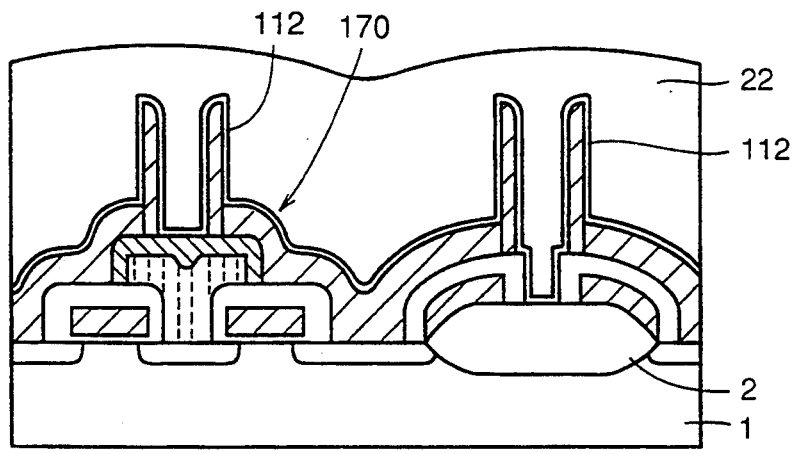
Figure 66:
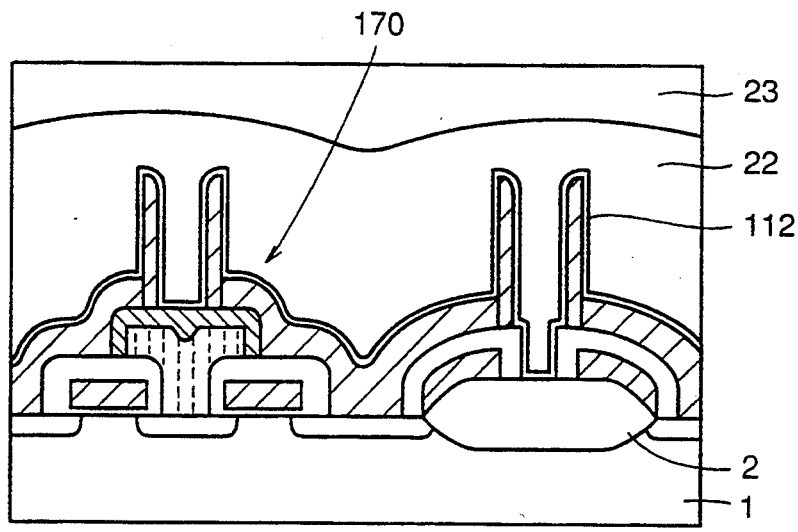

Referring to FIG. 64, the capacitor insulating film 112 covers the outer surface of the cylindrical storage node 170. Referring to FIG. 65, the cell plate 22 is formed over the silicon substrate 1 to cover the outer surface of the cylindrical storage node 170 with the capacitor insulating film 112 interposed therebetween. Referring to FIG. 66, the interlayer insulating film 23 is formed on the cell plate 22.

Figure 67:
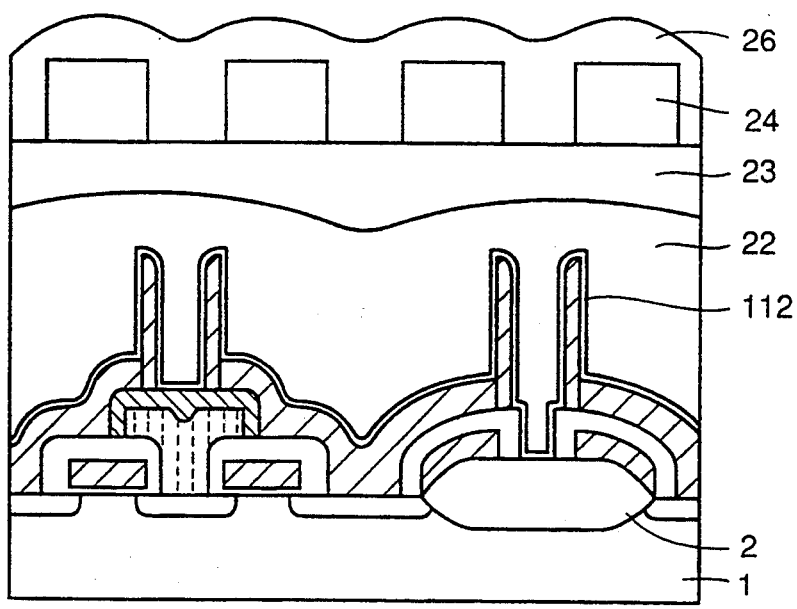

Referring to FIG. 67, the wiring layer 24 is formed on the interlayer insulating film 23, and thereafter the passivation film 26 is formed over the silicon substrate to cover the wiring layer 24. According to this embodiment, a semiconductor memory device having a cylindrical capacitor can be readily manufactured.

Embodiment 5

The aforementioned embodiments have shown a manufacturing process of a memory cell portion. In this embodiment, referring to FIG. 68, the manufacturing process according to the present invention will again be described, specifically concerning a boundary portion of peripheral circuitry (a sense refresh amplifier) and a memory cell array.

Figure 68:
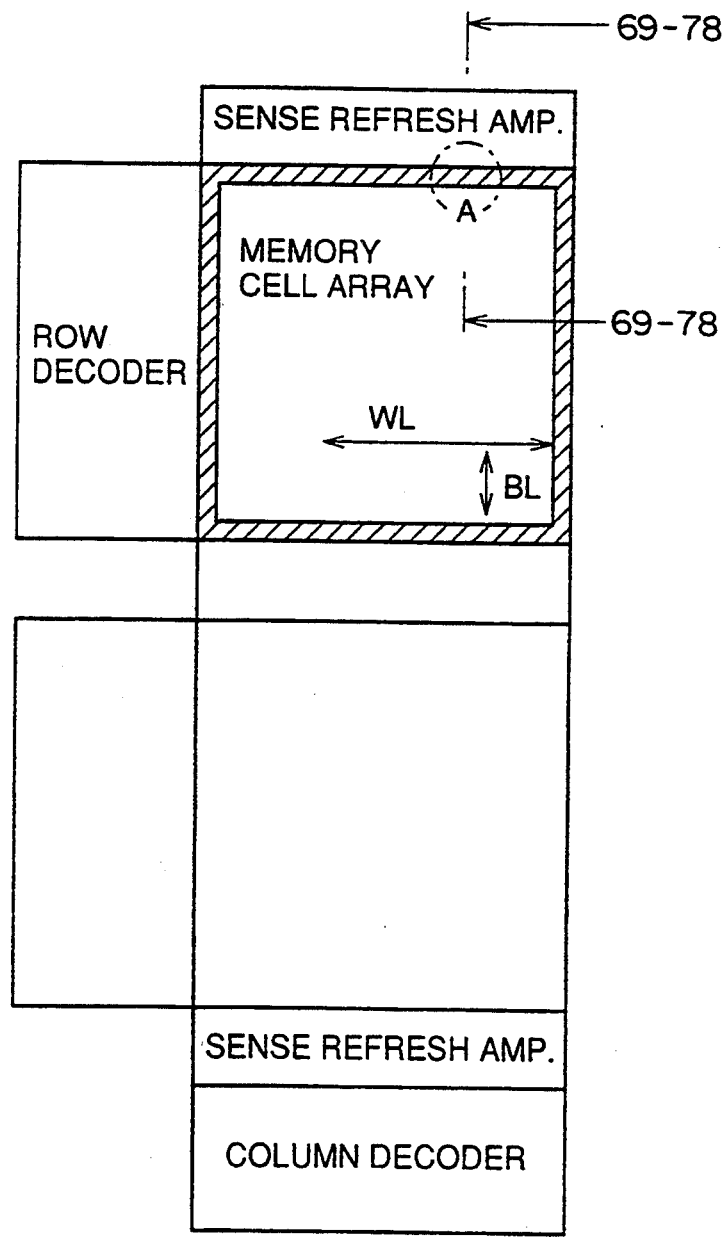
FIG. 68 is a schematic diagram for the explanation of a manufacturing method according to a fifth embodiment of the present invention.

The manufacturing process will hereinafter be described with a cross sectional view in the A portion of FIG. 68, taken along the line B—B.

Figure 69:
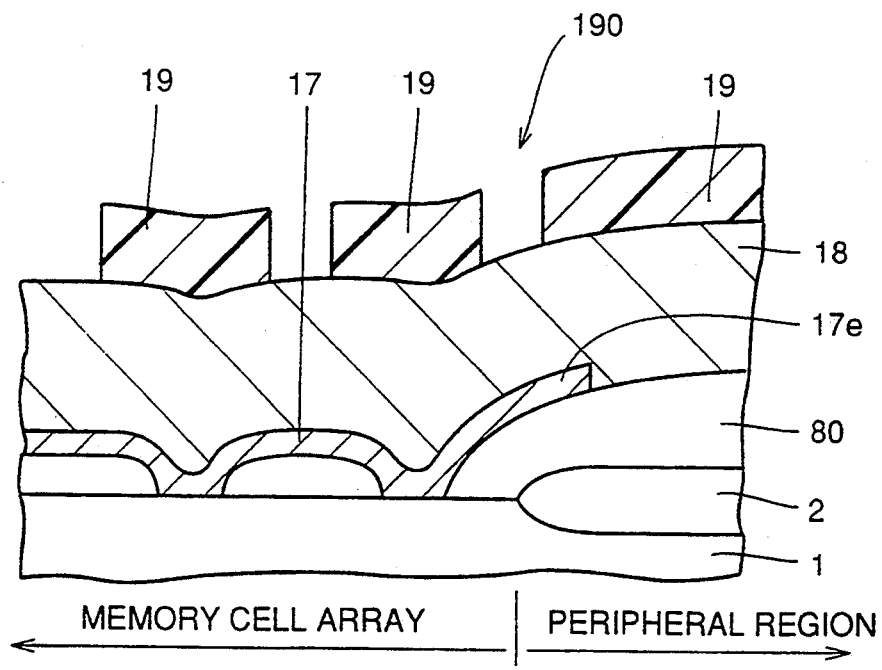
FIGS. 69 to 78 are cross sectional views of a peripheral circuitry portion in the first to tenth steps of the manufacturing method according to the fifth embodiment of the present invention.
Figure 70:
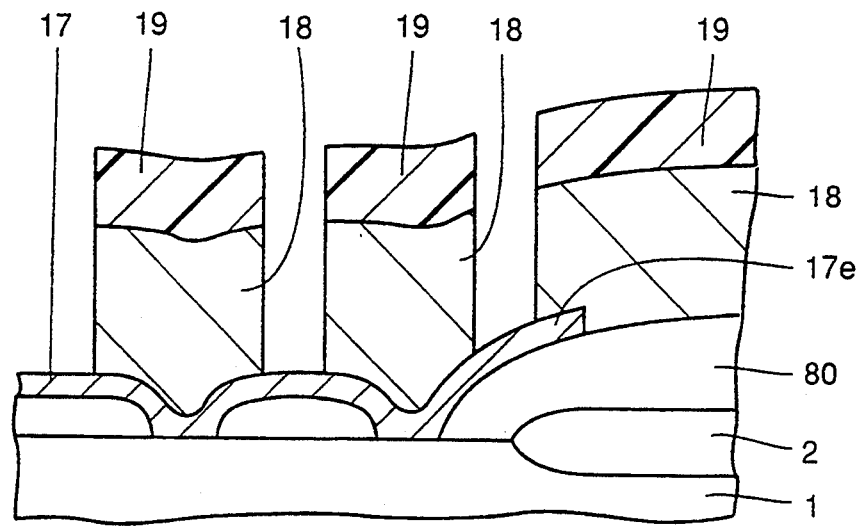
Figure 71:
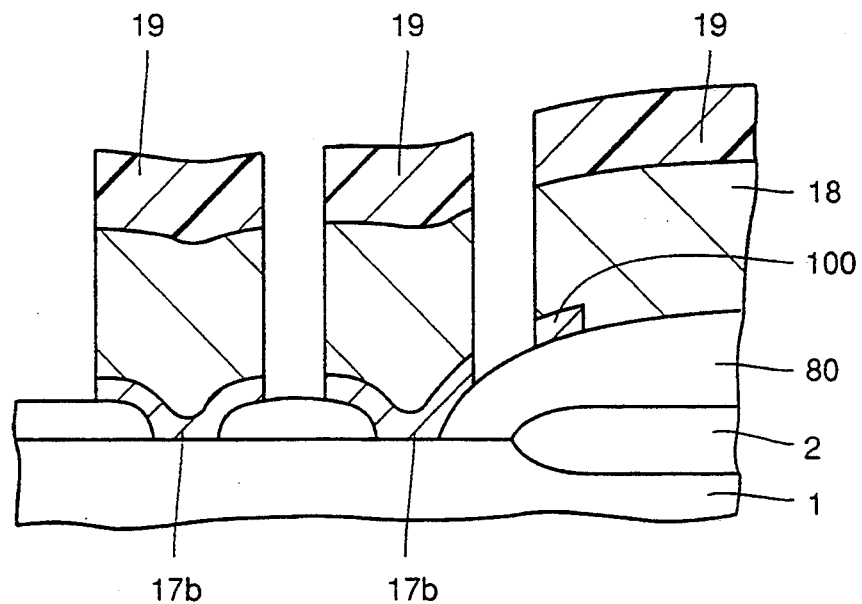
Figure 72:
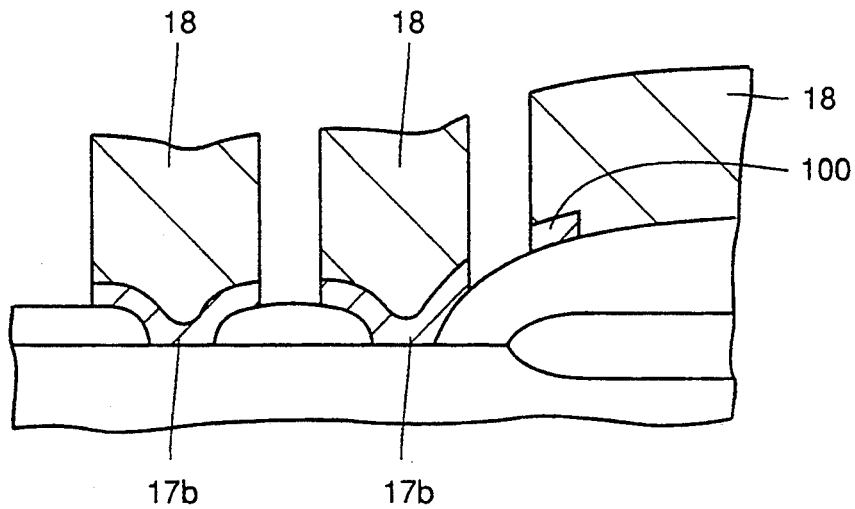
Figure 73:
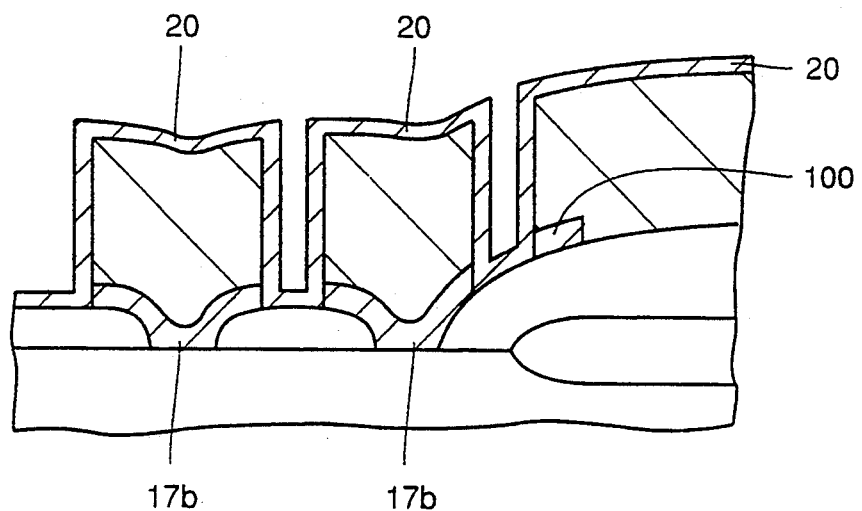
Figure 74:
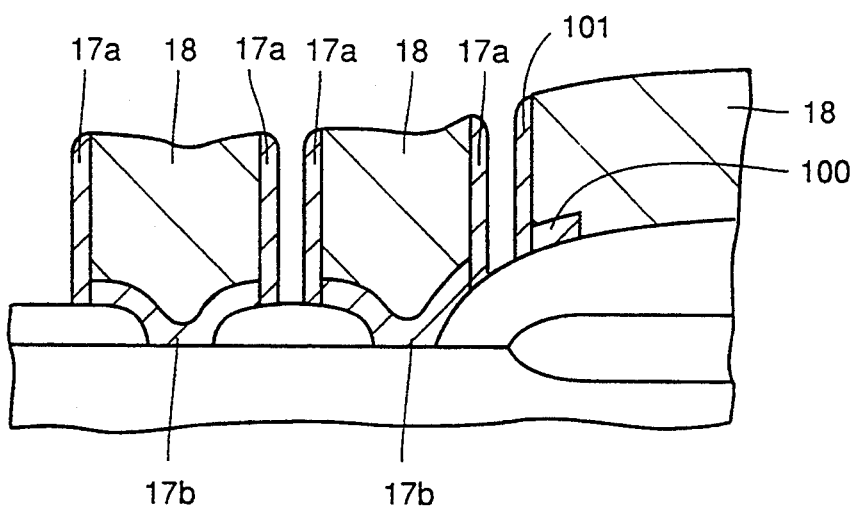
Figure 75A:
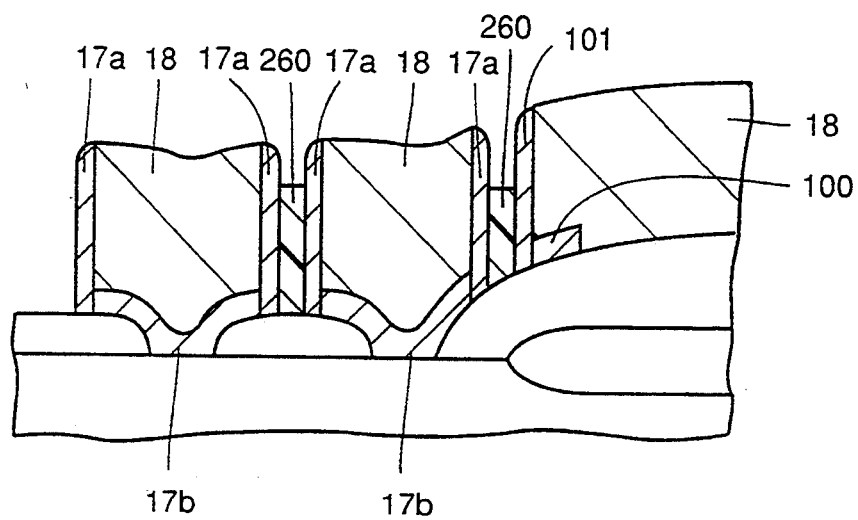
Figure 75B:
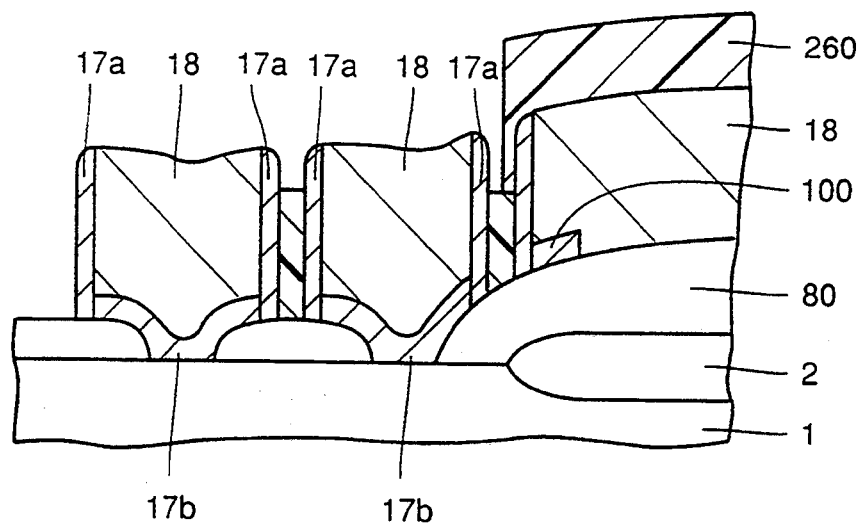
Figure 76:
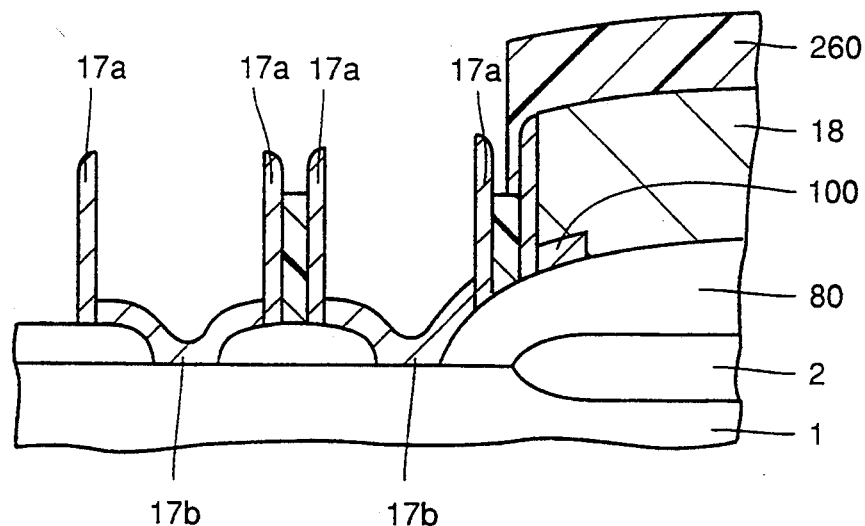
Figure 77:
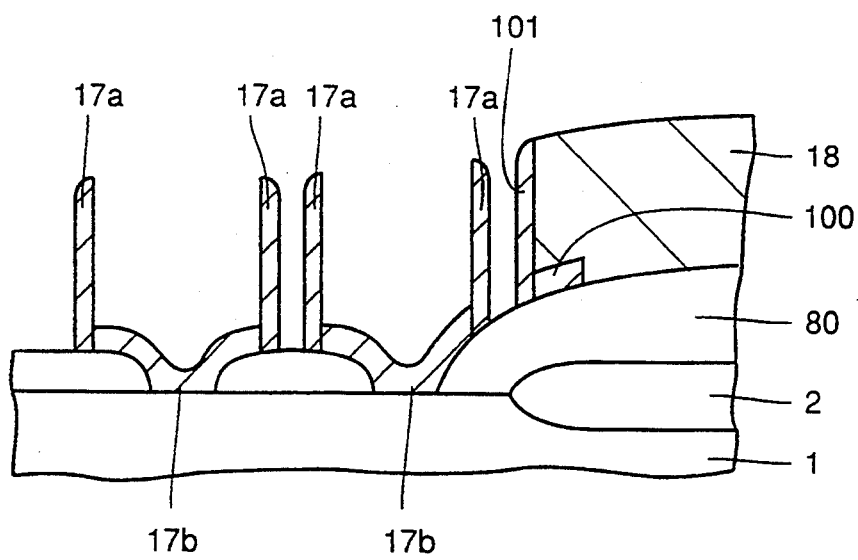

Steps shown in FIGS. 69 and 70 are carried out simultaneously with those shown in FIGS. 55 and 56, respectively. Steps shown in FIGS. 71 and 72 are carried out simultaneously with that shown in FIG. 57. Steps shown in FIGS. 73 and 74 are carried out simultaneously with FIGS. 58 and 59, respectively. A step shown in FIG. 75A is carried out simultaneously with FIG. 61. A step shown in FIG. 75B is the specific step in the present embodiment. A step shown in FIG. 76 is carried out simultaneously with that shown in FIG. 62, and FIG. 77 shows a step of removing a resist.

Referring to FIG. 69, the first conductor film 17 is formed to extend onto the isolating oxide film 2 isolating a memory cell from peripheral circuitry. The interlayer insulating film 18 is formed to cover the first conductor film 17. The resist pattern 19 is formed on the interlayer insulating film 18 so as to have a shape in which the resist exists on a bottom conductive portion of a cylindrical storage node to be formed and on an end 17e of the first conductor film 17 extending onto the field oxide film 2.

Referring to FIG. 70, the interlayer insulating film 18 is etched with the resist pattern 19 as a mask, where the first conductor film 17 serves as an etching stopper. The interlayer insulating film 18 and an insulating film 80 are both made of $SiO_2$. The end 17e of the first conductor film serves as an etching stopper for preventing the insulating film 80 from being etched.

Referring to FIGS. 70 and 71, the first conductor film 17 is selectively etched with the patterned interlayer insulating film 18 as a mask, thereby forming the bottom conductive portion 17b of the cylindrical storage node and a residue 100 of the first conductor film. Referring to FIGS. 71 and 72, the resist pattern 19 is removed.

Referring to FIGS. 72 and 73, the second conductor film 20 covers the whole outer surface of the interlayer insulating film 18 including the inner surface of the aperture portion 18a in the interlayer insulating film 18, in contact with an end of the bottom conductive portion 17b and the end of the residue 100.

Referring to FIGS. 73 and 74, the second conductor film 20 is etched back for exposure of the surface of the interlayer insulating film 18, whereby the sidewall conductive portion 17a of the cylindrical storage node is formed, and a residue 101 is also left. Referring to FIG. 75A, the resist 260 is buried in the aperture portion.

Referring to FIG. 75B, a resist 260 is further formed on the interlayer insulating film 18 fixing the residues 100, 101.

Referring to FIGS. 75B and 76, with the resist 260 as a mask, a portion of the interlayer insulating film 18 not covered with the resist 260 is removed. Without formation of the resist 260, when the interlayer insulating film 18 fixing the residues 100, 101 is removed by wet etching, the residues 100, 101 peel off to be dust. The dust causes a problem through reduction in the yield of the semiconductor memory device. Without the resist 260, the interlayer insulating film 80 and the field oxide film 2 located on the peripheral circuitry portion are also removed by wet etching, rendering the device inoperative. After the removal of the part of the interlayer insulating film 18, referring to FIG. 77, the resist 260 is removed.

Figure 78:
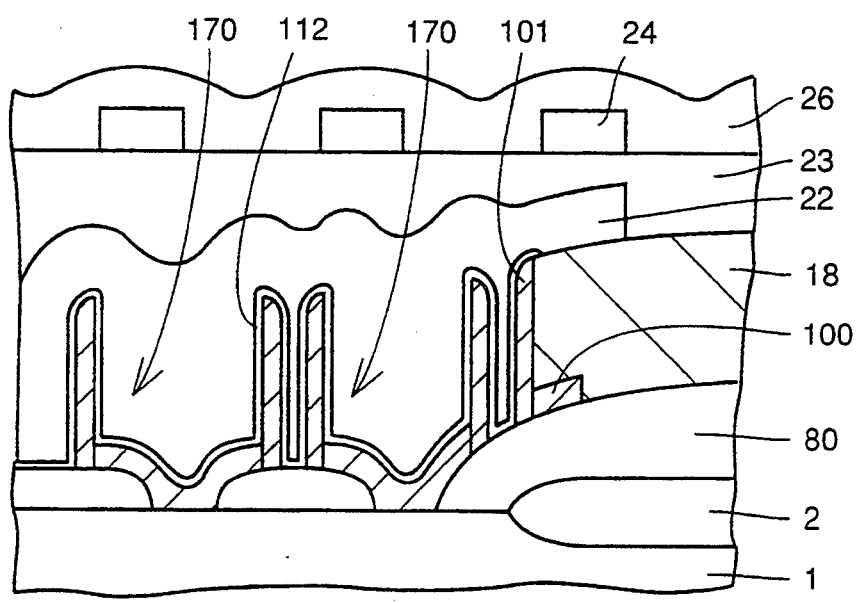
Figure 79:
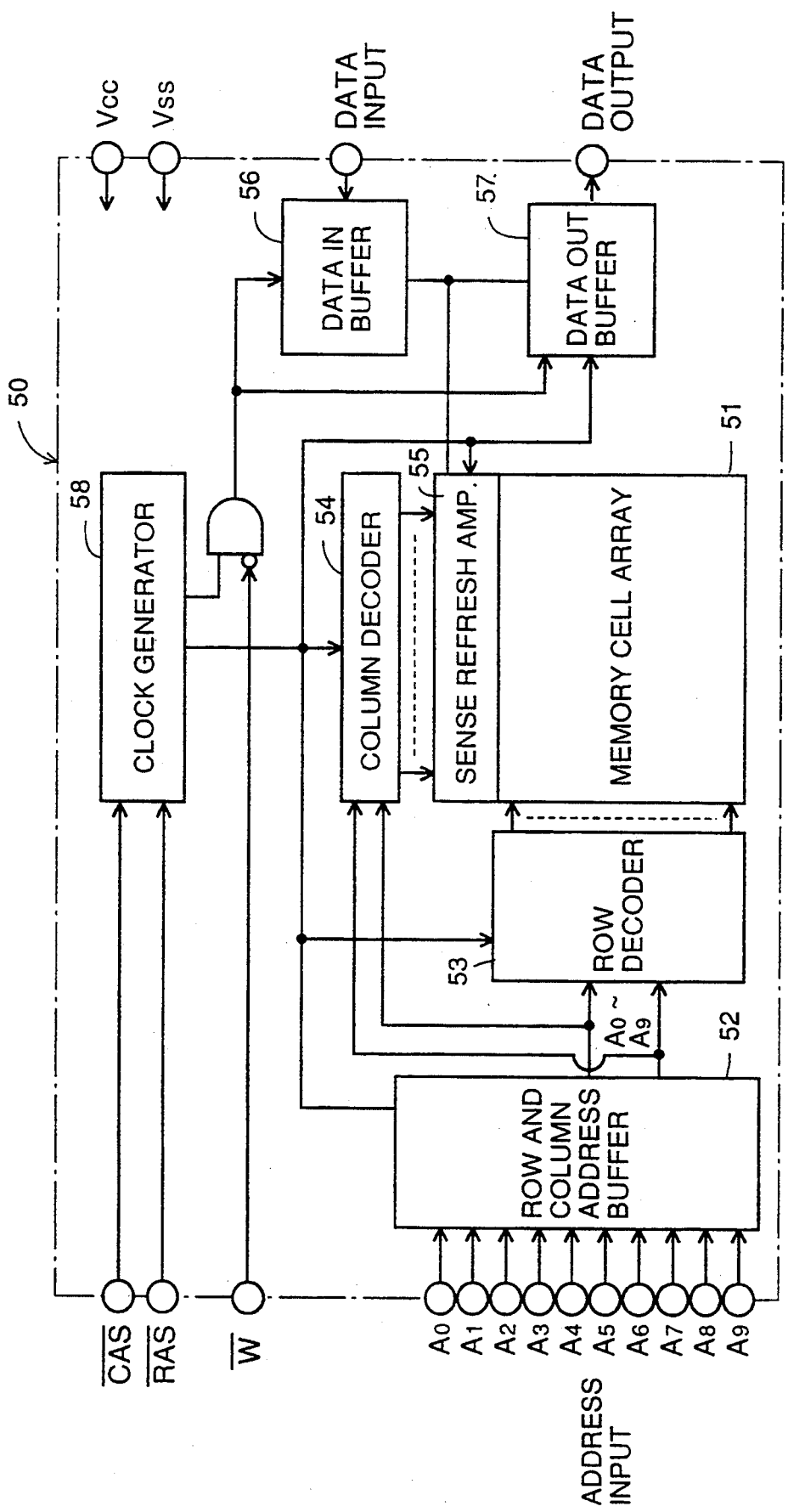
FIG. 79 is a block diagram of a conventional DRAM.
Figure 80:
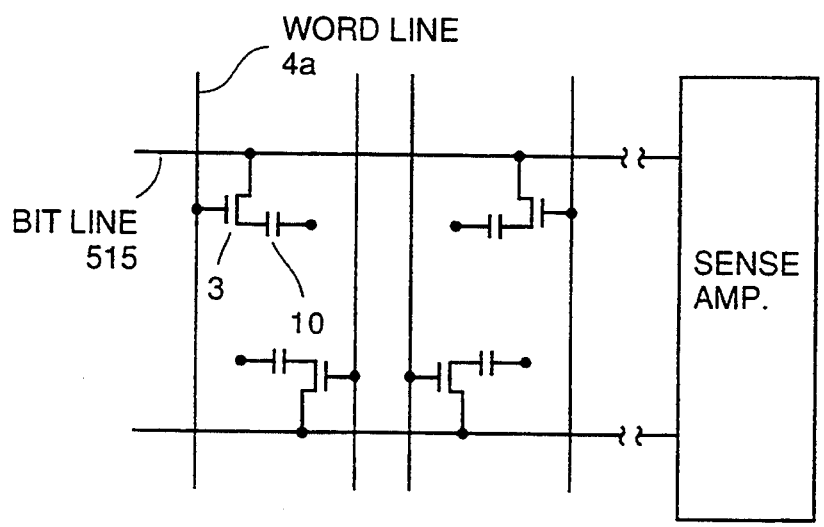
FIG. 80 is a schematic diagram of an equivalent circuit of a memory cell of a conventional DRAM.
Figure 81:
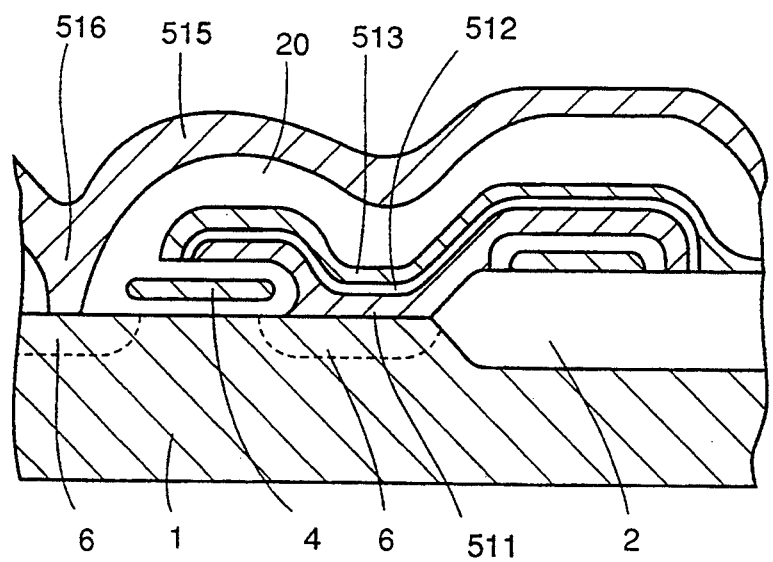
FIG. 81 is a cross sectional view of a memory cell including a stacked type capacitor, of a conventional DRAM.
Figure 82:
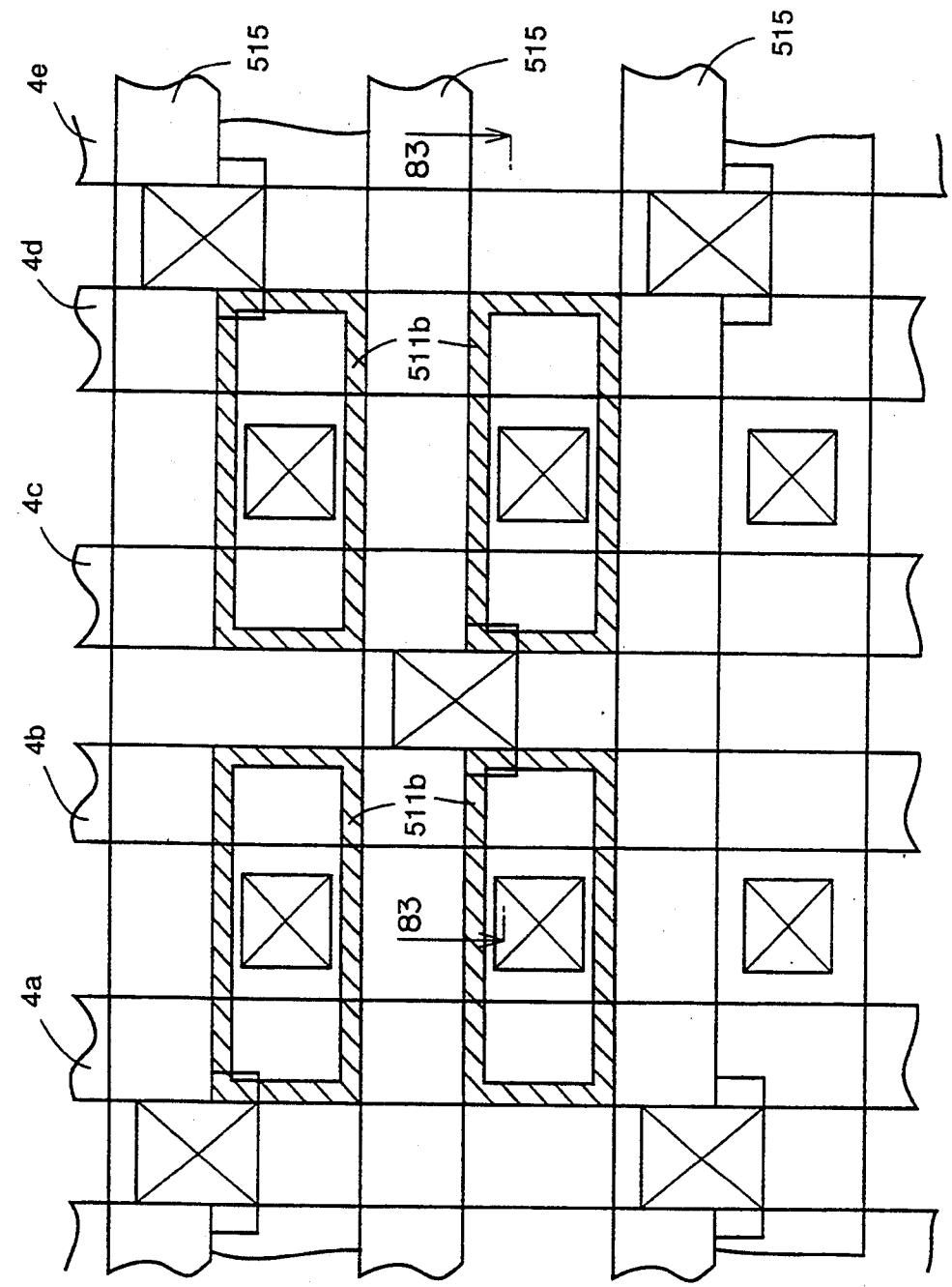
FIG. 82 is a plan view of a memory cell array of the related art to the present invention.
Figure 83:
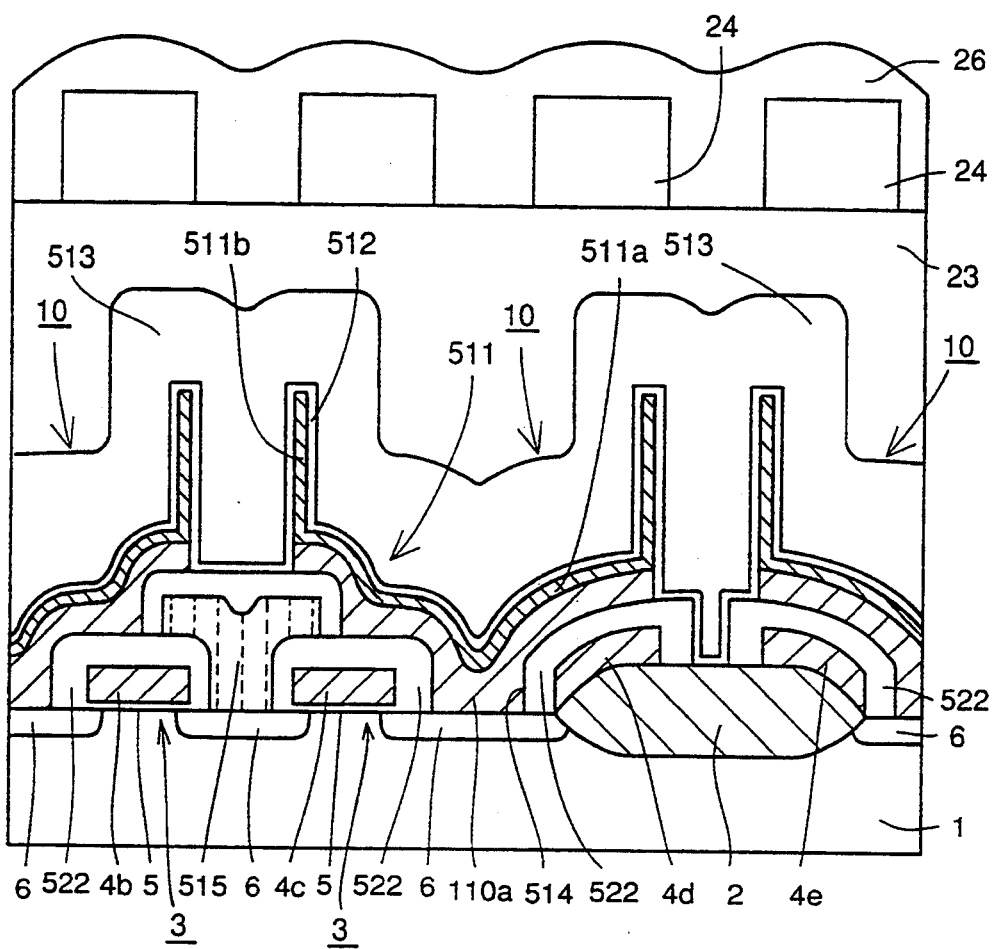
FIG. 83 is a cross sectional view taken along the line A—A in FIG. 44.
Figure 84:
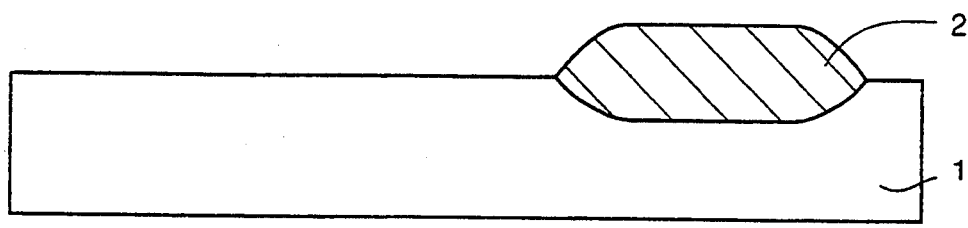
FIGS. 84 to 98 are cross sectional views showing the first to fifteenth steps of the manufacturing method of the memory cell shown in FIG. 83.
Figure 85:
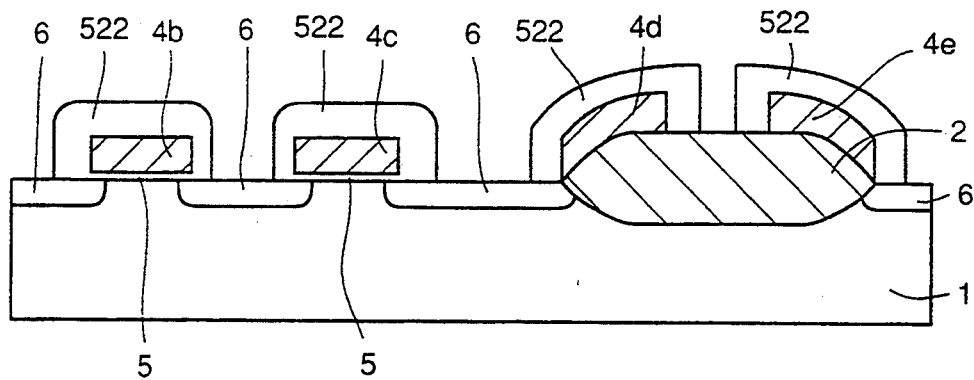
Figure 86:
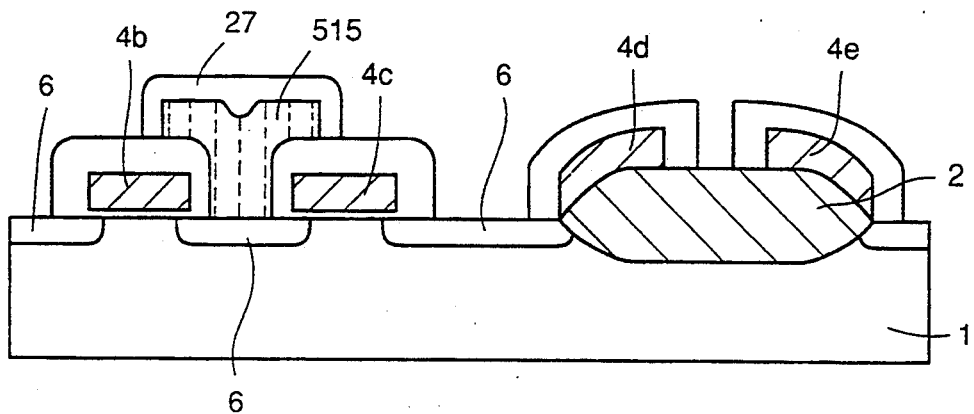
Figure 87:
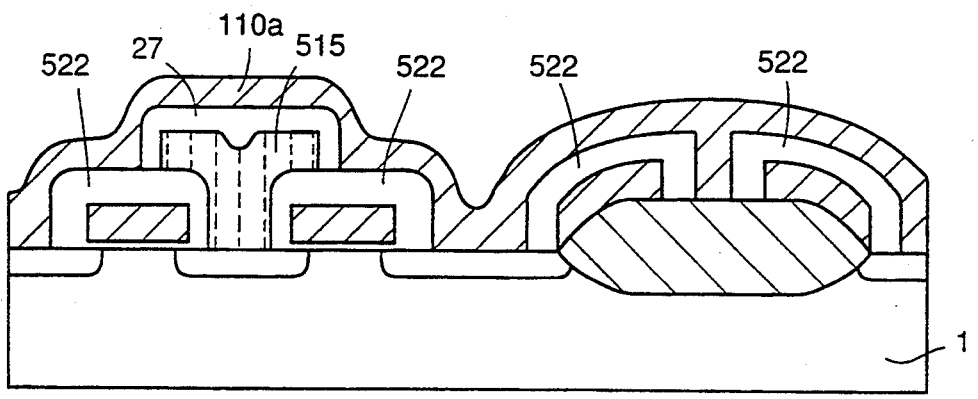
Figure 88:
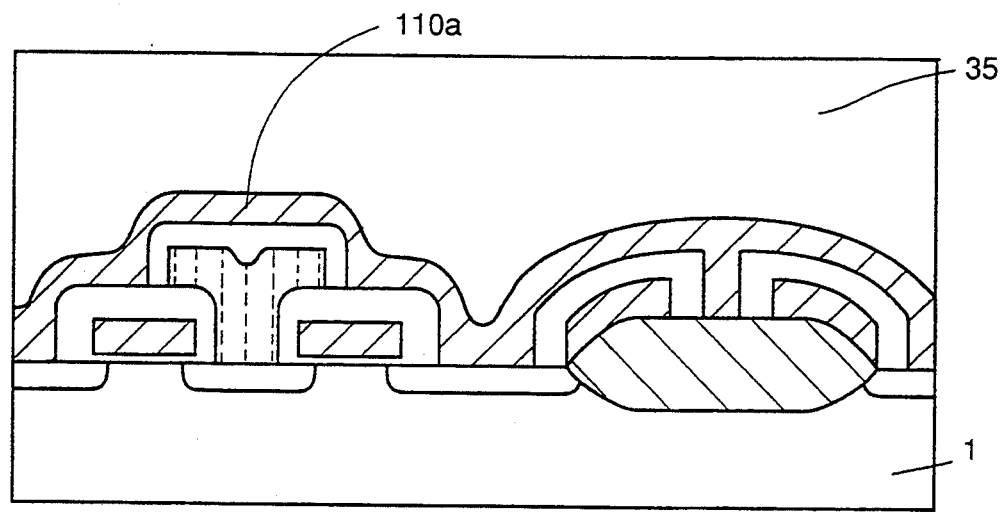

Referring to FIG. 78, the capacitor insulating film 112 covers the outer surface of the cylindrical storage node 170. Thereafter, the cell plate 22 is formed over the silicon substrate 1 to cover the outer surface of the cylindrical storage node 170, with the capacitor insulating film 112 interposed therebetween. The interlayer insulating film 23 is formed on the cell plate 22. The wiring layer 24 is formed on the interlayer insulating film 23. The passivation film 26 is formed over the silicon substrate 1 to cover the wiring layer 24.

Embodiment 6

Figure 101:
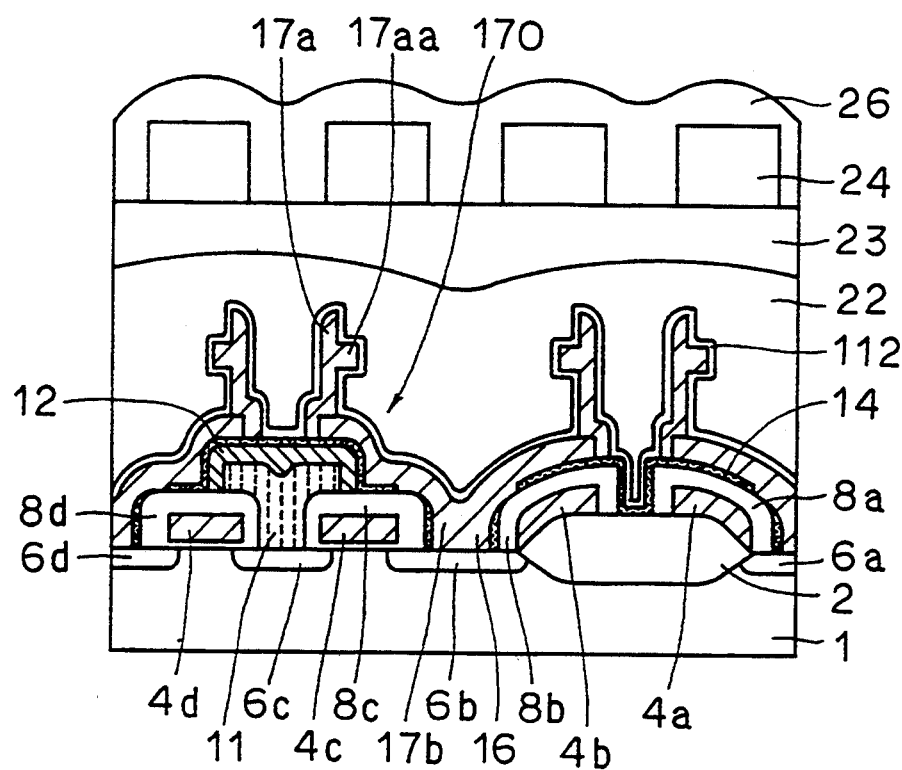
FIG. 101 is a cross sectional view of a semiconductor memory device in accordance with a sixth embodiment of the present invention.

FIG. 101 is a cross sectional view of a semiconductor memory device according to a still further embodiment of the present invention.

The semiconductor memory device includes a semiconductor substrate 1 having conductive layers 6a, 6b, 6c and 6d formed on its main surface. Word lines 4a, 4b, 4c and 4d and a bit line 11 are provided on the semiconductor substrate 1. Insulating films 12, 8a, 8b, 8c and 8d are formed over the semiconductor substrate 1 to cover the word lines 4a, 4b, 4c and 4d and the bit line 11. A barrier film 14 is selectively formed on a predetermined region of the insulating films 12, 8a, 8b, 8c and 8d for protecting these insulating films from etchant. A cylindrical storage node 170 is electrically connected to the conductive layer 6b. The cylindrical storage node includes a bottom conductive portion 17b provided in contact with the conductive layer 6b through a contact hole 16, and along the surface of the insulating films 8b, 8c and 12 with the barrier film 14 interposed therebetween, a sidewall conductive portion 17a provided along the periphery of the bottom conductive portion 17b, and extending upward, and a branch conductive portion 17aa provided on a sidewall surface of the sidewall conductive portion 17a, and extending horizontally. The semiconductor device further includes a capacitor insulating film 112 formed to cover the outer surface of the cylindrical storage node 170. A cell plate 22 is formed to cover the outer surface of the cylindrical storage node 170 with the capacitor insulating film 112 interposed therebetween. An interlayer insulating film 23 is provided on the cell plate 22. A wiring layer 24 is provided thereon. A passivation film 26 is formed over the semiconductor substrate 1 to cover the wiring layer 24.

According to the present embodiment, the capacitance of a capacitor is increased in propotion to the area of the outer surface of the branch conductive portion 17aa extending horizontally.

A manufacturing method of the semiconductor memory device shown in FIG. 101 will now be described.

FIGS. 102 to 128 are partial sectional views of the semiconductor device in respective steps of the manufacturing method of the semiconductor device shown in FIG. 101.

Figure 102:
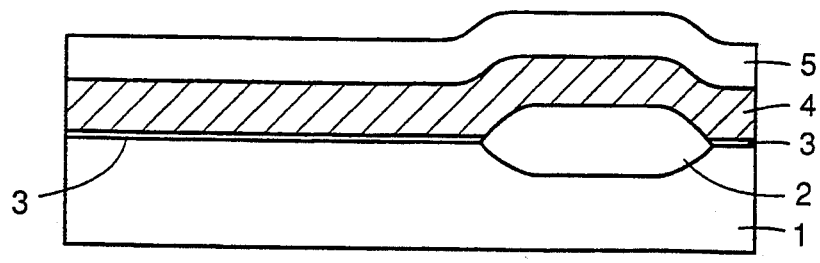
FIGS. 102 to 110 are cross sectional views of the semiconductor memory device in the first to ninth steps of the manufacturing method according to the sixth embodiment.

Referring to FIG. 102, a field oxide film 2 is formed on the main surface of the silicon substrate 1 by the LOCOS method. A gate oxide film 3 is formed on the surface of the silicon substrate 1. A word line film 4 and an interlayer insulating film 5 are sequentially formed on the gate oxide film 3.

Figure 103:
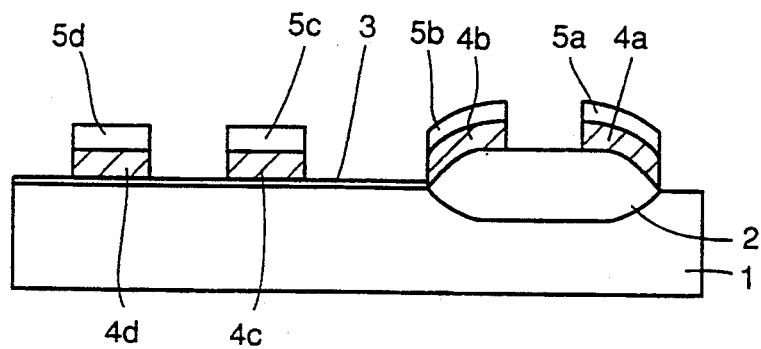

Referring to FIG. 103, a word line film 4 and the interlayer insulating film 5 are selectively etched using photolithography, to form the plurality of word lines 4a, 4b, 4c and 4d. At this time, interlayer insulating films 5a, 5b, 5c and 5d are left on the plurality of word lines 4a, 4b, 4c and 4d.

Figure 104:
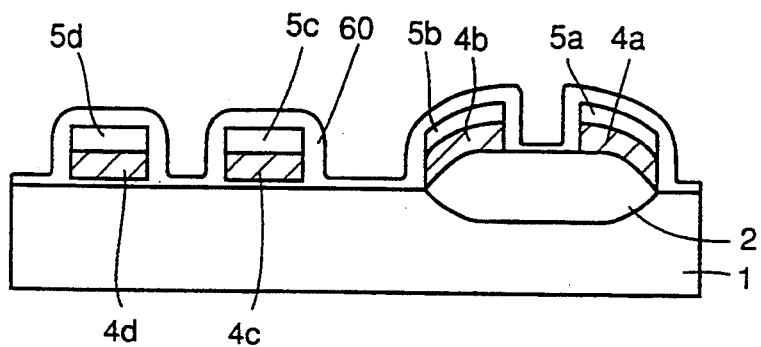

Referring to FIG. 104, an insulating film 60 is formed over the semiconductor substrate 1 to cover the word lines 4a, 4b, 4c and 4d.

Figure 105:
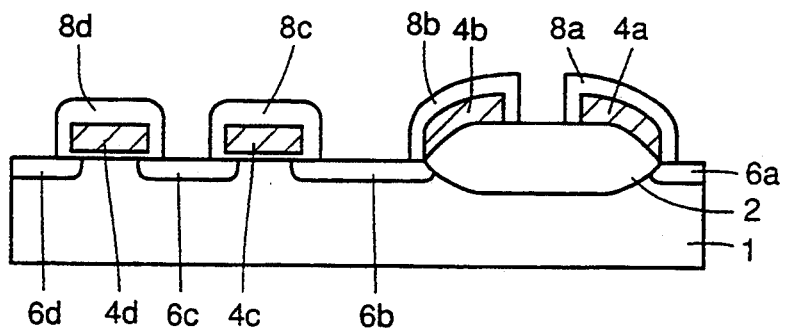

Referring to FIGS. 104 and 105, the insulating film 60 is etched using anisotropic etching, to form sidewall spacers on the sidewalls of the word lines 4a, 4b, 4c and 4d, so that the word lines 4a, 4b, 4c and 4d are covered with the first insulating films 8a, 8b, 8c and 8d, respectively. With the first insulating films 8a, 8b, 8c and 8d as masks, impurity ions are implanted into the main surface of the silicon substrate 1 to form the source-drain regions 6a, 6b, 6c and 6d in the main surface of the silicon substrate 1.

Figure 106:
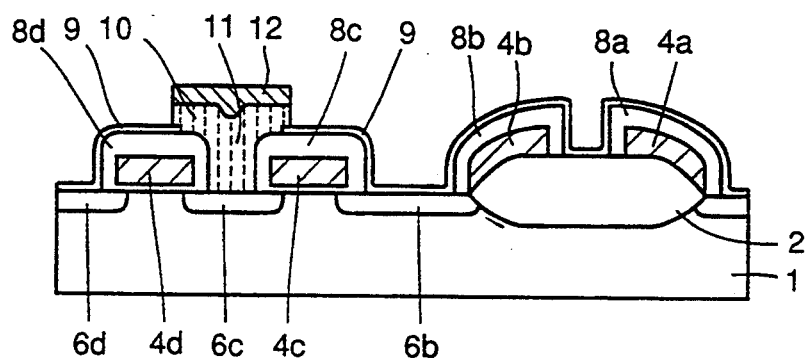

Referring to FIG. 106, an insulating film 9 is formed to cover the word lines 4a, 4b, 4c and 4d covered with the first insulating films 8a, 8b, 8c and 8d. The insulating film 9 is selectively etched to form a bit line contact hole 10. A bit line film and an insulating film (TEOS oxide film) are sequentially formed on the silicon substrate 1, in contact with the source-drain region 6c through the bit line contact hole 10.

The bit line film and the insulating film are selectively patterned to form the bit line 11. At this time, the insulting film 12 is left on the bit line 11.

Figure 107:
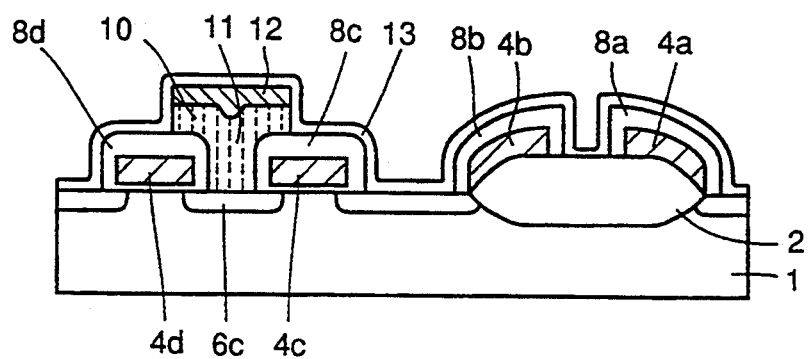

Referring to FIG. 107, an insulating film 13 is formed over the silicon substrate 1 to cover the bit line 11 including the insulating film 12.

Figure 108:
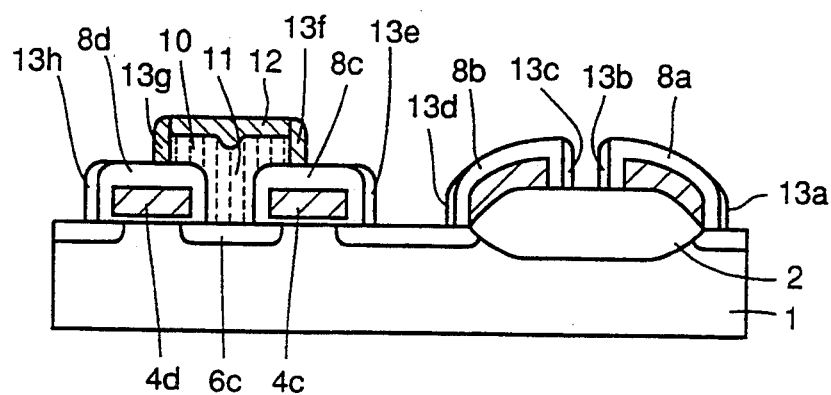

Referring to FIG. 108, sidewall spacers 13f and 13g are formed on the sidewalls of the bit line 11 by anisotropic etching of the insulating film 13. At this time, insulating films 13a, 13b, 13c, 13d, 13e, and 13h are left also on the sidewalls of the first insulating films 8a, 8b, 8c and 8d. In the following steps, for simplification of the drawings, the insulating films 13a and 13b, 13c and 13d, 13e, and 13h are shown integrated with the first insulating films 8a, 8b, 8c and 8d, respectively.

Similarly, for simplification of the drawings, the sidewall spacers 13f and 13g are also shown integrated with the insulating film 12.

Figure 109:
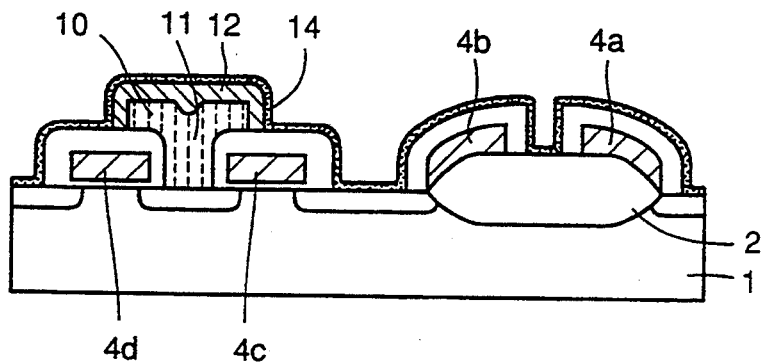

Referring to FIG. 109, the silicon nitride film 14 is deposited over the silicon substrate 1.

Figure 110:
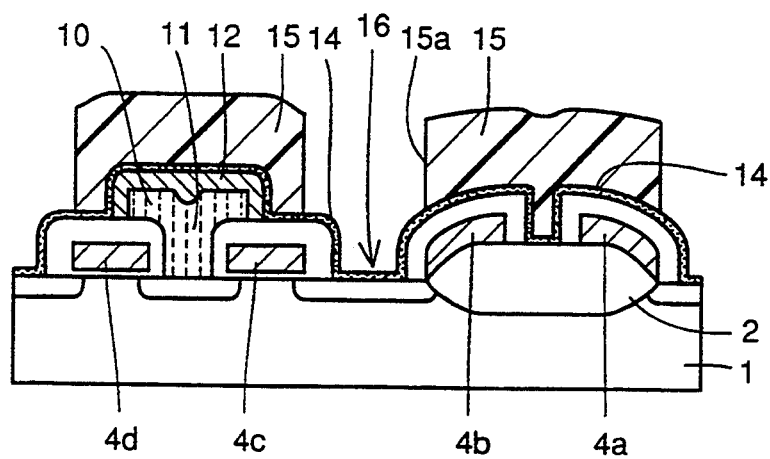
Figure 111:
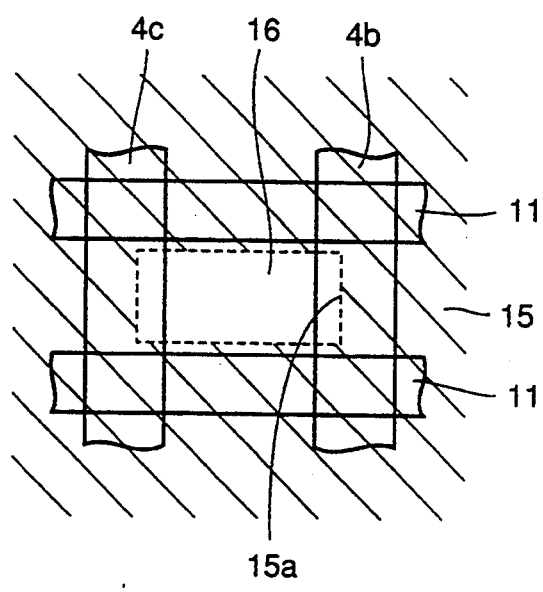
FIG. 111 is a plan view of the semiconductor memory device shown in FIG. 110.

Referring to FIGS. 110 and 111 (FIG. 111 is a plan view of the semiconductor memory device in FIG. 110), a resist pattern 15 is formed so as to have an aperture portion 15a on a portion where a storage node contact hole 16 is to be formed.

Figure 112:
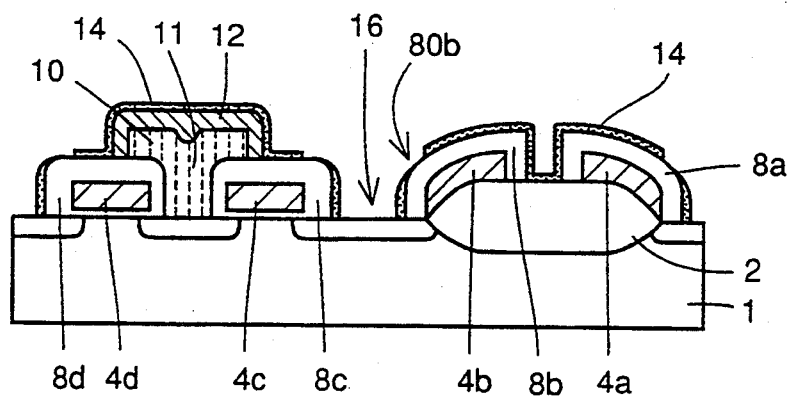
FIGS. 112 to 115 are cross sectional views of the semiconductor memory device in the tenth to the thirteenth steps of the manufacturing method according to the sixth embodiment.

Referring to FIGS. 110 and 112, with the resist pattern 15 as a mask, the silicon nitride film 14 is selectively etched so as to be left on the bit line 11 and the word lines 4a, 4b, 4c and 4d, while forming the storage node contact hole 16. At this time, a part of the surface of the first insulating films 8a, 8b, 8c and 8d is exposed.

Figure 113:
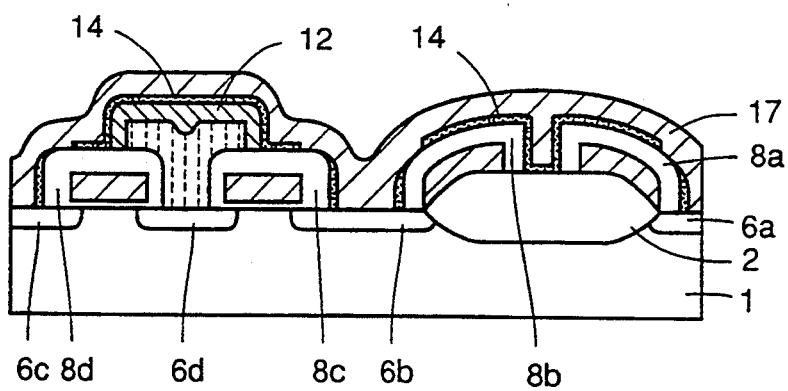

Referring to FIG. 113, a first conductor film 17 is formed over the silicon substrate 1 to be connected with the source-drain layer 6b, and to cover the first insulating films 8a, 8b, 8c and 8d and the second insulating film 12 selectively protected by the silicon nitride film 14.

Figure 114:
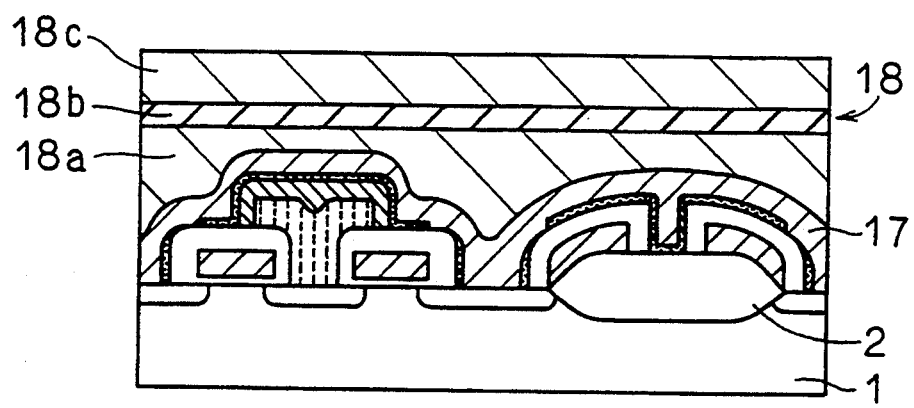

Referring to FIG. 114, a TEOS oxide films 18a is formed over the silicon substrate 1 to cover the first conductor film 17, using the CVD method. An SOG film 18b is deposited on the TEOS oxide film 18a by the spin coating method. A TEOS oxide film 18c is formed on the SOG film 18b. Etching rates of the TEOS oxide films 18a and 18c and the SOG film 18b to hydrofluoric acid are different. The TEOS oxide film 18a, the SOG film 18b and the TEOS oxide film 18c form an interlayer insulating film 18.

Figure 115:
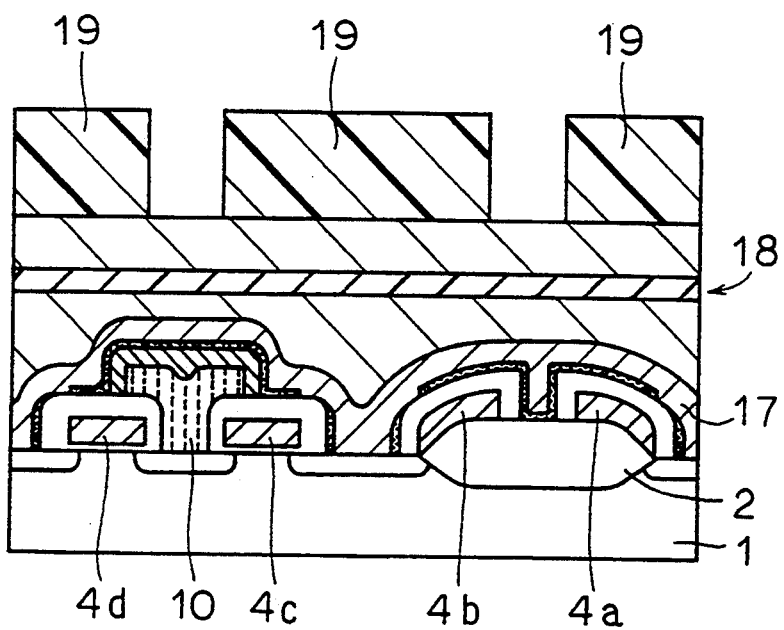
Figure 116:
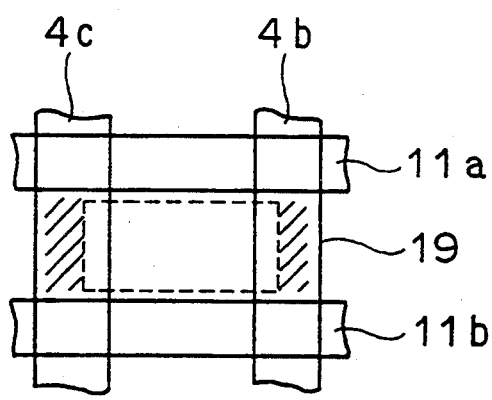
FIG. 116 is a plan view of the semiconductor memory device shown in FIG. 115.

Referring to FIGS. 115, 116 (a plan view of FIG. 115), and 117, the interlayer insulating film 18 is patterned by photolithography using a resist pattern 19, so as to be left only on a bottom conductive portion of a cylindrical storage node to be formed.

Figure 117:
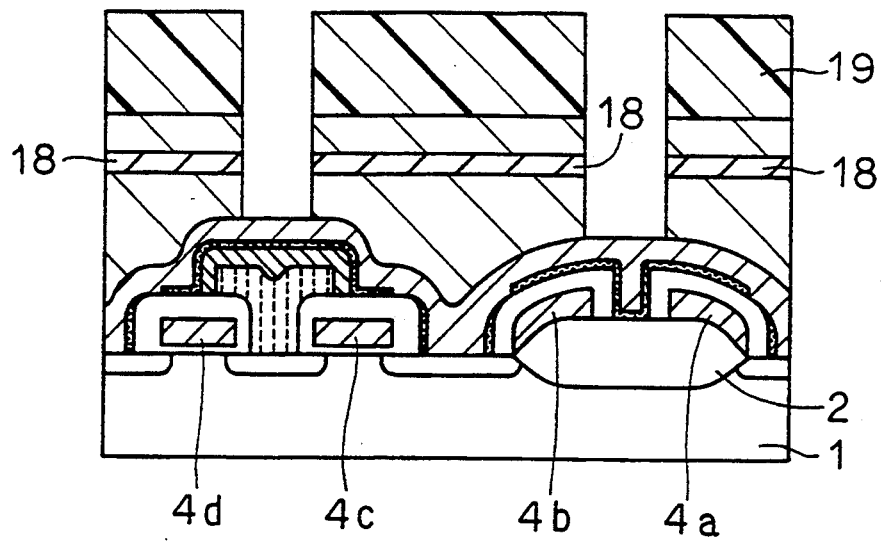
FIGS. 117 to 128 are cross sectional views of the semiconductor memory device in the fourteenth to twenty-fifth steps of the manufacturing method according to the sixth embodiment.
Figure 118:
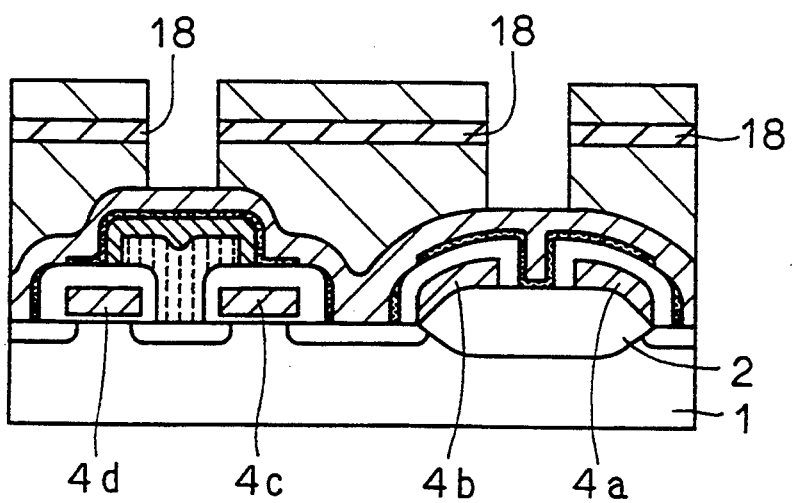

Referring to FIGS. 117 and 118, the resist 19 is removed.

Figure 119:
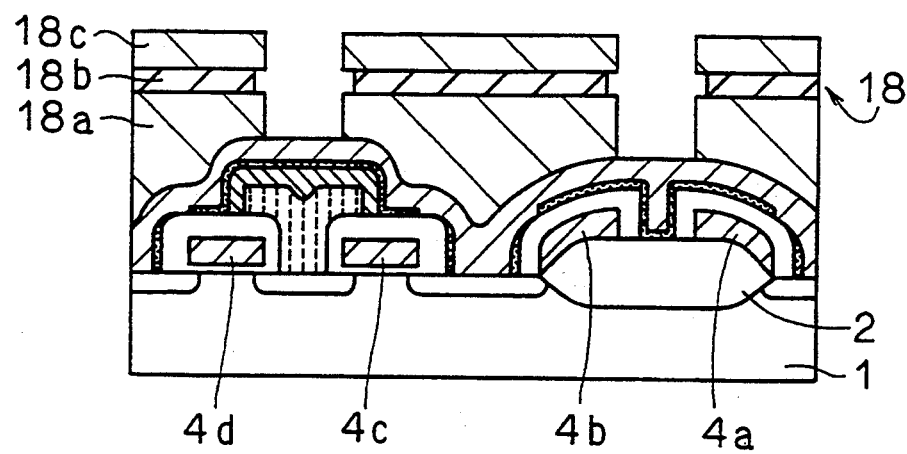

Referring to FIG. 119, the interlayer insulating film 18 is processed with hydrofluoric acid. Consequently, the SOG film 18b with high etching rate to hydrofluoric acid is etched transversely, resulting in a concave portion on a sidewall surface of the interlayer insulating film 18.

Figure 120:
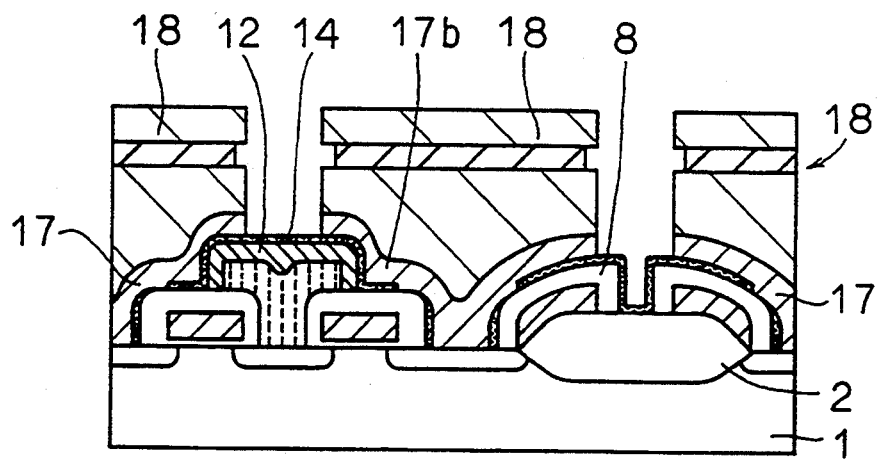

Referring to FIG. 120, with the patterned interlayer insulating film 18 as a mask, the first conductor film 17 is selectively etched to form the bottom conductive portion 17b. In this etching, the first insulating film 8 and the second insulating film 12 are prevented from being etched because of the silicon nitride film 14 covering the surcafe of these films.

Figure 121:
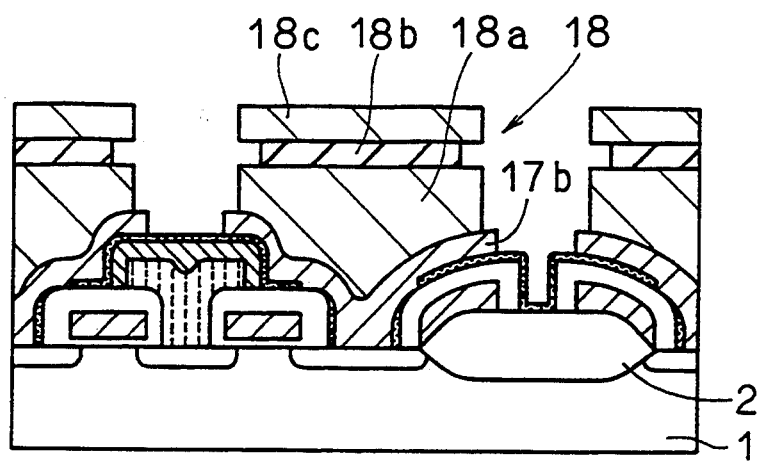

Referring to FIG. 121, the interlayer insulating film 18 is further etched with hydrofluoric acid. This further reduces an end of the SOG film 18b with high etching rate to hydrofluoric acid, as shown. In the etching, the TEOS films 18a and 18c are also etched by hydrofluoric acid, so that the sidewall surface of the interlayer insulating film 18 is reduced as a whole, whereby the upper surface of an end of the bottom conductive portion 17b is exposed.

Figure 122:
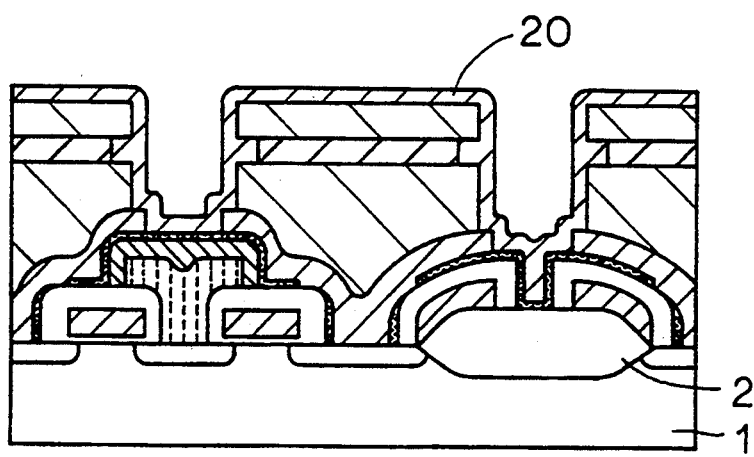

Referring to FIG. 122, the whole of the outer surface of the interlayer insulating film 18 having a concave portion on its sidewall is covered with a second conductor film 20, to be connected with the end of the bottom conductive portion 17b. The second conductor film 20 is formed of polysilicon.

Figure 123:
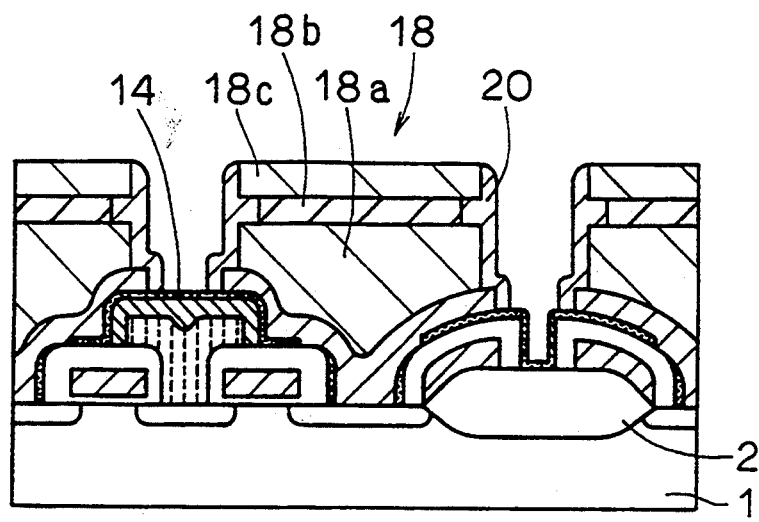

Referring to FIGS. 122 and 123, the second conductor film 20 is etched back until the surface of the interlayer insulating film 18 is exposed.

Figure 124:
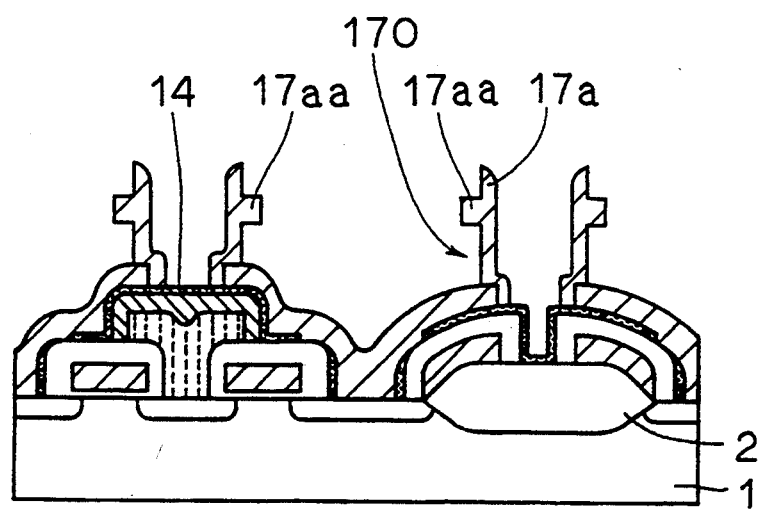

Referring to FIGS. 123 and 124, the TEOS films 18a and 18c and the SOG film 18b are removed by isotropic etching. At this time, the silicon nitride film 14 prevents the insulating film exiting under the silicon nitride film 14 from being etched. The removal of the interlayer insulating film 18 result in formation of the sidewall conductive portion 17a of the cylindrical storage node 170 having the branch conductive portion 17aa extending horizontally.

Figure 125:
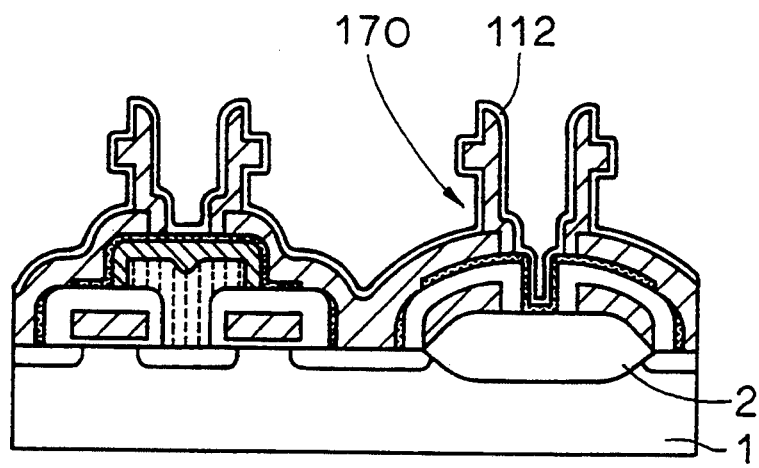

Referring to FIG. 125, the outer surface of the cylindrical storage node 170 is covered with the capacitor insulating film 112.

Figure 126:
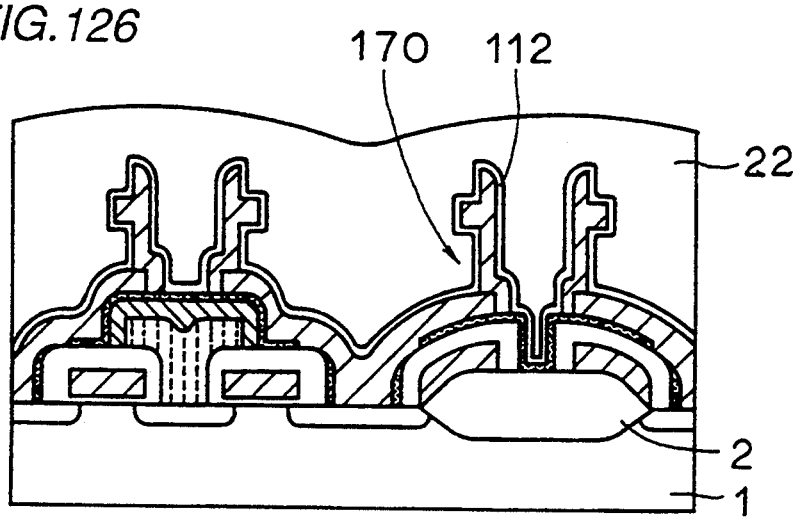

Referring to FIG. 126, the cell plate 22 is formed over the silicon substrate 1 to cover the outer surface of the cylindrical storage node 170 with the capacitor insulating film 112 interposed therebetween.

Figure 127:
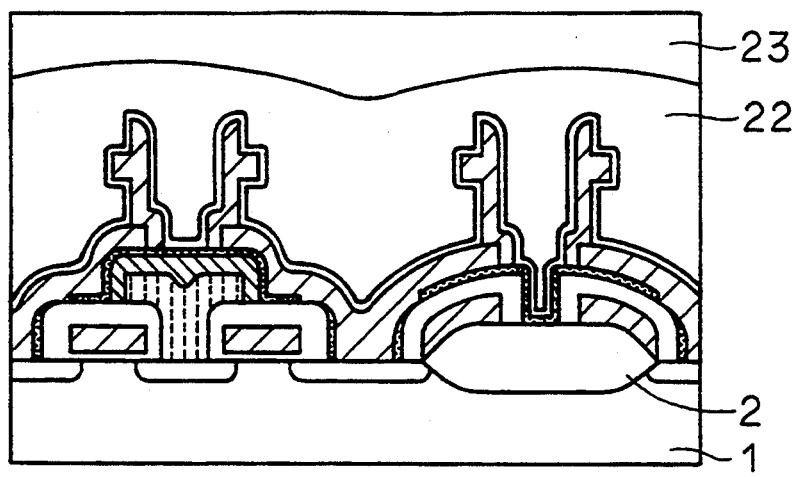

Referring to FIG. 127, an interlayer insulating film 23 is formed on the cell plate 22.

Figure 128:
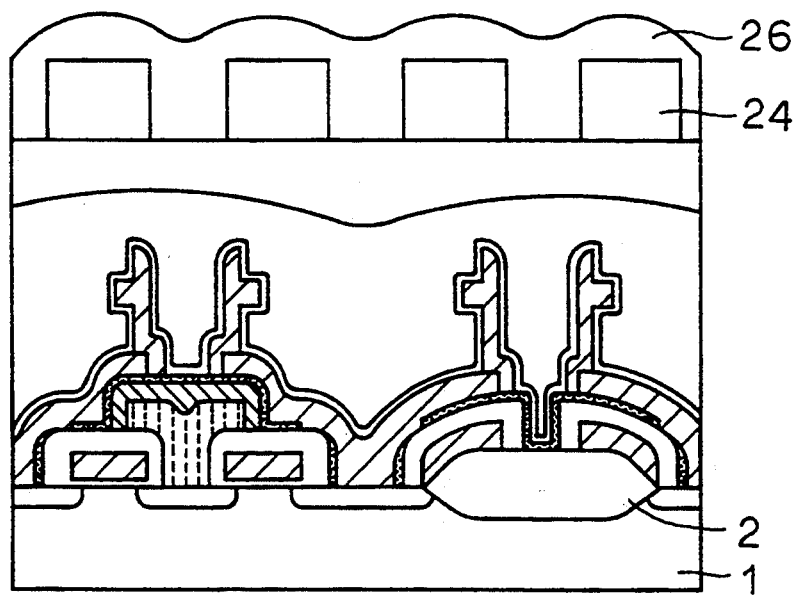

Referring to FIG. 128, the wiring layer 24 is formed thereon. The passivation film 26 is formed over the silicon substrate 1 to cover the wiring layer 24.

Through the above steps, a semiconductor memory device having a cylindrical capacitor capable of sufficiently securing a capacitance of a capacitor with a less occupied area can be obtained.

Embodiment 7

Figure 129:
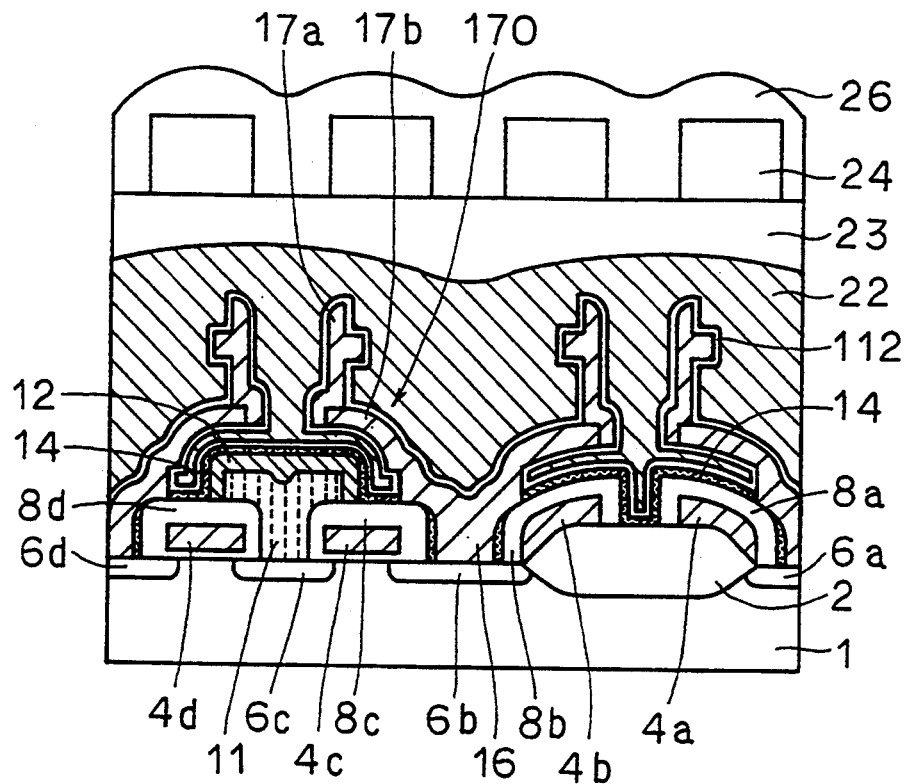
FIG. 129 is a cross sectional view of a semiconductor memory device in accordance with a seventh embodiment of the present invention.

FIG. 129 is a cross sectional view of a semiconductor memory device in accordance with a seventh embodiment of the present invention.

Referring to FIG. 129, the semiconductor device includes a semiconductor substrate 1 having conductive layers 6a, 6b, 6c and 6d formed on its main surface. Word lines 4a, 4b, 4c and 4d and a bit line 11 are formed on the semiconductor substrate 1. Insulating films 12, 8a, 8b, 8c and 8d are provided over the semiconductor substrate 1 to cover the word lines 4a, 4b, 4c and 4d and the bit line 11. A barrier film 14 is selectively provided on a predetermined region of the insulating films 12, 8a, 8b, 8c and 8d for protecting these insulating films from etchant. A cylindrical storage node 170 is electrically connected to the conductive layer 6b. The cylindrical storage node 170 includes a bottom conductive portion 17b in contact with the conductive layer 6b through a contact hole 16, and extending along the surface of the insulating films (8a, 8b, 8c and 8d) with its lower surface spaced from the surface of the barrier film 14 by a predetermined distance, a sidewall conductive portion 17a provided along the periphery of the bottom conductive portion 17b and extending upwards, and a branch conductive portion 17aa provided on a sidewall surface of the sidewall conductive portion 17a, and extending horizontally. The semiconductor device further includes a capacitor insulating film 112 provided to cover the outer surface of the storage node 170 including the lower surface of the bottom conductive portion 17b. A cell plate 22 is provided to cover the outer surface of the cylindrical storage node 170, with the capacitor insulating film 112 interposed therebetween. An interlayer insulating film 23 is provided on the cell plate 22. A wiring layer 24 is formed thereon. A passivation film 26 is formed over the semiconductor substrate 1 to cover the wiring layer 24.

According to the present embodiment, the capacitance of a capacitor is increased, since the lower surface of the bottom conductive portion 17b also contributes to the capacitance.

Figure 130:
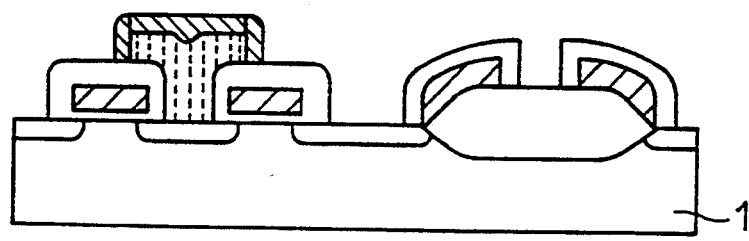
FIGS. 130 to 146 are cross sectional views of the semiconductor device in the first to seventeenth steps of the manufacturing method according to the seventh embodiment.

FIGS. 130 to 146 are partial cross sectional views of the semiconductor device in respective steps of the manufacturing method of the semiconductor memory device shown in FIG. 129. The same steps as those of embodiment 6 are carried out for forming the semiconductor device shown in FIG. 130.

Figure 131:
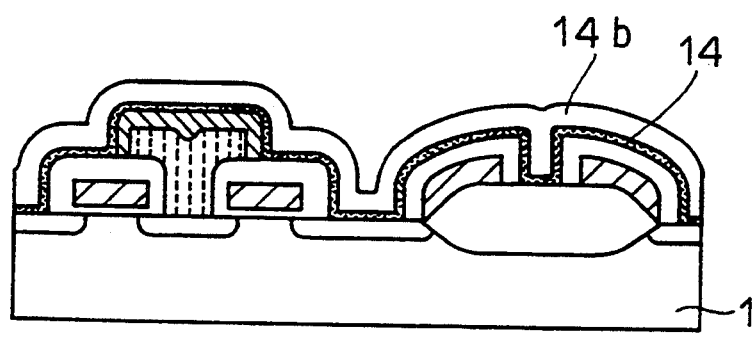

Referring to FIG. 131, the silicon nitride film 14 is formed over the silicon substrate 1. A TEOS oxide film 14b, an insulating film soluble to hydrofluoric acid, is deposited thereon.

Figure 132:
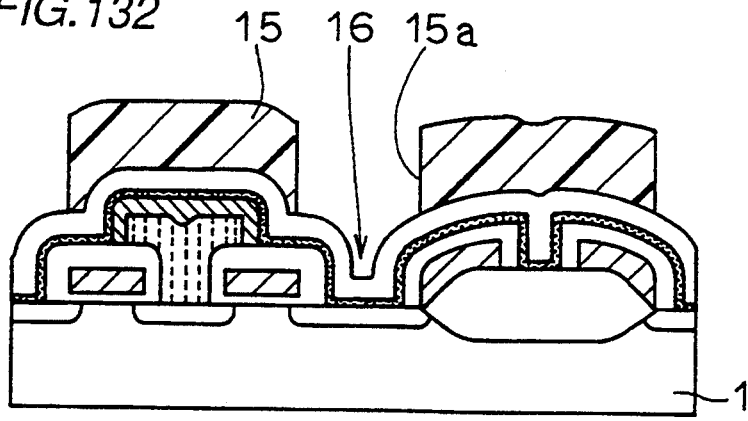

Referring to FIG. 132, a resist pattern 15 having an aperture portion 15a is formed on a portion where a storage node contact hole 16 is to be formed.

Figure 133:
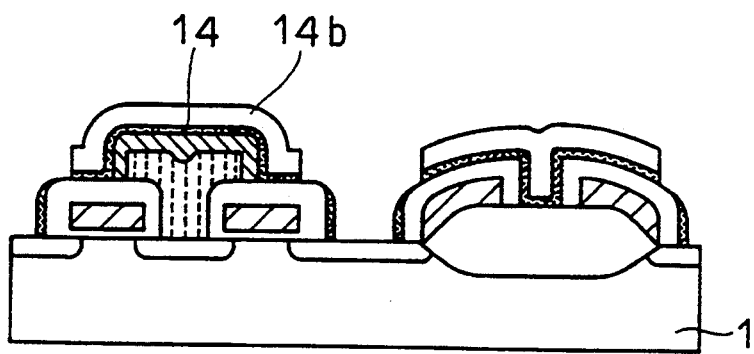

Referring to FIGS. 132 and 133, the silicon nitride film 14 and the TEOS oxide film 14b are selectively etched with the resist pattern 15 as a mask.

Figure 134:
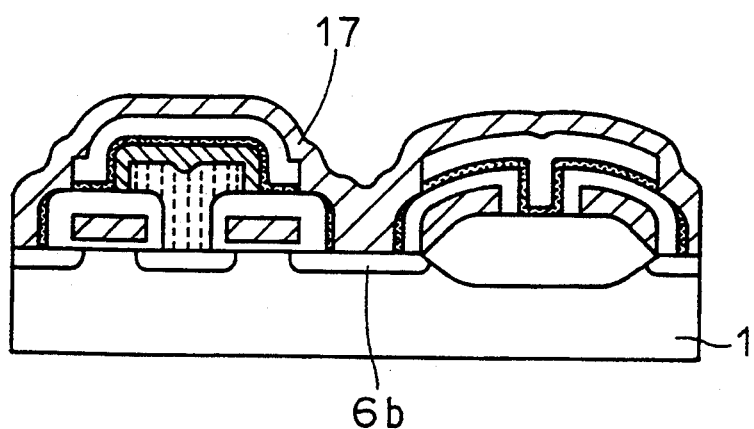
Figure 135:
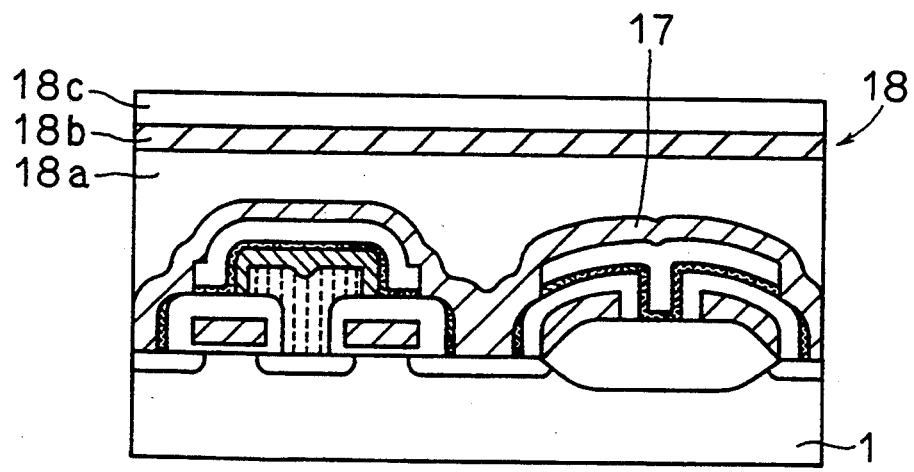

Referring to FIG. 134, a first conductor film 17 is formed over the silicon substrate 1, so as to contact with the source-drain layer 6b.

An interlayer insulating film 18 is formed on the first conductor film 17, where a TEOS oxide film 18a to constitute a lower layer of the interlayer insulating film 18, an SOG film 18b whose etching rate to hydrofluoric acid is higher than that of the TEOS oxide film 18a, and a TEOS oxide film 18c are sequentially built up in a layer.

Figure 136:
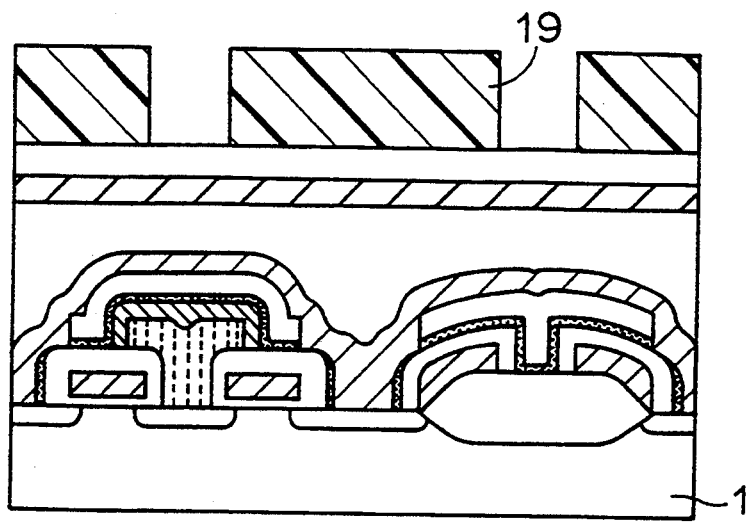
Figure 137:
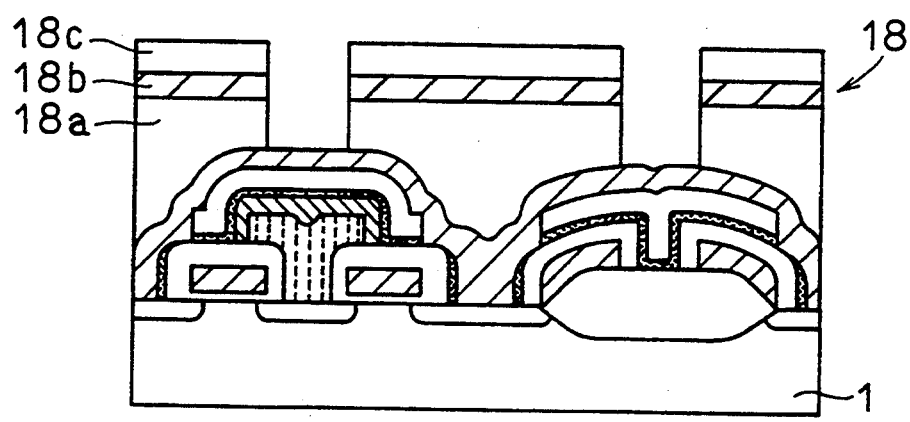

Referring to FIGS. 136 and 137, the interlayer insulating film 18 is patterned by photolithography with a resist pattern 19, so as to be left only on a bottom conductive portion of a cylindrical storage node to be formed.

Referring to FIGS. 136 and 137, thereafter, the resist 19 is removed.

Figure 138:
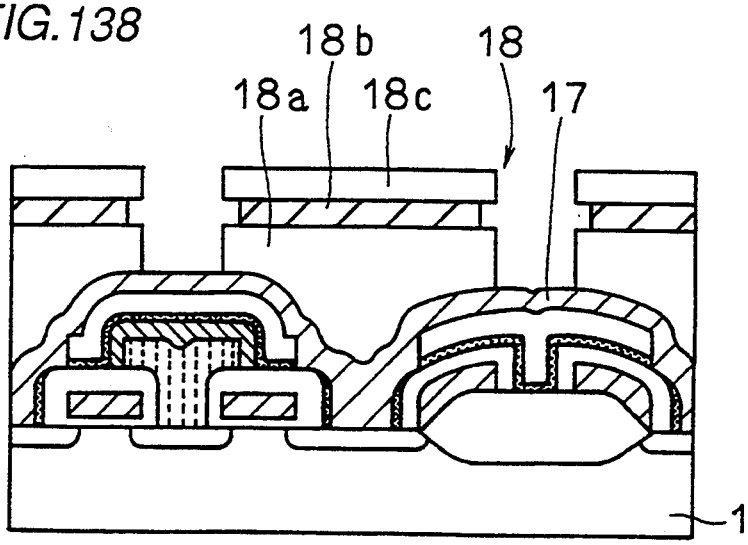

Referring to FIGS. 137 and 138, the interlayer insulating film 18 is processed with hydrofluoric acid to reduce an end of the SOG film 18b with high etching rate to hydrofluoric acid.

Figure 139:
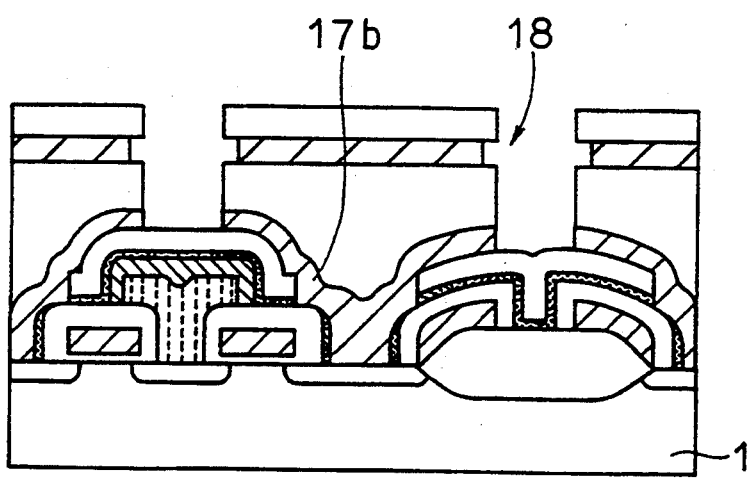

Referring to FIG. 139, with the patterned interlayer insulating film 18 as a mask, the first conductor film 17 is selectively etched to form the bottom conductive portion 17b.

Figure 140:
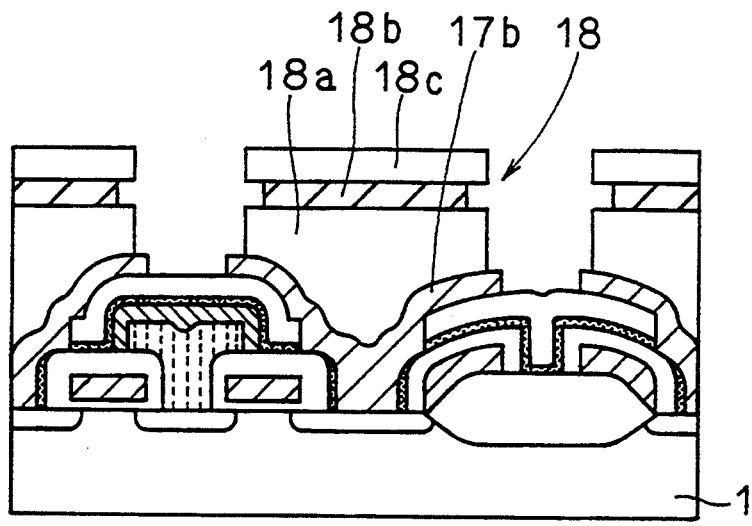

Referring to FIG. 140, the interlayer insulating film 18 is further processed with hydrofluoric acid to further reduce the end of the SOG film 18b with high etching rate to hydrofluoric acid. At this time, the TEOS films 18a and 18c are also etched by hydrofluoric acid, so that the upper surface of an end of the bottom conductive portion 17b is exposed.

Figure 141:
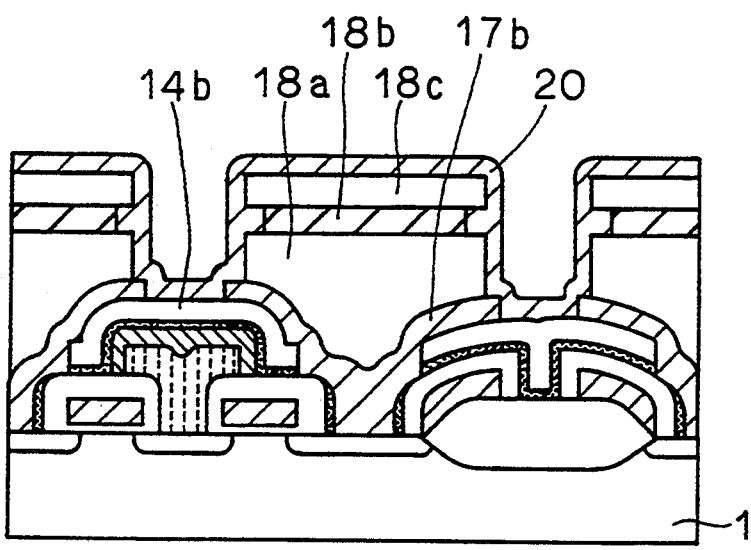

Referring to FIG. 141, the whole of the outer surface of the insulating films (14b, 18a, 18b, 18c) is covered with a second conductor film 20, so as to connect to the end of the bottom conductive portion 17b. The second conductor film 20 is formed of polysilicon.

Figure 142:
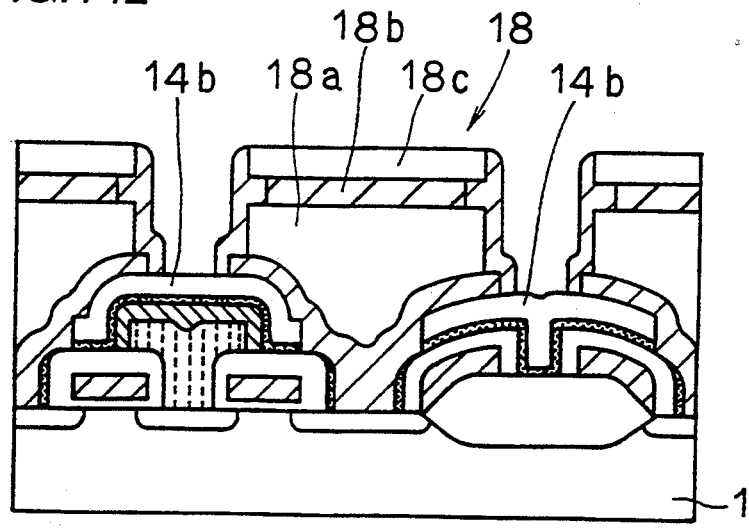

Referring to FIGS. 141 and 142, the second conductor film 20 is etched back until the surface of the TEOS oxide film 18c is exposed.

Figure 143:
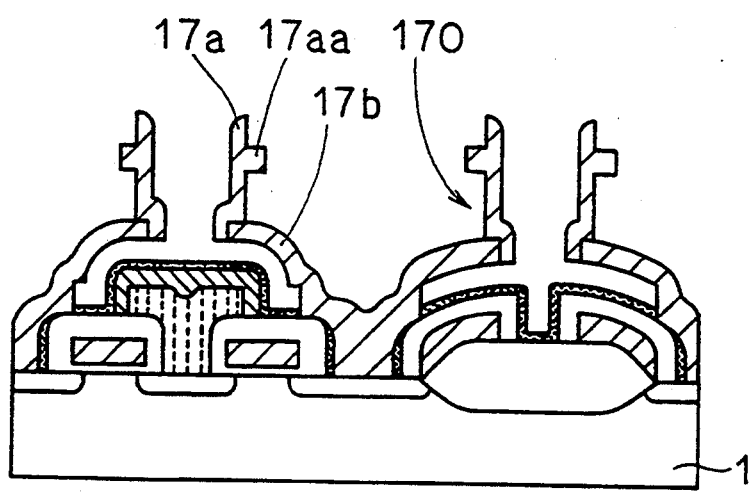

Referring to FIGS. 142 and 143, the interlayer insulating film 18 and the TEOS film 14b are removed by isotropic etching with hydrofluoric acid. Consequently, the sidewall portion 17a of the cylindrical storage node having on its sidewall surface the branch conductive portion 17aa extending horizontally is formed, while the lower surface of the bottom conductive portion 17b is exposed.

Figure 144:
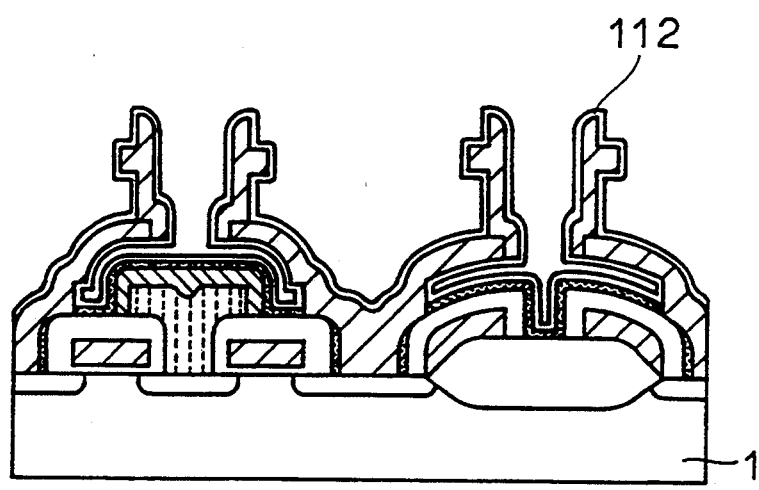

Referring to FIG. 144, the outer surface of the storage node 170 including the lower surface of the bottom conductive portion 17b is covered with the capacitor insulating film 112.

Figure 145:
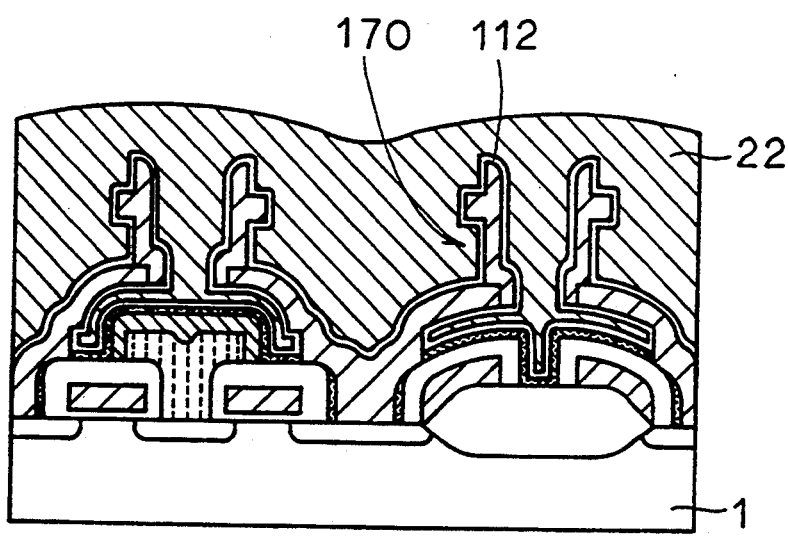

Referring to FIG. 145, the cell plate 22 is formed over the silicon substrate 1 to cover the outer surface of the cylindrical storage node 170, with the capacitor insulating film 112 interposed therebetween.

Figure 146:
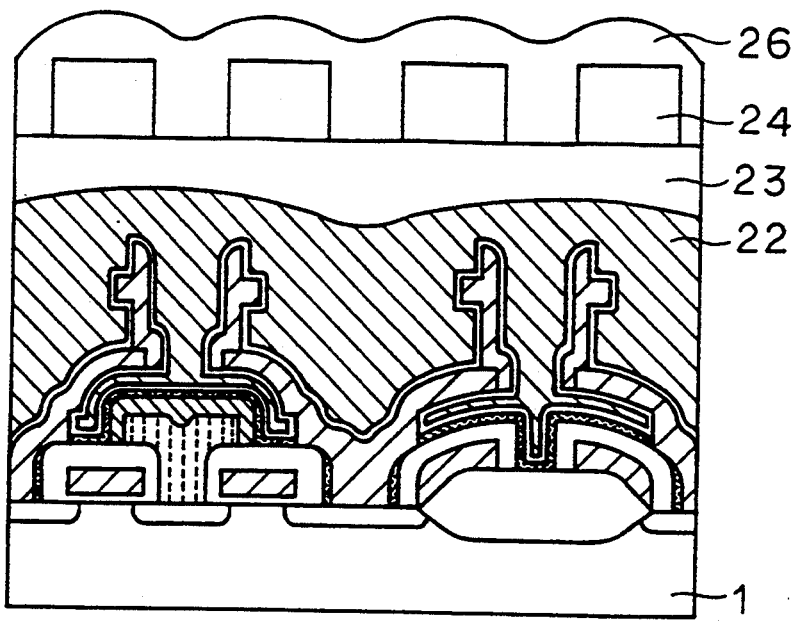

Referring to FIG. 146, the interlayer insulating film 23 is formed on the cell plate 22.

Referring to FIG. 146, the wiring layer 24 is formed thereon. The passivation film 26 is formed over the silicon substrate 1 to cover the wiring layer 24.

As described above, in a method of manufacturing a semiconductor memory device having a cylindrical capacitor in accordance with the first aspect of the present invention, the end of etch back can be detected easily, since a barrier film is formed on an interlayer insulating film for protecting the interlayer insulating film from etchant. Therefore, a semiconductor memory device having a cylindrical capacitor can be implemented easily.

In a method of manufacturing a semiconductor memory device having a cylindrical capacitor in accordance with the second aspect of the present invention, a capacitance of a capacitor can be increased in proportion to an area of the outer surface of a branch conductive portion extending horizontally. Consequently, a semiconductor memory device of high reliability can be obtained.

In a method of manufacturing a semiconductor memory device having a cylindrical capacitor in accordance with the third aspect of the present invention, a capacitance of a capacitor can be increased, since the lower surface of a bottom conductive portion contributes to the capacitance. Consequently, a semiconductor memory device of high reliability can be obtained.

In a method of manufacturing a semiconductor memory device having a cylindrical capacitor in accordance with the fourth aspect of the present invention, a second conductor film is etched back so that the surface of an interlayer insulating film is exposed. This step is essential for forming a sidewall conductive portion of a storage node. The end of the etch back can be detected easily because of a considerable change of the area ratio. Thus, a semiconductor memory device having a cylindrical capacitor can be readily manufactured.

In a method of manufacturing a semiconductor memory device having a cylindrical capacitor in accordance with the fifth aspect of the present invention, a resist is buried in an aperture portion formed in an interlayer insulating film, to serve as an etching stopper in place of a barrier film. Therefore, a semiconductor memory device of high reliability can be obtained.

In a method of manufacturing a semiconductor memory device having a cylindrical capacitor in accordance with the sixth aspect of the present invention, a resist is buried in an aperture portion formed in an interlayer insulating film, to protect a second insulating film on a bit line. Therefore, a semiconductor memory device of high reliability can be obtained.

In a manufacturing method in accordance with the seventh aspect of the present invention, an $SiO_2$ film is formed between a semiconductor substrate and a silicon nitride film, to prevent the semiconductor substrate from being etched when the silicon nitride film is etched for formation of a contact hole. As a result, a semiconductor memory device of high reliability can be obtained.

In a method of manufacturing a semiconductor memory device having a cylindrical capacitor in accordance with the eighth aspect of the present invention, a semiconductor memory device with an increased capacitance of a capacitor in proportion to an area of the outer surface of a branch conductive portion extending horizontally can be obtained.

In a method of manufacturing a semiconductor memory device having a cylindrical capacitor in accordance with the ninth aspect of the present invention, a semiconductor memory device in which the lower surface of a bottom conductive portion contributes to a capacitance of a capacitor can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a cylindrical capacitor, comprising:
   a memory cell array including said cylindrical capacitor;

said cylindrical capacitor having a storage node including a bottom conductive portion and a sidewall conductive portion provided along a periphery of said bottom conductive portion and extending upwardly, a peripheral circuit;

a horizontal member extending horizontally and made of the same material as said bottom conductive portion, provided on a boundary between said memory cell array and said peripheral circuit;

a vertical member extending upwardly and made of the same material as said sidewall conductive portion, provided to be connected to said horizontal member; and an oxide film formed on said horizontal member and being adjacent to said vertical member and having a thickness substantially equal to a height of said vertical member.

* * * * *